United States Patent
Yamamoto et al.

(10) Patent No.: US 8,446,177 B2
(45) Date of Patent: May 21, 2013

(54) INVERTER CIRCUIT AND DISPLAY

(75) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/064,342

(22) Filed: Mar. 21, 2011

(65) Prior Publication Data
US 2011/0241730 A1 Oct. 6, 2011

(30) Foreign Application Priority Data

Mar. 30, 2010 (JP) ............................... P2010-079295
Mar. 30, 2010 (JP) ............................... P2010-079461
Mar. 31, 2010 (JP) ............................... P2010-083268

(51) Int. Cl.
*H03K 19/20* (2006.01)
*H03K 19/094* (2006.01)

(52) U.S. Cl.
USPC ....................................................... 326/112

(58) Field of Classification Search
None
See application file for complete search history.

(56) References Cited

U.S. PATENT DOCUMENTS

| 4,612,462 | A | * | 9/1986 | Asano et al. | .................. 326/107 |
| 5,444,273 | A | * | 8/1995 | Ueno | ............................ 257/138 |
| 6,809,482 | B2 | * | 10/2004 | Koyama | ..................... 315/169.3 |
| 7,411,318 | B2 | * | 8/2008 | Kimura | ......................... 307/113 |

FOREIGN PATENT DOCUMENTS

JP 2008-083272 4/2008

* cited by examiner

*Primary Examiner* — Crystal L Hammond
(74) *Attorney, Agent, or Firm* — Rader, Fishman & Grauer PLLC

(57) ABSTRACT

An inverter circuit includes: first to third transistors; and first and second capacity elements. The first transistor makes/breaks connection between an output terminal and a first voltage line in response to potential difference between an input terminal and the first voltage line or its correspondent. The second transistor makes/breaks connection between a second voltage line and the output terminal in response to potential difference between a gate of the second transistor and the output terminal or its correspondent. The third transistor makes/breaks connection between a gate of the second transistor and a third voltage line in response to potential difference between the input terminal and the third voltage line or its correspondent. The first and second capacity elements are inserted in series between the input terminal and the gate of the second transistor. A junction between the first and second capacity elements is connected to the output terminal.

26 Claims, 45 Drawing Sheets

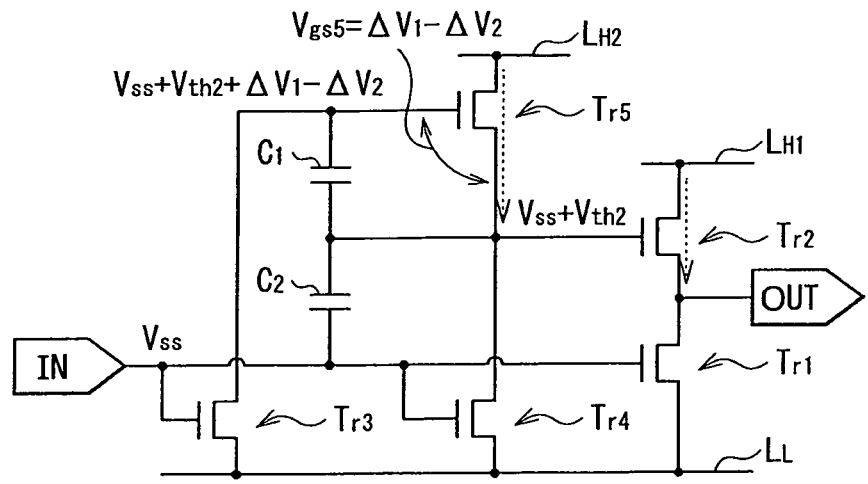
F I G. 24
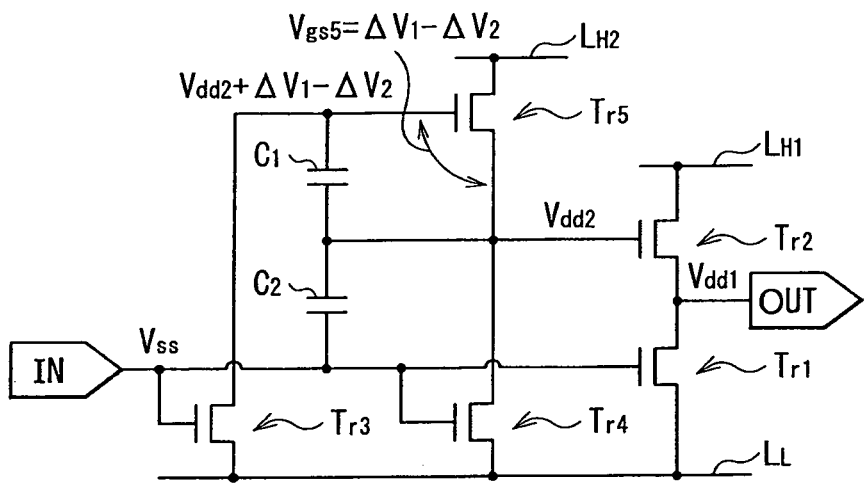
F I G. 25
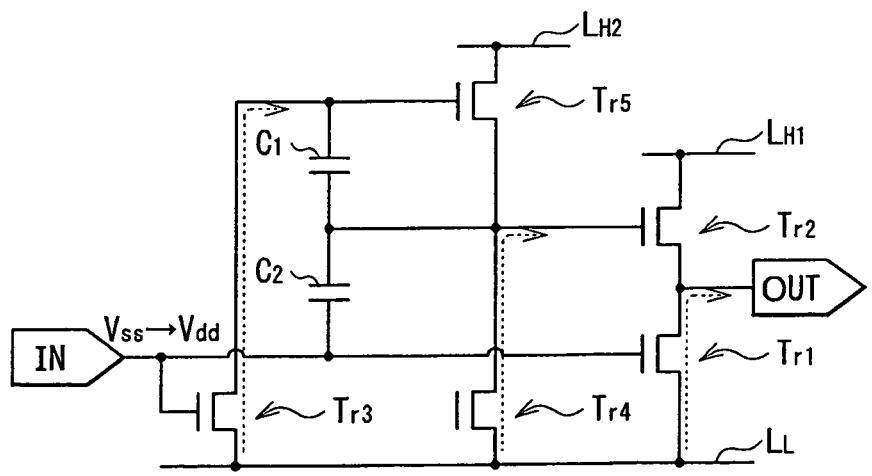
F I G. 26

INVERTER CIRCUIT AND DISPLAY

BACKGROUND

The present disclosure relates to an inverter circuit suitably applicable to, for example, a display using organic EL (Electro Luminescence) elements. Moreover, the disclosure relates to a display including the above-described inverter circuit.

In recent years, in the field of displays displaying an image, displays using, as light-emitting elements of pixels, current drive type optical elements of which light emission luminance changes depending on the value of a current flowing therethrough, for example, organic EL elements have been developed for commercialization. Unlike liquid crystal elements or the like, the organic EL elements are self-luminous elements. Therefore, in displays (organic EL displays) using the organic EL elements, color gradation is obtained by controlling the value of a current flowing through the organic EL elements.

As in the case of liquid crystal displays, the organic EL displays are of a simple (passive) matrix system and an active matrix system as a drive system. In the former system, a configuration thereof is simple; however, there is an issue such as difficulty in achieving a large and high-definition display. Therefore, at present, the active matrix system has been increasingly developed. In this system, a current flowing through a light-emitting element arranged in each pixel is controlled by a driving transistor.

In the above-described driving transistor, in some cases, a threshold voltage $V_{th}$ or mobility $\mu$ temporally changes, or the threshold voltage $V_{th}$ or mobility $\mu$ varies from one pixel to another due to variations in a manufacturing process. In the case where the threshold voltage $V_{th}$ or mobility $\mu$ varies from one pixel to another, the value of a current flowing through the driving transistor varies from one pixel to another, so even if the same voltage is applied to gates of the driving transistors, light emission luminance varies from one organic EL element to another, thereby impairing uniformity of a screen. Therefore, as described in Japanese Unexamined Patent Application Publication No. 2008-083272, a display having a function of correcting a change in the threshold voltage $V_{th}$ or mobility $\mu$ has been developed.

Correction of the threshold voltage $V_{th}$ or mobility $\mu$ is performed by a pixel circuit arranged in each pixel. For example, as illustrated in FIG. 71, the pixel circuit includes a driving transistor $Tr_{100}$ controlling a current flowing through an organic EL element 111, a writing transistor $Tr_{200}$ writing a voltage of a signal line DTL to the driving transistor $Tr_{100}$, and a retention capacitor Cs. In other words, the pixel circuit has a 2Tr1C circuit configuration. The driving transistor $Tr_{100}$ and the writing transistor $Tr_{200}$ each are configured of, for example, an n-channel MOS type thin film transistor (TFT).

FIG. 70 illustrates an example of voltage waveforms applied to the pixel circuit and an example of changes in a gate voltage $V_g$ and a source voltage $V_s$ of the driving transistor $Tr_{100}$. A part (A) in FIG. 70 illustrates a state where a signal voltage $V_{sig}$ and an offset voltage $V_{ofs}$ are applied to the signal line DTL. A part (B) in FIG. 70 illustrates a state where a voltage $V_{dd}$ turning the writing transistor $Tr_{200}$ on and a voltage $V_{ss}$ turning the writing transistor $Tr_{200}$ off are applied to a writing line WSL. A part (C) in FIG. 70 illustrates a state where a high voltage $V_{ccH}$ and a low voltage $V_{ccL}$ are applied to a power supply line PSL. Moreover, parts (D) and (E) in FIG. 70 illustrate states where the gate voltage $V_g$ and the source voltage $V_s$ of the driving transistor $Tr_{100}$ are momentarily changed depending on the application of voltages to the power supply line PSL, the signal line DTL and the writing line WSL.

It is obvious from FIG. 70 that a WS pulse P is applied to the writing line WSL twice in a period of 1 H, and threshold correction is performed by a first WS pulse P and mobility correction and signal writing are performed by a second WS pulse P. In other words, in FIG. 70, WS pulses P are used for not only signal writing but also threshold correction and mobility correction of the driving transistor $Tr_{100}$.

SUMMARY

In an active matrix system display, a horizontal drive circuit (not illustrated) driving a signal line DTL or a writing scanning circuit (not illustrated) sequentially selecting pixels 113 is basically configured by including a shift register (not illustrated), and includes buffer circuits (not illustrated) corresponding to rows or columns of the pixels 113, respectively. For example, the buffer circuits in the writing scanning circuit each are configured by connecting two inverter circuits to each other in series. In this case, for example, as illustrated in FIG. 72, the inverter circuits each have a single-channel type circuit configuration in which two n-channel MOS type transistors $Tr_1$ and $Tr_2$ are connected to each other in series. An inverter circuit 200 illustrated in FIG. 72 is inserted between a high-voltage wiring line $L_H$ to which a high-level voltage is applied and a low-voltage wiring line $L_L$ to which a low-level voltage is applied. A gate of the transistor $Tr_2$ on a side close to the high-voltage wiring line $L_H$ is connected to the high-voltage wiring line $L_H$, and a gate of the transistor $Tr_1$ on a side close to the low-voltage wiring line $L_L$ is connected to an input terminal IN. Moreover, a connection point C between the transistor $Tr_1$ and the transistor $Tr_2$ is connected to an output terminal OUT.

In the inverter circuit 200, for example, as illustrated in FIG. 73, when a voltage (an input voltage $V_{in}$) of the input terminal IN is at a voltage $V_{ss}$, a voltage (an output voltage $V_{out}$) of the output terminal OUT is not at a voltage $V_{dd}$ but at a voltage $V_{dd}-V_{th}$. In other words, the voltage $V_{out}$ of the output terminal OUT includes a threshold voltage $V_{th2}$ of the transistor $Tr_2$; therefore the output voltage $V_{out}$ is greatly affected by variations in the threshold voltage $V_{th2}$ of the transistor $Tr_2$.

Therefore, it is considered that, for example, as illustrated in an inverter circuit 300 in FIG. 74, a gate and a drain of the transistor $Tr_2$ are electrically separated from each other, and a high-voltage wiring line $L_{H2}$ to which a higher voltage $V_{dd2}$ ($\geq V_{dd}+V_{th2}$) than the voltage $V_{dd}$ of the drain is applied is connected to the gate. Moreover, for example, a bootstrap type circuit configuration as illustrated in an inverter circuit 400 in FIG. 75 is considered. More specifically, a circuit configuration in which a transistor $Tr_{10}$ is inserted between the gate of the transistor $Tr_2$ and the high-voltage wiring line $L_H$ so as to connect a gate of a transistor $Tr_{10}$ to the high-voltage wiring line $L_H$ and a capacity element $C_{10}$ is inserted between a connection point D between the gate of the transistor $Tr_2$ and a source of the transistor $Tr_{10}$ and the connection point C is considered.

However, in any of the circuits in FIGS. 72, 74 and 75, even in the case where the input voltage $V_{in}$ is high, that is, even in the case where the output voltage $V_{out}$ is low, a current (a through current) flows from the high-voltage wiring line $L_H$ to the low-voltage wiring line $L_L$ through the transistors $Tr_1$ and $Tr_2$. As a result, power consumption in the inverter circuits is increased. Moreover, in the circuits in FIGS. 72, 74 and 75, for example, as illustrated in a point encircled by a broken line in a part (B) in FIG. 73, when the input voltage $V_{in}$ is at the voltage $V_{dd}$, the output voltage $V_{out}$ is not at the voltage $V_{ss}$, and a peak value of the voltage $V_{out}$ of the output terminal OUT varies. As a result, threshold correction or mobility correction in the driving transistor $Tr_{100}$ varies from one pixel circuit 112 to another, thereby causing variations in luminance.

The above-described issues may occur not only in a scanning circuit of the display but also any other devices.

It is desirable to provide an inverter circuit allowed to prevent variations in an output voltage while reducing power consumption, and a display including the inverter circuit.

According to an embodiment of the disclosure, there is provided a first inverter circuit including: a first transistor, a second transistor and a third transistor each having channels of same conduction type; a first capacity element and a second capacity element; and an input terminal and an output terminal. In this case, the first transistor makes or breaks electrical connection between the output terminal and a first voltage line in response to a potential difference between a voltage (an input voltage) of the input terminal and a voltage of the first voltage line or a potential difference corresponding thereto. The second transistor makes or breaks electrical connection between a second voltage line and the output terminal in response to a potential difference between a gate voltage of the second transistor and a voltage (an output voltage) of the output terminal or a potential difference corresponding thereto. The third transistor makes or breaks electrical connection between a gate of the second transistor and a third voltage line in response to a potential difference between the input voltage and a voltage of the third voltage line or a potential difference corresponding thereto. The first capacity element and the second capacity element are inserted in series between the input terminal and the gate of the second transistor, and an electrical connection point between the first capacity element and the second capacity element is electrically connected to the output terminal.

According to an embodiment of the disclosure, there is provided a first display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the first inverter circuit.

In the first inverter circuit and the first display according to the embodiment of the disclosure, the third transistor performing an on/off operation in response to a potential difference between the input voltage and the voltage of the third voltage line is arranged between the gate of the second transistor and the third voltage line. Moreover, the first transistor performing an on/off operation in response to a potential difference between the input voltage and the voltage of the first voltage line is arranged between the source of the second transistor and the first voltage line. Therefore, for example, when gate voltages of the first transistor and the third transistor are switched from high to low, on-resistances of the first transistor and the third transistor are gradually increased to increase time necessary to charge the gate and the source of the second transistor to the voltages of the first voltage line and the third voltage line. Further, for example, when the gate voltages of the first transistor and the third transistor are switched from low to high, the on-resistances of the first transistor and the third transistor are gradually reduced to reduce time necessary to charge the gate and the source of the second transistor to the voltages of the first voltage line and the third voltage line. Moreover, in the embodiment of the disclosure, the first capacity element and the second capacity element are connected in series to the gate of the second transistor, and the first capacity element and the second capacity element are connected in parallel to the output terminal; therefore, the voltage transient of the output terminal is slower than that of the gate of the second transistor. As a result, for example, when the gate voltages of the first transistor and the third transistor are switched from high to low, a gate-source voltage of the second transistor exceeds a threshold voltage of the second transistor to turn the second transistor on, and immediately after that, the first transistor and the third transistor are turned off. At this time, the output voltage is changed to a voltage of the second voltage line. Moreover, for example, when the gate voltages of the first transistor and the third transistor are switched from low to high, the first transistor and the third transistor are turned on, and immediately after that, the second transistor is turned off. At this time, the output voltage is changed to a voltage of the first voltage line.

According to an embodiment of the disclosure, there is provided a second inverter circuit including: a first transistor, a second transistor and a third transistor each having channels of same conduction type; a first capacity element and a second capacity element; and an input terminal and an output terminal. In this case, a gate of the first transistor is electrically connected to the input terminal, and one terminal of a drain and a source of the first transistor is electrically connected to a first voltage line, and the other terminal of the first transistor is electrically connected to the output terminal. One terminal of a drain and a source of the second transistor is electrically connected to a second voltage line, and the other terminal of the second transistor is electrically connected to the output terminal. A gate of the third transistor is electrically connected to the input terminal, one terminal of a drain and a source of the third transistor is electrically connected to a third voltage line, and the other terminal of the third transistor is electrically connected to a gate of the second transistor. The first capacity element and the second capacity element are inserted in series between the input terminal and the gate of the second transistor, and an electrical connection point between the first capacity element and the second capacity element is electrically connected to the output terminal.

According to an embodiment of the disclosure, there is provided a second display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the second inverter circuit.

In the second inverter circuit and the second display according to the embodiment of the disclosure, the third transistor having a gate connected to the input terminal is arranged between the gate of the second transistor and the third voltage line. Moreover, the first transistor having a gate connected to the input terminal is arranged between the source of the second transistor and the first voltage line. Therefore, for example, when gate voltages of the first transistor and the third transistor are switched from high to low, on-resistances of the first transistor and the third transistor are gradually increased to increase time necessary to charge the gate and the source of the second transistor to the voltages of the first voltage line and the third voltage line. Further, for example, when the gate voltages of the first transistor and the third transistor are switched from low to high, the on-resistances of the first transistor and the third transistor are gradually reduced to reduce time necessary to charge the gate and the source of the second transistor to the voltages of the first voltage line and the third voltage line. Moreover, in the embodiment of the disclosure, the first capacity element and the second capacity element are connected in series to the gate of the second transistor, and the first capacity element and the second capacity element are connected in parallel to the output terminal; therefore, the voltage transient of the output terminal is slower than that of the gate of the second transistor. As a result, for example, when the gate voltages of the first transistor and the third transistor are switched from high to low, a gate-source voltage of the second transistor exceeds a threshold voltage of the second transistor to turn the second transistor on, and immediately after that, the first transistor and the third transistor are turned off. At this time, the output voltage is changed to a voltage of the second voltage line. Moreover, for example, when the gate voltages of the first transistor and the third transistor are switched from low to high, the first transistor and the third transistor are turned on, and immediately after that, the second transistor is turned off. At this time, the output voltage is changed to a voltage of the first voltage line.

According to an embodiment of the disclosure, there is provided a third inverter circuit including: a first transistor, a second transistor and a third transistor each having channels of same conduction type; an, input terminal and an output terminal; and a control element. The control element includes a first terminal electrically connected to the input terminal, a second terminal electrically connected to the output terminal, and a third terminal electrically connected to a gate of the second transistor. The control element allows a voltage transient of the second terminal to be slower than a voltage transient of the third terminal when a falling-edge voltage or a rising-edge voltage is applied to the first terminal. In this case, the first transistor makes or breaks electrical connection between the output terminal and the first voltage line in response to a potential difference between a voltage (an input voltage) of the input terminal and a voltage of the first voltage line or a potential difference corresponding thereto. The second transistor makes or breaks electrical connection between a second voltage line and the output terminal in response to a potential difference between a gate voltage of the second transistor and a voltage (an output voltage) of the output terminal or a potential difference corresponding thereto. The third transistor makes or breaks electrical connection between a gate of the second transistor and a third voltage line in response to a potential difference between the input voltage and a voltage of the third voltage line or a potential difference corresponding thereto.

According to an embodiment of the disclosure, there is provided a third display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the third inverter circuit.

In the third inverter circuit and the third display according to the embodiment of the disclosure, the third transistor performing an on/off operation in response to a potential difference between the input voltage and the voltage of the third voltage line is arranged between the gate of the second transistor and the third voltage line. Moreover, the first transistor performing an on/off operation in response to a potential difference between the input voltage and the voltage of the first voltage line is arranged between the source of the second transistor and the first voltage line.

Therefore, in the case where the first to third transistors are of an n-channel type, when gate voltages of the first transistor and the third transistor are switched from high to low, on-resistances of the first transistor and the third transistor are gradually increased to increase time necessary to charge the gate and the source of the second transistor to the voltages of the first voltage line and the third voltage line. Further, when the gate voltages of the first transistor and the third transistor are switched from low to high, the on-resistances of the first transistor and the third transistor are gradually reduced to reduce time necessary to charge the gate and the source of the second transistor to the voltages of the first voltage line and the third voltage line. On the other hand, in the case where the first to third transistors are of a p-channel type, when the gate voltages of the first transistor and the third transistor are switched from low to high, the on-resistances of the first transistor and the third transistor are gradually increased to increase time necessary to charge the gate and the source of the second transistor to the voltages of the first voltage line and the third voltage line. Further, when the gate voltages of the first transistor and the third transistor are switched from high to low, the on-resistances of the first transistor and the third transistor are gradually reduced to reduce time necessary to charge the gate and the source of the second transistor to the voltages of the first voltage line and the third voltage line.

Moreover, in the third inverter circuit and the third display according to the embodiment of the disclosure, in the control element, the first terminal, the second terminal and the third terminal are electrically connected to the input terminal, the output terminal and the gate of the second transistor, respectively, and when a falling-edge voltage or a rising-edge voltage is applied to the first terminal, the voltage transient of the second terminal is slower than that of the third terminal.

Therefore, in the case where the first to third transistors are of an n-channel type, when gate voltages of the first transistor and the third transistor are switched from high to low, a gate-source voltage of the second transistor exceeds a threshold voltage of the second transistor to turn the second transistor on, and immediately after that, the first transistor and the third transistor are turned off. At this time, the output voltage is changed to a voltage of the second voltage line. Moreover, when the gate voltages of the first transistor and the third transistor are switched from low to high, the first transistor and the third transistor are turned on, and immediately after that, the second transistor is turned off. At this time, the output voltage is changed to a voltage of the first voltage line. On the other hand, in the case where the first to third transistors are of a p-channel type, when the gate voltages of the first transistor and the third transistor are switched from low to high, the gate-source voltage of the second transistor exceeds the threshold voltage of the second transistor to turn the second transistor on, and immediately after that, the first transistor and the third transistor are turned off. At this time, the output voltage is changed to the voltage of the second voltage line. Further, when the gate voltages of the first transistor and the third transistor are switched from high to low, the first transistor and the third transistor are turned on, and immediately after that, the second transistor is turned off. At this time, the output voltage is changed to the voltage of the first voltage line.

According to an embodiment of the disclosure, there is provided a fourth inverter circuit including: a first transistor, a second transistor and a third transistor each having channels of same conduction type; an input terminal and an output terminal; and a control element. The control element includes a first terminal electrically connected to the input terminal, a second terminal electrically connected to the output terminal, and a third terminal electrically connected to a gate of the second transistor. The control element allows a voltage transient of the second terminal to be slower than a voltage transient of the third terminal when a falling-edge voltage or a rising-edge voltage is applied to the first terminal. In this case, a gate of the first transistor is electrically connected to the input terminal, one terminal of a drain and a source of the first transistor is electrically connected to a first voltage line, and the other terminal of the first transistor is electrically connected to the output terminal. One terminal of a drain and a source of the second transistor is electrically connected to a second voltage line, and the other terminal of the second transistor is electrically connected to the output terminal. A gate of the third transistor is electrically connected to the input terminal, one terminal of a drain and a source of the third transistor is electrically connected to a third voltage line, and the other terminal of the third transistor is electrically connected to a gate of the second transistor.

According to an embodiment of the disclosure, there is provided a fourth display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the fourth inverter circuit.

In the fourth inverter circuit and the fourth display according to the embodiment of the disclosure, the third transistor having a gate connected to the input terminal is arranged between the gate of the second transistor and the third voltage line. Moreover, the first transistor having a gate connected to the input terminal is arranged between the source of the second transistor and the first voltage line.

Therefore, in the case where the first to third transistors are of an n-channel type, when gate voltages of the first transistor and the third transistor are switched from high to low, on-resistances of the first transistor and the third transistor are gradually increased to increase time necessary to charge the gate and the source of the second transistor to the voltages of the first voltage line and the third voltage line. Moreover, in the case where the gate voltages of the first transistor and the third transistor are switched from low to high, the on-resistances of the first transistor and the third transistor are gradually reduced to reduce time necessary to charge the gate and the source of the second transistor to the voltages of the first voltage line and the third voltage line. On the other hand, in the case where the first to third transistors are of a p-channel type, when the gate voltages of the first transistor and the third transistor are switched from low to high, the on-resistances of the first transistor and the third transistor are gradually increased to increase time necessary to charge the gate and the source of the second transistor to the voltages of the first voltage line and the third voltage line. Further, when the gate voltages of the first transistor and the third transistor are switched from high to low, the on-resistances of the first transistor and the third transistor are gradually reduced to reduce time necessary to charge the gate and the source of the second transistor to the voltages of the first voltage line and the third voltage line.

Moreover, in the fourth inverter circuit and the fourth display according to the embodiment, in the control element, the first terminal, the second terminal and the third terminal are electrically connected to the input terminal, the output terminal and the gate of the second transistor, respectively, and when a falling-edge voltage is applied to the first terminal, the voltage transient of the second terminal is slower than that of the third terminal.

Therefore, in the case where the first to third transistors are of a n-channel type, when gate voltages of the first transistor and the third transistor are switched from high to low, a gate-source voltage of the second transistor exceeds a threshold voltage of the second transistor to turn the second transistor on, and immediately after that, the first transistor and the third transistor are turned off. At this time, the output voltage is changed to a voltage of the second voltage line. Moreover, when the gate voltages of the first transistor and the third transistor are switched from low to high, the first transistor and the third transistor are turned on, and immediately after that, the second transistor is turned off. At this time, the output voltage is changed to a voltage of the first voltage line. On the other hand, in the case where the first to third transistors are of a p-channel type, when the gate voltages of the first transistor and the third transistor are switched from low to high, the gate-source voltage of the second transistor exceeds the threshold voltage of the second transistor to turn the second transistor on, and immediately after that, the first transistor and the third transistor are turned off. At this time, the output voltage is changed to the voltage of the second voltage line. Further, when the gate voltages of the first transistor and the third transistor are switched from high to low, the first transistor and the third transistor are turned on, and immediately after that, the second transistor is turned off. At this time, the output voltage is changed to the voltage of the first voltage line.

The first to fourth inverter circuits and the first to fourth displays according to the embodiment of the disclosure may further include a delay element inputting, to the gate of the third transistor, a voltage with a waveform obtained by delaying a waveform of a signal voltage applied to the input terminal. In such a case, a slower signal than a signal applied to the gate of the first transistor is applied to the gate of the third transistor; therefore, when the gate voltages of the first transistor and the third transistor are switched from high to low or from low to high, time necessary for the gate-source voltage of the second transistor to exceed the threshold voltage of the second transistor is allowed to be reduced.

According to an embodiment of the disclosure, there is provided a fifth inverter circuit including: a first transistor, a second transistor, a third transistor, a fourth transistor and a fifth transistor each having channels of same conduction type; a first capacity element and a second capacity element; and an input terminal and an output terminal. In this case, the first transistor makes or breaks electrical connection between the output terminal and a first voltage line in response to a potential difference between a voltage (an input voltage) of the input terminal and a voltage of the first voltage line or a potential difference corresponding thereto. The second transistor makes or breaks electrical connection between a second voltage line and the output terminal in response to a potential difference between a voltage of a first terminal which is one terminal of a source and a drain of the fifth transistor and a voltage (an output voltage) of the output terminal or a potential difference corresponding thereto. The third transistor makes or breaks electrical connection between a gate of the fifth transistor and a third voltage line in response to a potential difference between the input voltage and a voltage of the third voltage line or a potential difference corresponding thereto. The fourth transistor makes or breaks electrical connection between the first terminal and a fourth voltage line in response to a potential difference between the input voltage and a voltage of the fourth voltage line or a potential difference corresponding thereto. The first capacity element and the second capacity element are inserted in series between the input terminal and the gate of the fifth transistor, and an electrical connection point between the first capacity element and the second capacity element is electrically connected to the first terminal. The fifth transistor makes or breaks electrical connection between a fifth voltage line and the first terminal in response to a voltage between terminals of the first capacity element or a voltage corresponding thereto.

According to an embodiment of the disclosure, there is provided a fifth display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the fifth inverter circuit.

In the fifth inverter circuit and the fifth display according to the embodiment of the disclosure, the third transistor performing an on/off operation in response to a potential difference between the input voltage and the voltage of the third voltage line is arranged between the gate of the fifth transistor and the third voltage line. Moreover, the fourth transistor performing an on/off operation in response to a potential difference between the input voltage and the voltage of the fourth voltage line is arranged between the gate of the second transistor and the fourth voltage line. Further, the first transistor performing an on/off operation in response to a potential difference between the input voltage and the voltage of the first voltage line is arranged between the source of the second transistor and the first voltage line. Therefore, for example, when gate voltages of the third transistor, the fourth transistor and the first transistor are switched from high to low, on-resistances of the third transistor, the fourth transistor and the first transistor are gradually increased to increase time necessary to charge the gates and the sources of the fifth transistor and the second transistor to the voltages of the third voltage line, the fourth voltage line and the first voltage line. Further, for example, when the gate voltages of the third transistor, the fourth transistor and the first transistor are switched from low to high, the on-resistances of the third transistor, the fourth transistor and the first transistor are gradually reduced to reduce time necessary to charge the gates and the sources of the fifth transistor and the second transistor to the voltages of the third voltage line, the fourth voltage line and the first voltage line. Moreover, in the embodiment of the disclosure, the first capacity element and the second capacity element connected in series to each other are inserted between the input terminal and the gate of the fifth transistor. Further, the source of the fifth transistor is electrically connected between the first capacity element and the second capacity element. Therefore, the first capacity element and the second capacity element are connected in parallel to the source of the fifth transistor, and the first capacity element and the second capacity element are connected in series to the gate of the fifth transistor; therefore, a voltage transient of the source of the fifth transistor is slower than that of the gate of the fifth transistor. As a result, for example, when the gate voltages of the third transistor, the fourth transistor and the first transistor are switched from high to low, a gate-source voltage of the fifth transistor exceeds a threshold voltage of the fifth transistor to turn the fifth transistor on, and immediately after that, the fourth transistor is turned off. At this time, while the second transistor is turned on, the first transistor is turned off; therefore, the output voltage is changed to a voltage of the second voltage line. Moreover, for example, when the gate voltages of the fourth transistor and the first transistor are switched from low to high, the fourth transistor and the first transistor are turned on, and immediately after that, the fifth transistor is turned off. At this time, while the second transistor is turned off, the first transistor is turned on; therefore, the output voltage is changed to a voltage of the first voltage line.

According to an embodiment of the disclosure, there is provided a sixth inverter circuit including: a first transistor, a second transistor, a third transistor, a fourth transistor and a fifth transistor each having channels of same conduction type; a first capacity element and a second capacity element; and an input terminal and an output terminal. In this case, a gate of the first transistor is electrically connected to the input terminal, one terminal of a drain and a source of the first transistor is electrically connected to a first voltage line, and the other terminal of the first transistor is electrically connected to the output terminal. One terminal of a drain and a source of the second transistor is electrically connected to a second voltage line, and the other terminal of the second transistor is electrically connected to the output terminal. A gate of the third transistor is electrically connected to the input terminal, one terminal of a drain and a source of the third transistor is electrically connected to a third voltage line, and the other terminal of the third transistor is electrically connected to a gate of the fifth transistor. A gate of the fourth transistor is electrically connected to the input terminal, one terminal of a drain and a source of the fourth transistor is electrically connected to a fourth voltage line, and the other terminal of the fourth transistor is electrically connected to a gate of the second transistor. One terminal of a drain and a source of the fifth transistor is electrically connected to a fifth voltage line, and the other terminal of the fifth transistor is electrically connected to the gate of the second transistor. The first capacity element and the second capacity element are inserted in series between the input terminal and the gate of the fifth transistor, and an electrical connection point between the first capacity element and the second capacity element is electrically connected to the first terminal.

According to an embodiment of the disclosure, there is provided a sixth display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the sixth inverter circuit.

In the sixth inverter circuit and the sixth display according to the embodiment of the disclosure, the third transistor having a gate connected to the input terminal is arranged between the gate of the fifth transistor and the third voltage line. Moreover, the fourth transistor having a gate connected to the input terminal is arranged between the gate of the second transistor and the fourth voltage line. Further, the first transistor having a gate connected to the input terminal is arranged between the source of the second transistor and the first voltage line. Therefore, for example, when gate voltages of the third transistor, the fourth transistor and the first transistor are switched from high to low, on-resistances of the third transistor, the fourth transistor and the first transistor are gradually increased to increase time necessary to charge the gates and the sources of the fifth transistor and the second transistor to the voltages of the third voltage line, the fourth voltage line and the first voltage line. Moreover, for example, when the gate voltages of the third transistor, the fourth transistor and the first transistor are switched from low to high, the on-resistances of the third transistor, the fourth transistor and the first transistor are gradually reduced to reduce time necessary to charge the gates and the sources of the fifth transistor and the second transistor to the voltages of the third voltage line, the fourth voltage line and the first voltage line. Moreover, the first capacity element and the second capacity element connected in series to each other are inserted between the input terminal and the gate of the fifth transistor. Further, the source of the fifth transistor is electrically connected between the first capacity element and the second capacity element. Therefore, the first capacity element and the second capacity element are connected in parallel to the source of the fifth transistor, and the first capacity element and the second capacity element are connected in series to the gate of the fifth transistor; therefore, a voltage transient of the source of the fifth transistor is slower than that of the gate of the fifth transistor. As a result, for example, when the gate voltages of the third transistor, the fourth transistor and the first transistor are switched from high to low, a gate-source voltage of the fifth transistor exceeds a threshold voltage of the fifth transistor to turn the fifth transistor on, and immediately after that, the fourth transistor is turned off. At this time, while the second transistor is turned on, the first transistor is turned off; therefore, the output voltage is changed to a voltage of the second voltage line. Moreover, for example, when the gate voltages of the fourth transistor and the first transistor are switched from low to high, the fourth transistor and the first transistor are turned on, and immediately after that, the fifth transistor is turned off. At this time, while the second transistor is turned off, the first transistor is turned on; therefore, the output voltage is changed to a voltage of the first voltage line.

According to an embodiment of the disclosure, there is provided a seventh inverter circuit including: a first transistor, a second transistor, a third transistor, a fourth transistor, a fifth transistor, a sixth transistor and a seventh transistor each having channels of same conduction type; a first capacity element and a second capacity element; and an input terminal and an output terminal. In this case, the first transistor makes or breaks electrical connection between the output terminal and a first voltage line in response to a potential difference between a voltage (an input voltage) of the input terminal and a voltage of the first voltage line or a potential difference corresponding thereto. The second transistor makes or breaks electrical connection between a second voltage line and the output terminal in response to a potential difference between a gate voltage of the second transistor and a voltage (an output voltage) of the output terminal or a potential difference corresponding thereto. The third transistor makes or breaks electrical connection between a gate of the fifth transistor and a third voltage line in response to a potential difference between the input voltage and a voltage of the third voltage line or a potential difference corresponding thereto. The fourth transistor makes or breaks electrical connection between a first terminal which is one terminal of a source and a drain of the fifth transistor and a fourth voltage line in response to a potential difference between the input voltage and a voltage of the fourth voltage line or a potential difference corresponding thereto. The first capacity element and the second capacity element are inserted in series between the input terminal and the gate of the fifth transistor, and an electrical connection point between the first capacity element and the second capacity element is electrically connected to the first terminal. The fifth transistor makes or breaks electrical connection between a fifth voltage line and the first terminal in response to a voltage between terminals of the first capacity element or a voltage corresponding thereto. The sixth transistor makes or breaks electrical connection between a gate of the second transistor and a sixth voltage line in response to a potential difference between the input voltage and a voltage of the sixth voltage line or a potential difference corresponding thereto. The seventh transistor makes or breaks electrical connection between the first terminal and the gate of the second transistor in response to a gate voltage of the fifth transistor or a voltage corresponding thereto.

According to an embodiment of the disclosure, there is provided a seventh display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the seventh inverter circuit.

In the seventh inverter circuit and the seventh display according to the embodiment of the disclosure, the third transistor performing an on/off operation in response to a potential difference between the input voltage and the voltage of the third voltage line is arranged between the gate of the fifth transistor and the third voltage line. Moreover, the fourth transistor performing an on/off operation in response to a potential difference between the input voltage and the voltage of the fourth voltage line is arranged between the source of the fifth transistor and the fourth voltage line. Further, the sixth transistor performing an on/off operation in response to a potential difference between the input voltage and the voltage of the sixth voltage line is arranged between the gate of the second transistor and the sixth voltage line. Moreover, the first transistor performing an on/off operation in response to a potential difference between the input voltage and the voltage of the first voltage line is arranged between the source of the second transistor and the first voltage line. Therefore, for example, when gate voltages of the third transistor, the fourth transistor, the sixth transistor and the first transistor are switched from high to low, on-resistances of the third transistor, the fourth transistor, the sixth transistor and the first transistor are gradually increased to increase time necessary to charge the gates and the sources of the fifth transistor and the second transistor to the voltages of the third voltage line, the fourth voltage line, the sixth voltage line and the first voltage line. Moreover, for example, when the gate voltages of the third transistor, the fourth transistor, the sixth transistor and the first transistor are switched from low to high, on-resistances of the third transistor, the fourth transistor, the sixth transistor and the first transistor are gradually reduced to reduce time necessary to charge the gates and the sources of the fifth transistor and the second transistor to the voltages of the third voltage line, the fourth voltage line, the sixth voltage line and the first voltage line. Further, in the embodiment of the disclosure, the first capacity element and the second capacity element connected in series to each other are inserted between the input terminal and the gate of the fifth transistor. Moreover, the first terminal of the fifth transistor is electrically connected between the first capacity element and the second capacity element. Therefore, the first capacity element and the second capacity element are connected in parallel to the source of the fifth transistor, and the first capacity element and the second capacity element are connected in series to the gate of the fifth transistor; therefore, a voltage transient of the source of the fifth transistor is slower than that of the gate of the fifth transistor. As a result, for example, when the gate voltages of the third transistor, the fourth transistor, the sixth transistor and the first transistor are switched from high to low, a gate-source voltage of the fifth transistor exceeds a threshold voltage of the fifth transistor to turn the fifth transistor on, and immediately after that, the fourth transistor and the sixth transistor are turned off. At this time, while the second transistor is turned on, the first transistor is turned off; therefore, the output voltage is changed to a voltage of the second voltage line. Moreover, for example, when the gate voltages of the third transistor, the fourth transistor, the sixth transistor and the first transistor are switched from low to high, the third transistor, the fourth transistor, the sixth transistor and the first transistor are turned on, and the immediately after that, the fifth transistor is turned off. At this time, while the second transistor is turned off, the first transistor is turned on; therefore, the output voltage is changed to a voltage of the first voltage line.

According to an embodiment of the disclosure, there is provided an eighth inverter circuit including: a first transistor, a second transistor, a third transistor, a fourth transistor and a fifth transistor each having channels of same conduction type; an input terminal and an output terminal; and a control element. The control element includes a second terminal electrically connected to the input terminal, a third terminal electrically connected to a first terminal which is one terminal of a source and a drain of the fifth transistor, and a fourth terminal electrically connected to a gate of the fifth transistor. The control element allows a voltage transient of the third terminal to be slower than a voltage transient of the fourth terminal when a falling-edge voltage or a rising-edge voltage is applied to the second terminal. The first transistor makes or breaks electrical connection between the output terminal and a first voltage line in response to a potential difference between a voltage (an input voltage) of the input terminal and a voltage of the first voltage line or a potential difference corresponding thereto. The second transistor makes or breaks electrical connection between a second voltage line and the output terminal in response to a potential difference between a voltage of the first terminal and a voltage (an output voltage) of the output terminal or a potential difference corresponding thereto. The third transistor makes or breaks electrical connection between a gate of the fifth transistor and a third voltage line in response to a potential difference between the input voltage and a voltage of the third voltage line or a potential difference corresponding thereto. The fourth transistor makes or breaks electrical connection between the first terminal and a fourth voltage line in response to a potential difference between the input voltage and a voltage of the fourth voltage line or a potential difference corresponding thereto. The fifth transistor makes or breaks electrical connection between a fifth voltage line and the first terminal in response to a voltage between the fourth terminal and the third terminal or a voltage corresponding thereto.

According to an embodiment of the disclosure, there is provided an eighth display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the eighth inverter circuit.

In the eighth inverter circuit and the eighth display according to the embodiment of the disclosure, the third transistor performing an on/off operation in response to a potential difference between the input voltage and the voltage of the third voltage line is arranged between the gate of the fifth transistor and the third voltage line. Moreover, the fourth transistor performing an on/off operation in response to a potential difference between the input voltage and the voltage of the fourth voltage line is arranged between the gate of the second transistor and the fourth voltage line. Further, the first transistor performing an on/off operation in response to a potential difference between the input voltage and the voltage of the first voltage line is arranged between the source of the second transistor and the first voltage line.

Therefore, for example, in the case where the first to fifth transistors are of an n-channel type, when gate voltages of the third transistor, the fourth transistor and the first transistor are switched from high to low, on-resistances of the third transistor, the fourth transistor and the first transistor are gradually increased to increase time necessary to charge the gates and the sources of the fifth transistor and the second transistor to the voltages of the third voltage line, the fourth voltage line and the first voltage line. Moreover, when the gate voltages of the third transistor, the fourth transistor and the first transistor are switched from low to high, the on-resistances of the third transistor, the fourth transistor and the first transistor are gradually reduced to reduce time necessary to charge the gates and the sources of the fifth transistor and the second transistor to the voltages of the third voltage line, the fourth voltage line and the first voltage line. On the other hand, in the case where the first to fifth transistors are of a p-channel type, when the gate voltages of the third transistor, the fourth transistor and the first transistor are switched from low to high, on-resistances of the third transistor, the fourth transistor and the first transistor are gradually increased to increase time necessary to charge the gates and the sources of the fifth transistor and the second transistor to the voltages of the third voltage line, the fourth voltage line and the first voltage line. Moreover, when the gate voltages of the third transistor, the fourth transistor and the first transistor are switched from high to low, the on-resistances of the third transistor, the fourth transistor and the first transistor are gradually reduced to reduce time necessary to charge the gates and the sources of the fifth transistor and the second transistor to the voltages of the third voltage line, the fourth voltage line and the first voltage line.

Moreover, in the eighth inverter circuit and the eighth display according to the embodiment of the disclosure, when a falling-edge voltage or a rising-edge voltage is applied to the second terminal electrically connected to the input terminal, a voltage transient of the third terminal electrically connected to the source of the fifth transistor is slower than that of the fourth terminal electrically connected to the gate of the fifth transistor.

As a result, in the case where the first to fifth transistors are of an n-channel type, when the gate voltages of the third transistor, the fourth transistor and the first transistor are switched from high to low, a gate-source voltage of the fifth transistor exceeds a threshold voltage of the fifth transistor to turn the fifth transistor on, and immediately after that, the fourth transistor is turned off. At this time, while the second transistor is turned on, the first transistor is turned off; therefore, the output voltage is changed to a voltage of the second voltage line. Moreover, when the gate voltages of the fourth transistor and the first transistor are switched from low to high, the fourth transistor and the first transistor are turned on, and immediately after that, the fifth transistor is turned off. At this time, while the second transistor is turned off, the first transistor is turned on; therefore, the output voltage is changed to a voltage of the first voltage line. On the other hand, in the case where the first to fifth transistors are of a p-channel type, when the gate voltages of the third transistor, the fourth transistor and the first transistor are switched from low to high, the gate-source voltage of the fifth transistor exceeds the threshold voltage of the fifth transistor to turn the fifth transistor on, and immediately after that, the fourth transistor is turned off. At this time, while the second transistor is turned on, the first transistor is turned off; therefore, the output voltage is changed to the voltage of the second voltage line. Moreover, when the gate voltages of the fourth transistor and the first transistor are switched from high to low, the fourth transistor and the first transistor are turned on, and immediately after that, the fifth transistor is turned off. At this time, while the second transistor is turned off, the first transistor is turned on; therefore, the output voltage is changed to the voltage of the first voltage line.

According to an embodiment of the disclosure, there is provided a ninth inverter circuit including: a first transistor, a second transistor, a third transistor, a fourth transistor, a fifth transistor, a sixth transistor and a seventh transistor each having channels of same conduction type; an input terminal and an output terminal; and a control element. The control element includes a second terminal electrically connected to the input terminal, a third terminal electrically connected to a first terminal which is one terminal of a source and a drain of the fifth transistor, and a fourth terminal electrically connected to a gate of the fifth transistor. The control element allows a voltage transient of the third terminal to be slower than a voltage transient of the fourth terminal when a falling-edge voltage or a rising-edge voltage is applied to the second terminal. The first transistor makes or breaks electrical connection between the output terminal and a first voltage line in response to a potential difference between a voltage (an input voltage) of the input terminal and a voltage of the first voltage line or a potential difference corresponding thereto. The second transistor makes or breaks electrical connection between a second voltage line and the output terminal in response to a potential difference between a gate voltage of the second transistor and a voltage (an output voltage) of the output terminal or a potential difference corresponding thereto. The third transistor makes or breaks electrical connection between a gate of the fifth transistor and a third voltage line in response to a potential difference between the input voltage and a voltage of the third voltage line or a potential difference corresponding thereto. The fourth transistor makes or breaks electrical connection between the first terminal and a fourth voltage line in response to a potential difference between the input voltage and a voltage of the fourth voltage line or a potential difference corresponding thereto. The fifth transistor makes or breaks electrical connection between a fifth voltage line and the first terminal in response to a voltage between the fourth terminal and the third terminal or a voltage corresponding thereto. The sixth transistor makes or breaks electrical connection between a gate of the second transistor and a sixth voltage line in response to a potential difference between the input voltage and a voltage of the sixth voltage line or a potential difference corresponding thereto. The seventh transistor makes or breaks electrical connection between the first terminal and the gate of the second transistor in response to a gate voltage of the fifth transistor or a voltage corresponding thereto.

According to an embodiment of the disclosure, there is provided a ninth display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the ninth inverter circuit.

In the ninth inverter circuit and the ninth display according to the embodiment of the disclosure, the third transistor performing an on/off operation in response to a potential difference between the input voltage and the voltage of the third voltage line is arranged between the gate of the fifth transistor and the third voltage line. Moreover, the fourth transistor performing an on/off operation in response to a potential difference between the input voltage and the voltage of the fourth voltage line is arranged between the source of the fifth transistor and the fourth voltage line. Further, the sixth transistor performing an on/off operation in response to a potential difference between the input voltage and the voltage of the sixth voltage line is arranged between the gate of the second transistor and the sixth voltage line. Moreover, the first transistor performing an on/off operation in response to a potential difference between the input voltage and the voltage of the first voltage line is arranged between the source of the second transistor and the first voltage line.

Therefore, in the case where the first to seventh transistors are of an n-channel type, when gate voltages of the third transistor, the fourth transistor, the sixth transistor and the first transistor are switched from high to low, on-resistances of the third transistor, the fourth transistor, the sixth transistor and the first transistor are gradually increased to increase time necessary to charge the gates and the sources of the fifth transistor and the second transistor to the voltages of the third voltage line, the fourth voltage line, the sixth voltage line and the first voltage line. Moreover, when the gate voltages of the third transistor, the fourth transistor, the sixth transistor and the first transistor are switched from low to high, the on-resistances of the third transistor, the fourth transistor, the sixth transistor and the first transistor are gradually reduced to reduce time necessary to charge the gates and the sources of the fifth transistor and the second transistor to the voltages of the third voltage line, the fourth voltage line, the sixth voltage line and the first voltage line. On the other hand, in the case where the first to seventh transistors are of a p-channel type, when the gate voltages of the third transistor, the fourth transistor, the sixth transistor and the first transistor are switched from low to high, the on-resistances of the third transistor, the fourth transistor, the sixth transistor and the first transistor are gradually increased to increase time necessary to charge the gates and the sources of the fifth transistor and the second transistor to the voltages of the third voltage line, the fourth voltage line, the sixth voltage line and the first voltage line. Moreover, when the gate voltages of the third transistor, the fourth transistor, the sixth transistor and the first transistor are switched from high to low, the on-resistances of the third transistor, the fourth transistor, the sixth transistor and the first transistor are gradually reduced to reduce time necessary to charge the gates and the sources of the fifth transistor and the second transistor to the voltages of the third voltage line, the fourth voltage line, the sixth voltage line and the first voltage line.

Moreover, in the ninth inverter circuit and the ninth display according to the embodiment of the disclosure, when a falling-edge voltage or a rising-edge voltage is applied to the second terminal electrically connected to the input terminal, a voltage transient of the third terminal electrically connected to the source of the fifth transistor is slower than that of the fourth terminal electrically connected to the gate of the fifth transistor.

As a result, in the case where the first to seventh transistors are of an n-channel type, when the gate voltages of the third transistor, the fourth transistor, the sixth transistor and the first transistor are switched from high to low, a gate-source voltage of the fifth transistor exceeds a threshold voltage of the fifth transistor to turn the fifth transistor on, and immediately after that, the fourth transistor and the sixth transistor are turned off. At this time, while the second transistor is turned on, the first transistor is turned off; therefore, the output voltage is changed to a voltage of the second voltage line. Moreover, when the gate voltages of the third transistor, the fourth transistor, the sixth transistor and the first transistor are switched from low to high, the third transistor, the fourth transistor, the sixth transistor and the first transistor are turned on, and immediately after that, the fifth transistor is turned off. At this time, while the second transistor is turned off, the first transistor is turned on; therefore, the output voltage is changed to a voltage of the first voltage line. On the other hand, in the case where the first to seventh transistors are of a p-channel type, when the gate voltages of the third transistor, the fourth transistor, the sixth transistor and the first transistor are switched from low to high, the gate-source voltage of the fifth transistor exceeds the threshold voltage of the fifth transistor to turn the fifth transistor on, and immediately after that, the fourth transistor and the sixth transistor are turned off. At this time, while the second transistor is turned on, the first transistor is turned off; therefore, the output voltage is changed to the voltage of the second voltage line. Moreover, when the gate voltages of the third transistor, the fourth transistor, the sixth transistor and the first transistor are switched from high to low, the third transistor, the fourth transistor, the sixth transistor and the first transistor are turned on, and immediately after that, the fifth transistor is turned off. At this time, while the second transistor is turned off, the first transistor is turned on; therefore, the output voltage is changed to the voltage of the first voltage line.

The fifth to ninth inverter circuits and the fifth to ninth displays according to the embodiment of the disclosure may further include a delay element inputting, to the gate of the third transistor, a voltage with a waveform obtained by delaying a waveform of a signal voltage applied to the input terminal. In such a case, a slower signal than a signal applied to the gates of the first transistor and the fourth transistor is applied to the gate of the third transistor. As a result, when the gate voltages of the first transistor, the third transistor and the fourth transistor are switched from high to low or from low to high, time necessary for the gate-source voltage of the fifth transistor to exceed the threshold voltage of the fifth transistor is allowed to be reduced.

According to an embodiment of the disclosure, there is provided a tenth inverter circuit including: a first transistor, a second transistor, a third transistor, a fourth transistor, a fifth transistor, a sixth transistor and a seventh transistor each having channels of same conduction type. The tenth inverter circuit further includes a first capacity element, a second capacity element and a third capacity element; and an input terminal and an output terminal. In this case, the first transistor makes or breaks electrical connection between the output terminal and a first voltage line in response to a potential difference between a voltage (an input voltage) of the input terminal and a voltage of the first voltage line or a potential difference corresponding thereto. The second transistor makes or breaks electrical connection between a second voltage line and the output terminal in response to a potential difference between a gate voltage of the second transistor and a voltage of the output terminal or a potential difference corresponding thereto. The third transistor makes or breaks electrical connection between a gate of the fifth transistor and a third voltage line in response to a potential difference between the voltage of the input terminal and a voltage of the third voltage line or a potential difference corresponding thereto. The fourth transistor makes or breaks electrical connection between a first terminal which is one terminal of a source and a drain of the fifth transistor and a fourth voltage line in response to a potential difference between the voltage of the input terminal and a voltage of the fourth voltage line or a potential difference corresponding thereto. The first capacity element and the second capacity element are inserted in series between the input terminal and a gate of the fifth transistor, and an electrical connection point between the first capacity element and the second capacity element is electrically connected to the first terminal. The third capacity element is inserted between a gate of the second transistor and the output terminal. The fifth transistor makes or breaks electrical connection between a fifth voltage line and the first terminal in response to a voltage between terminals of the first capacity element or a voltage corresponding thereto. The sixth transistor makes or breaks electrical connection between the gate of the second transistor and a sixth voltage line in response to a potential difference between the voltage of the input terminal and a voltage of the sixth voltage line or a potential difference corresponding thereto. The seventh transistor makes or breaks electrical connection between a seventh voltage line and the gate of the second transistor in response to a potential difference between the voltage of the first terminal and the gate voltage of the second transistor or a potential difference corresponding thereto.

According to an embodiment of the disclosure, there is provided a tenth display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the tenth inverter circuit.

In the tenth inverter circuit and the tenth display according to the embodiment of the disclosure, the third transistor performing an on/off operation in response to a potential difference between the input voltage and the voltage of the third voltage line is arranged between the gate of the fifth transistor and the third voltage line. Moreover, the fourth transistor performing an on/off operation in response to a potential difference between the input voltage and the voltage of the fourth voltage line is arranged between the gate of the seventh transistor and the fourth voltage line. Further, the sixth transistor performing an on/off operation in response to a potential difference between the input voltage and the voltage of the sixth voltage line is arranged between the gate of the second transistor and the sixth voltage line. Moreover, the first transistor performing an on/off operation in response to a potential difference between the input voltage and the voltage of the first voltage line is arranged between the source of the second transistor and the first voltage line. Therefore, for example, when gate voltages of the third transistor, the fourth transistor, the sixth transistor and the first transistor are switched from high to low, on-resistances of the third transistor, the fourth transistor, the sixth transistor and the first transistor are gradually increased to increase time necessary to charge the gates and the sources of the fifth transistor, the seventh transistor and the second transistor to the voltages of the voltage lines corresponding to the third transistor, the fourth transistor, the sixth transistor and the first transistor. Moreover, for example, when the gate voltages of the third transistor, the fourth transistor, the sixth transistor and the first transistor are switched from low to high, the on-resistances of the third transistor, the fourth transistor, the sixth transistor and the first transistor are gradually reduced to reduce time necessary to charge the gates and the sources of the fifth transistor, the seventh transistor and the second transistor to the voltages of the voltage lines corresponding to the third transistor, the fourth transistor, the sixth transistor and the first transistor. Moreover, in the embodiment of the disclosure, the first capacity element and the second capacity element connected in series to each other are inserted between the input terminal and the gate of the fifth transistor. Further, the source of the fifth transistor is electrically connected between the first capacity element and the second capacity element. Therefore, the first capacity element and the second capacity element are connected in parallel to the source of the fifth transistor, and the first capacity element and the second capacity element are connected in series to the gate of the fifth transistor; therefore, a voltage transient of the source of the fifth transistor is slower than that of the gate of the fifth transistor. Therefore, for example, when the gate voltages of the third transistor, the fourth transistor, the sixth transistor and the first transistor are switched from high to low, a gate-source voltage of the fifth transistor exceeds a threshold voltage of the fifth transistor to turn the fifth transistor on, and immediately after that, the third transistor is turned off. At this time, while the seventh transistor is turned on, the fourth transistor is turned off, and while the second transistor is turned on, the sixth transistor is turned off, and after that, the seventh transistor is turned off. As a result, the output voltage is changed to a voltage of the second voltage line. Moreover, for example, when the gate voltages of the third transistor, the fourth transistor, the sixth transistor and the first transistor are switched from low to high, the third transistor, the fourth transistor and the sixth transistor are turned on, and immediately after that, the fifth transistor is turned off. At this time, while the second transistor is turned off, the first transistor is turned on; therefore, the output voltage is changed to a voltage of the first voltage line.

According to an embodiment of the disclosure, there is provided an eleventh inverter circuit including: a first transistor, a second transistor, a third transistor, a fourth transistor, a fifth transistor, a sixth transistor and a seventh transistor each having channels of same conduction type. The eleventh inverter circuit further includes: a first capacity element, a second capacity element and a third capacity element; and an input terminal and an output terminal. In this case, a gate of the first transistor is electrically connected to the input terminal, one terminal of a drain and a source of the first transistor is electrically connected to a first voltage line, and the other terminal of the first transistor is electrically connected to the output terminal. One terminal of a drain and a source of the second transistor is electrically connected to a second voltage line, and the other terminal of the second transistor is electrically connected to the output terminal. A gate of the third transistor is electrically connected to the input terminal, one terminal of a drain and a source of the third transistor is electrically connected to a third voltage line, and the other terminal of the third transistor is electrically connected to a gate of the fifth transistor. A gate of the fourth transistor is electrically connected to the input terminal, one terminal of a drain and a source of the fourth transistor is electrically connected to a fourth voltage line, and the other terminal of the fourth transistor is electrically connected to a gate of the seventh transistor. One terminal of a drain and a source of the fifth transistor is electrically connected to a fifth voltage line, and the other terminal of the fifth transistor is electrically connected to the gate of the seventh transistor. A gate of the sixth transistor is electrically connected to the input terminal, one terminal of a drain and a source of the sixth transistor is electrically connected to a sixth voltage line, and the other terminal of the sixth transistor is connected to a gate of the second transistor. One terminal of a drain and a source of the seventh transistor is electrically connected to a seventh voltage line, and the other terminal of the seventh transistor is electrically connected to the gate of the second transistor. The first capacity element and the second capacity element are inserted in series between the input terminal and a gate of the fifth transistor. An electrical connection point between the first capacity element and the second capacity element is electrically connected to the gate of the seventh transistor. The third capacity element is inserted between the gate of the second transistor and the output terminal.

According to an embodiment of the disclosure, there is provided an eleventh display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the eleventh inverter circuit.

In the eleventh inverter circuit and the eleventh display according to the embodiment of the disclosure, the third transistor having a gate connected to the input terminal is arranged between the gate of the fifth transistor and the third voltage line. The fourth transistor having a gate connected to the input terminal is arranged between the gate of the seventh transistor and the fourth voltage line. The sixth transistor having a gate connected to the input terminal is arranged between the gate of the second transistor and the sixth voltage line. The first transistor having a gate connected to the input terminal is arranged between the source of the second transistor and the first voltage line. Therefore, for example, when gate voltages of the third transistor, the fourth transistor, the sixth transistor and the first transistor are switched from high to low, on-resistances of the third transistor, the fourth transistor, the sixth transistor and the first transistor are gradually increased to increase time necessary to charge the gates and the sources of the fifth transistor, the seventh transistor and the second transistor to the voltages of the voltage lines corresponding to the third transistor, the fourth transistor, the sixth transistor and the first transistor. Moreover, for example, when the gate voltages of the third transistor, the fourth transistor, the sixth transistor and the first transistor are switched from low to high, the on-resistances of the third transistor, the fourth transistor, the sixth transistor and the first transistor are gradually reduced to reduce time necessary to charge the gates and the sources of the fifth transistor, the seventh transistor and the second transistor to the voltages of the voltage lines corresponding to the third transistor, the fourth transistor, the sixth transistor and the first transistor. Moreover, in the embodiment of the disclosure, the first capacity element and the second capacity element connected in series to each other are inserted between the input terminal and the gate of the fifth transistor. Further, the source of the fifth transistor is electrically connected between the first capacity element and the second capacity element. Therefore, the first capacity element and the second capacity element are connected in parallel to the source of the fifth transistor, and the first capacity element and the second capacity element are connected in series to the gate of the fifth transistor; therefore, a voltage transient of the source of the fifth transistor is slower than that of the gate of the fifth transistor. Therefore, for example, when the gate voltages of the third transistor, the fourth transistor, the sixth transistor and the first transistor are switched from high to low, a gate-source voltage of the fifth transistor exceeds a threshold voltage of the fifth transistor to turn the fifth transistor on, and immediately after that, the third transistor is turned off. At this time, while the seventh transistor is turned on, the fourth transistor is turned off, and while the second transistor is turned on, the sixth transistor is turned off, and after that, the seventh transistor is turned off. As a result, the output voltage is changed to a voltage of the second voltage line. Moreover, for example, when the gate voltages of the third transistor, the fourth transistor, the sixth transistor and the first transistor are switched from low to high, the third transistor, the fourth transistor and the sixth transistor are turned on, and immediately after that, the fifth transistor is turned off. At this time, while the second transistor is turned off, the first transistor is turned on; therefore, the output voltage is changed to a voltage of the first voltage line.

According to an embodiment of the disclosure, there is provided a twelfth inverter circuit including: a first transistor, a second transistor, a third transistor, a fourth transistor, a fifth transistor, a sixth transistor and a seventh transistor each having channels of same conduction type. The twelfth inverter circuit further includes an input terminal and an output terminal; and a control element. The control element includes a second terminal electrically connected to the input terminal, a third terminal electrically connected to a gate of the seventh transistor, and a fourth terminal electrically connected to a gate of the fifth transistor. The control element allows a voltage transient of the third terminal to be slower than a voltage transient of the fourth terminal when a falling-edge voltage or a rising-edge voltage is applied to the second terminal. The first transistor makes or breaks electrical connection between the output terminal and a first voltage line in response to a potential difference between a voltage of the input terminal and a voltage of the first voltage line or a potential difference corresponding thereto. The second transistor makes or breaks electrical connection between a second voltage line and the output terminal in response to a potential difference between a gate voltage of the second transistor and a voltage of the output terminal or a potential difference corresponding thereto. The third transistor makes or breaks electrical connection between a gate of the fifth transistor and a third voltage line in response to a potential difference between the voltage of the input terminal and a voltage of the third voltage line or a potential difference corresponding thereto. The fourth transistor makes or breaks electrical connection between a first terminal which is one terminal of a source and a drain of the fifth transistor and a fourth voltage line in response to a potential difference between the voltage of the input terminal and a voltage of the fourth voltage line or a potential difference corresponding thereto. The fifth transistor makes or breaks electrical connection between a fifth voltage line and the first terminal in response to a voltage between the fourth terminal and the third terminal or a voltage corresponding thereto. The sixth transistor makes or breaks electrical connection between a gate of the second transistor and a sixth voltage line in response to a potential difference between the voltage of the input terminal and a voltage of the sixth voltage line or a potential difference corresponding thereto. The seventh transistor makes or breaks electrical connection between a seventh voltage line and the gate of the second transistor in response to a potential difference between the voltage of the first terminal and the gate voltage of the second transistor or a potential difference corresponding thereto.

According to an embodiment of the disclosure, there is provided a twelfth display with a display section and a drive section, the display section including a plurality of scanning lines arranged in rows, a plurality of signal lines arranged in columns, and a plurality of pixels arranged in a matrix form. The drive section includes a plurality of inverter circuits each arranged corresponding to the scanning lines to drive each of the pixels, and each of the inverter circuits includes the same constituent elements as those in the twelfth inverter circuit.

In the twelfth inverter circuit and the twelfth display according to the embodiment of the disclosure, the third transistor performing an on/off operation in response to a potential difference between an input voltage and the voltage of the third voltage line is arranged between the gate of the fifth transistor and the third voltage line. Moreover, the fourth transistor performing an on/off operation in response to a potential difference between the input voltage and the voltage of the fourth voltage line is arranged between the gate of the seventh transistor and the fourth voltage line. Further, the sixth transistor performing an on/off operation in response to a potential difference between the input voltage and the voltage of the sixth voltage line is arranged between the gate of the second transistor and the sixth voltage line. Moreover, the first transistor performing an on/off operation in response to a potential difference between the input voltage and the voltage of the first voltage line is arranged between the source of the second transistor and the first voltage line.

Therefore, in the case where the first to seventh transistors are of an n-channel type, when the gate voltages of the third transistor, the fourth transistor, the sixth transistor and the first transistor are switched from high to low, on-resistances of the third transistor, the fourth transistor, the sixth transistor and the first transistor are gradually increased to increase time necessary to charge the gates and the sources of the fifth transistor, the seventh transistor and the second transistor to the voltages of the voltage lines corresponding to the third transistor, the fourth transistor, the sixth transistor and the first transistor. Moreover, when the gate voltages of the third transistor, the fourth transistor, the sixth transistor and the first transistor are switched from low to high, on-resistances of the third transistor, the fourth transistor, the sixth transistor and the first transistor are gradually reduced to reduce time necessary to charge the gates and the sources of the fifth transistor, the seventh transistor and the second transistor to the voltages of the voltage lines corresponding to the third transistor, the fourth transistor, the sixth transistor and the first transistor. On the other hand, in the case where the first to seventh transistors are of a p-channel type, when the gate voltages of the third transistor, the fourth transistor, the sixth transistor and the first transistor are switched from low to high, the on-resistances of the third transistor, the fourth transistor, the sixth transistor and the first transistor are gradually increased to increase time necessary to charge the gates and the sources of the fifth transistor, the seventh transistor and the second transistor to the voltages of the voltage lines corresponding to the third transistor, the fourth transistor, the sixth transistor and the first transistor. Moreover, when the gate voltages of the third transistor, the fourth transistor, the sixth transistor and the first transistor are switched from high to low, the on-resistances of the third transistor, the fourth transistor, the sixth transistor and the first transistor are gradually reduced to reduce time necessary to charge the gates and the sources of the fifth transistor, the seventh transistor and the second transistor to the voltages of the voltage lines corresponding to the third transistor, the fourth transistor, the sixth transistor and the first transistor.

Moreover, in the twelfth inverter circuit and the twelfth display according to the embodiment of the disclosure, when a falling-edge voltage is applied to the second terminal electrically connected to the input terminal, a voltage transient of the third terminal electrically connected to the source of the fifth transistor is slower than that of the fourth terminal electrically connected to the gate of the fifth transistor.

Therefore, in the case where the first to seventh transistors are of an n-channel type, when the gate voltages of the third transistor, the fourth transistor, the sixth transistor and the first transistor are switched from high to low, a gate-source voltage of the fifth transistor exceeds a threshold voltage of the fifth transistor to turn the fifth transistor on, and immediately after that, the third transistor is turned off. At this time, while the seventh transistor is turned on, the fourth transistor is turned off, and while the second transistor is turned on, the sixth transistor is turned off, and after that, the seventh transistor is turned off. As a result, the output voltage is changed to a voltage of the second voltage line. Moreover, when the gate voltages of the third transistor, the fourth transistor, the sixth transistor and the first transistor are switched from low to high, the third transistor, the fourth transistor and the sixth transistor are turned on, and immediately after that, the fifth transistor is turned off. At this time, while the second transistor is turned off, the first transistor is turned on; therefore, the output voltage is changed to a voltage of the first voltage line. On the other hand, in the case where the first to seventh transistors are of a p-channel type; when the gate voltages of the third transistor, the fourth transistor, the sixth transistor and the first transistor are switched from low to high, the gate-source voltage of the fifth transistor exceeds the threshold voltage of the fifth transistor to turn the fifth transistor on, and immediately after that, the third transistor is turned off. At this time, while the seventh transistor is turned on, the fourth transistor is turned off, and while the second transistor is turned on, the sixth transistor is turned off, and after that, the seventh transistor is turned off. As a result, the output voltage is changed to the voltage of the second voltage line. Moreover, when the gate voltages of the third transistor, the fourth transistor, the sixth transistor and the first transistor are switched from high to low, the third transistor, the fourth transistor and the sixth transistor are turned on, and immediately after that, the fifth transistor is turned off. At this time, while the second transistor is turned off, the first transistor is turned on; therefore, the output voltage is changed to the voltage of the first voltage line.

The tenth to twelfth inverter circuits and the tenth to twelfth displays according to the embodiment of the disclosure may further include a delay element inputting, to the gate of the third transistor, a voltage with a waveform obtained by delaying a waveform of a signal voltage applied to the input terminal. In such a case, a slower signal than a signal applied to the gate of the first transistor is applied to the gate of the third transistor; therefore, when the gate voltages of the first transistor and the third transistor are switched from high to low or from low to high, time necessary for the voltage between the gate of the fifth transistor and the first terminal to exceed the threshold voltage of the fifth transistor is allowed to be reduced.

In the first to fourth inverter circuits and the first to fourth displays according to the embodiment of the disclosure, a period where the first transistor and the second transistor are simultaneously turned on is almost eliminated; therefore, a current (a through current) hardly flows between the voltage lines through the first transistor and the second transistor. Accordingly, power consumption is allowed to be reduced. Moreover, when the gate voltages of the first transistor and the third transistor are switched from high to low, the output voltage is changed to the voltage of the second voltage line or the voltage of the first voltage line, and when the gate voltages of the first transistor and the third transistor are switched from low to high, the output voltage is changed to a voltage opposite to the above-described voltage; therefore, variations in the output voltage is allowed to be eliminated. As a result, for example, variations in threshold correction or mobility correction in a driving transistor from one pixel circuit to another are allowed to be reduced, and variations in luminance from one pixel to another are allowed to be reduced.

Moreover, in the first to fourth inverter circuits and the first to fourth displays according to the embodiment of the disclosure, in the case where a voltage with a voltage waveform obtained by delaying a waveform of a signal voltage applied to the input terminal is applied to the gate of the third transistor, when the gate voltages of the first transistor and the third transistor are switched from high to low or from low to high, time necessary for the gate-source voltage of the second transistor to exceed the threshold voltage of the second transistor is allowed to be reduced. Therefore, the speed of circuit operation is allowed to be increased.

In the fifth to ninth inverter circuits and the fifth to ninth displays according to the embodiment of the disclosure, a period where the first transistor and the second transistor are simultaneously turned on or a period where the fourth transistor and the fifth transistor are simultaneously turned on is almost eliminated; therefore, a current (a through current) hardly flows between the voltage lines through these transistors; therefore, power consumption is allowed to be reduced. Moreover, when the gate voltage of the first transistor is switched from high to low, the output voltage is changed to the voltage of the second voltage line or the voltage of the first voltage line, and when the gate voltage of the first transistor is switched from low to high, the output voltage is changed to a voltage opposite to the above-described voltage. Therefore, a shift of a peak value of the output voltage from a desired value is allowed to be reduced. As a result, for example, variations in threshold correction or mobility correction in a driving transistor from one pixel circuit to another are allowed to be reduced, and variations in luminance from one pixel to another are allowed to be reduced.

Moreover, in the fifth to ninth inverter circuits and the fifth to ninth displays according to the embodiment of the disclosure, in the case where a voltage with a voltage waveform obtained by delaying a waveform of a signal voltage applied to the input terminal is applied to the gate of the third transistor, when the gate voltage of the first transistor is switched from high to low or from low to high, time necessary for the gate-source voltage of the fifth transistor to exceed the threshold voltage of the fifth transistor is allowed to be reduced. Therefore, the speed of circuit operation is allowed to be increased.

In the tenth to twelfth inverter circuits and the tenth to twelfth displays according to the embodiment of the disclosure, a period where the first transistor and the second transistor are simultaneously turned on is almost eliminated; therefore, a current (a through current) hardly flows between the voltage lines through the first transistor and the second transistor. Accordingly, power consumption is allowed to be reduced. Moreover, when the gate voltage of the first transistor is switched from high to low, the output voltage is changed to the voltage of the second voltage line or the voltage of the first voltage line, and when the gate voltage of the first transistor is switched from low to high, the output voltage is changed to a voltage opposite to the above-described voltage. Therefore, a shift of a peak value of the output voltage from a desired value is allowed to be reduced. As a result, for example, variations in threshold correction or mobility correction in a driving transistor from one pixel circuit to another are allowed to be reduced, and variations in luminance from one pixel to another are allowed to be reduced.

Moreover, in the embodiment of the disclosure, the first capacity element and the second capacity element are not connected directly to the output terminal; therefore, a coupling amount applied to the gate and the source of the fifth transistor is not affected by parasitic capacitance in an output stage. Therefore, a voltage between the gate of the fifth transistor and the first terminal is allowed to be increased, thereby increasing the speed of the inverter circuit. Moreover, in the embodiment of the disclosure, only one common voltage line on a low voltage side and only one common voltage line on a high voltage side may be arranged. Therefore, in such a case, it is not necessary to increase the resistance to pressure of the inverter circuit.

Further, in the embodiment of the disclosure, in the case where a voltage with a voltage waveform obtained by delaying a waveform of a signal voltage applied to the input terminal is applied to the gate of the third transistor, when the gate voltages of the first transistor, the third transistor, the fourth transistor and the sixth transistor are switched from high to low or from low to high, time necessary for a voltage between the gate of the fifth transistor and the fourth terminal to exceed the threshold voltage of the fifth transistor is allowed to be reduced. Therefore, the speed of circuit operation is allowed to be further increased.

Other and further objects, features and advantages of the disclosure will appear more fully from the following description.

BRIEF DESCRIPTION OF THE DRAWINGS

FIG. 24 is a circuit diagram for describing an example of an operation following FIG. 23.

FIG. 25 is a circuit diagram for describing an example of an operation following FIG. 24.

FIG. 26 is a circuit diagram for describing an example of an operation following FIG. 25.

DETAILED DESCRIPTION OF THE PREFERRED EMBODIMENTS

Preferred embodiments of the disclosure will be described in detail below referring to the accompanying drawings. Descriptions will be given in the following order.
1. First Embodiment (refer to FIGS. 1 to 8)
2. Second Embodiment (refer to FIGS. 9 to 13)
3. Modifications of First and Second Embodiments (refer to FIGS. 14 to 17)
4. Third Embodiment (refer to FIGS. 18 to 26)
5. Fourth Embodiment (refer to FIGS. 27 to 34)
6. Modifications of Third and Fourth Embodiments (refer to FIGS. 35 to 42)
7. Fifth Embodiment (refer to FIGS. 43 to 51)
8. Sixth Embodiment (refer to FIGS. 52 to 57)
9. Modifications of Fifth and Sixth Embodiments (refer to FIGS. 58 to 67)
10. Application Example (refer to FIGS. 68 to 70)
11. Description of related art (refer to FIGS. 71 to 75)

First Embodiment

Configuration

Figure 1:
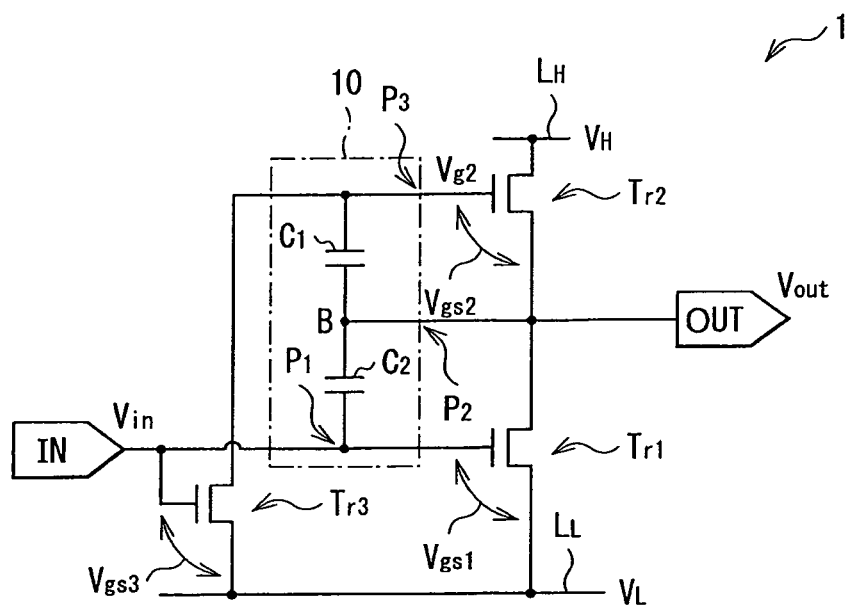
FIG. 1 is a circuit diagram illustrating an example of an inverter circuit according to a first embodiment of the disclosure.

FIG. 1 illustrates an example of a whole configuration of an inverter circuit 1 according to a first embodiment of the disclosure. The inverter circuit 1 outputs, from an output terminal OUT, a pulse signal (for example, refer to a part (B) in FIG. 2) with a substantially inverted signal waveform of a signal waveform (for example, refer to a part (A) in FIG. 2) of a pulse signal applied to an input terminal IN. The inverter circuit 1 is preferably formed on amorphous silicon or amorphous oxide semiconductor, and includes three transistors $Tr_1$, $Tr_2$ and $Tr_3$ each having channels of same conduction type. In addition to the above-described three transistors $Tr_1$, $Tr_2$ and $Tr_3$, the inverter circuit 1 includes two capacity elements $C_1$ and $C_2$, the input terminal IN and the output terminal OUT. In other words, the inverter circuit 1 has a 3Tr2C circuit configuration.

The transistors $Tr_1$, $Tr_2$ and $Tr_3$ correspond to specific examples of "a first transistor", "a second transistor" and "a third transistor" in the disclosure, respectively. Moreover, the capacity elements $C_1$ and $C_2$ correspond to specific examples of "a first capacity element" and "a second capacity element" in the disclosure, respectively.

The transistors $Tr_1$, $Tr_2$ and $Tr_3$ are configured of, for example, n-channel MOS (Metal Oxide Semiconductor) type thin-film transistors (TFTs). The transistor $Tr_1$ makes or breaks electrical connection between the output terminal OUT and a low-voltage line $L_L$ in response to, for example, a potential difference $V_{gs1}$ between a voltage (an input voltage $V_{in}$) of the input terminal IN and a voltage $V_L$ of the low-voltage line $L_L$ (or a potential difference corresponding thereto). A gate of the transistor $Tr_1$ is electrically connected to the input terminal IN, and one terminal of a source and a drain of the transistor $Tr_1$ is electrically connected to the low-voltage line $L_L$, and the other terminal not connected to the low-voltage line $L_L$ of the transistor $Tr_1$ is electrically connected to the output terminal OUT. The transistor $Tr_2$ makes or breaks electrical connection between a high-voltage line $L_H$ and the output terminal OUT in response to a potential difference $V_{gs2}$ between a gate voltage $V_{g2}$ of the transistor $Tr_2$ and a voltage (an output voltage $V_{out}$) of the output terminal OUT (or a potential difference corresponding thereto). A gate of the transistor $Tr_2$ is electrically connected to a drain of the transistor $Tr_3$, and one terminal of a source and a drain of the transistor $Tr_2$ is electrically connected to the output terminal OUT, and the other terminal not connected to the output terminal OUT of the transistor $Tr_2$ is electrically connected to the high-voltage line $L_H$. The transistor $Tr_3$ makes or breaks electrical connection between the gate of the transistor $Tr_2$ and the low-voltage line $L_L$ in response to a potential difference $V_{gs3}$ between the input voltage $V_{in}$ and the voltage $V_L$ of the low-voltage line $L_L$ (or a potential difference corresponding thereto). A gate of the transistor Tr3 is electrically connected to the input terminal IN, and one terminal of a source and the drain of the transistor $Tr_3$ is electrically connected to the low-voltage line $L_L$, and the other terminal not connected to the low-voltage line $L_L$ of the transistor $Tr_3$ is electrically connected to the gate of the transistor $Tr_2$. In other words, the transistors $Tr_1$ and $Tr_3$ are connected to the same voltage line (the low-voltage line $L_L$), and a terminal on a side close to the low-voltage line $L_L$ of the source and the drain of the transistor $Tr_1$ and a terminal on a side close to the low-voltage line $L_L$ of the source and the drain of the transistor $Tr_3$ have the same potential.

The low-voltage line $L_L$ corresponds to a specific example of "a first voltage line" and "a third voltage line" in the disclosure. The high-voltage line $L_H$ corresponds to a specific example of "a second voltage line" in the disclosure.

The high-voltage line $L_H$ is connected to a power supply (not illustrated) outputting a higher voltage (a constant voltage) than the voltage $V_L$ of the low-voltage line $L_L$, and the voltage $V_H$ of the high-voltage line $L_H$ is at a voltage $V_{dd}$ during the drive of the inverter circuit 1. The low-voltage line $L_L$ is connected to a power supply (not illustrated) outputting a lower voltage (a constant voltage) than the voltage $V_H$ of the high-voltage line $L_H$, and the voltage $V_L$ of the low-voltage line $L_L$ is at a voltage $V_{ss}(<V_{dd})$ during the drive of the inverter circuit 1.

The capacity elements $C_1$ and $C_2$ are inserted in series between the input terminal IN and the gate of the transistor $Tr_2$. An electrical connection point B between the capacity element $C_1$ and the capacity element $C_2$ is electrically connected to the output terminal OUT. The capacity element $C_1$ is inserted on a side close to the gate of the transistor $Tr_2$, and the capacity element $C_2$ is inserted on a side close to the gate of the transistor $Tr_1$. The capacity of the capacity element $C_2$ is larger than that of the capacity element $C_1$. Both of the capacities of the capacity elements $C_1$ and $C_2$ preferably satisfy the following expression (1). If the capacities of the capacity elements $C_1$ and $C_2$ satisfy the expression (1), at a falling edge of an input voltage $V_{in}$ which will be described later, a gate-source voltage of the transistor $Tr_2$ is allowed to reach a threshold voltage $V_{th2}$ or over of the transistor $Tr_2$, and the output voltage $V_{out}$ is allowed to be switched from low to high.

$$C_2(V_{dd}-V_{ss})/(C_1+C_2) > V_{th2} \tag{1}$$

The inverter circuit 1 corresponds to an inverter circuit (an inverter circuit 200 in FIG. 72) in related art further including a control element 10 and the transistor $Tr_3$ which are inserted between the transistors $T_{r1}$ and $T_{r2}$ in an output stage and the input terminal IN. In this case, for example, as illustrated in FIG. 1, the control element 10 includes a first terminal $P_1$ electrically connected to the input terminal IN, a second terminal $P_2$ electrically connected to the output terminal OUT and a third terminal $P_3$ electrically connected to the gate of the transistor $Tr_2$. For example, as illustrated in FIG. 1, the control element 10 further includes the capacity elements $C_1$ and $C_2$. For example, when a falling-edge voltage is applied to the first terminal $P_1$, the control element 10 allows a voltage transient of the second terminal $P_2$ to be slower than a voltage transient of the third terminal $P_3$. More specifically, when the falling-edge voltage is applied to the input terminal IN, the control element 10 allows a voltage transient of the source (a terminal on a side close to the output terminal OUT) of the transistor $Tr_2$ to be slower than a voltage transient of the gate of the transistor $Tr_2$. Note that the operation of the control element 10 will be described with the following description of the operation of the inverter circuit 1.

Operation

Figure 3:
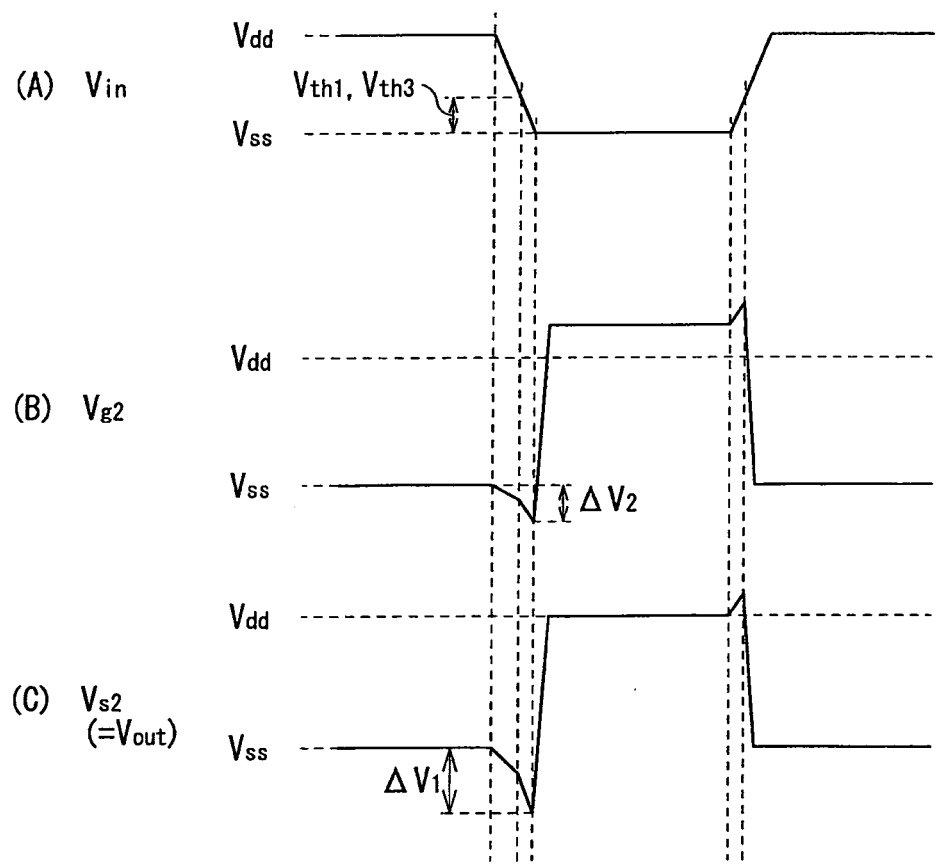
FIG. 3 is a waveform chart illustrating an example of an operation of the inverter circuit in FIG. 1.

Next, an example of the operation of the inverter circuit 1 will be described below referring to FIGS. 3 to 8. FIG. 3 is a waveform chart illustrating an example of the operation of the inverter circuit 1. FIGS. 4 to 8 are circuit diagrams sequentially illustrating an example of the operation of the inverter circuit 1.

Figure 4:
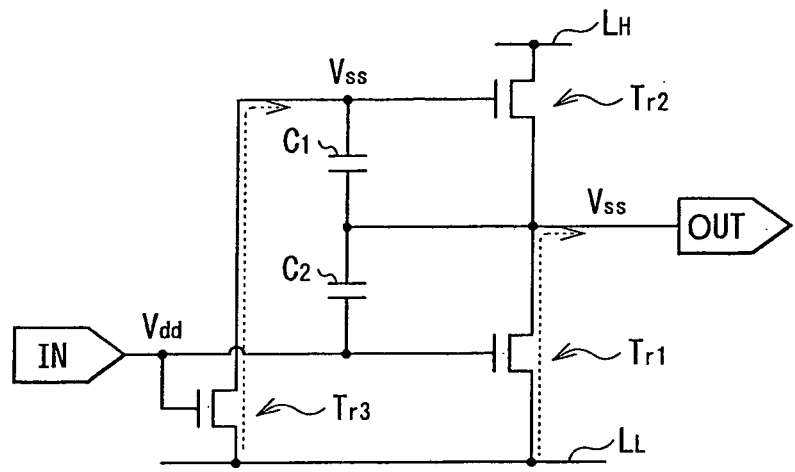
FIG. 4 is a circuit diagram for describing an example of an operation of the inverter circuit in FIG. 1.

First, when the input voltage $V_{in}$ is high ($V_{dd}$), the transistors $Tr_1$ and $Tr_3$ are turned on, and the gate voltage $V_{g2}$ and the source voltage $V_{s2}$ of the transistor $Tr_2$ are charged to a voltage $V_L (=V_{ss})$ of the low-voltage line $L_L$ (refer to FIGS. 3 and 4). Therefore, the transistor $Tr_2$ is turned off (in the case where the transistor $Tr_2$ is turned off at a voltage $V_{gs2}=0$ V), and the voltage $V_{ss}$ is taken out as the output voltage $V_{out}$. At this time, the capacity element $C_2$ is charged to a voltage of $V_{dd}-V_{ss}$.

Figure 5:
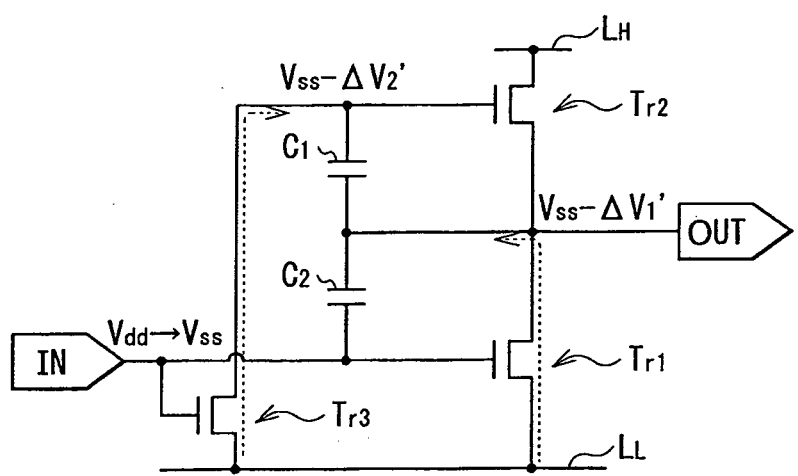
FIG. 5 is a circuit diagram for describing an example of an operation following FIG. 4.

Next, when the input voltage $V_{in}$ is switched (reduced) from high ($V_{dd}$) to low ($V_{ss}$), gate voltages $V_{g1}$ and $V_{g3}$ of the transistors $Tr_1$ and $Tr_3$ are switched (reduced) from the voltage $V_{dd}$ to the voltage $V_{ss}$ (refer to FIGS. 3 and 5). Therefore, a change in the gate voltage of the transistor $Tr_1$ propagates to the source (the output terminal OUT) of the transistor $Tr_2$ through the capacity element $C_2$ to change (reduce) the source voltage $V_{s2}$ (the output voltage $V_{out}$) of the transistor $Tr_2$ by $\Delta V1'$. Moreover, the change in the gate voltage of the transistor $Tr_1$ also propagates to the gate of the transistor $Tr_2$ through the capacity elements $C_1$ and $C_2$ to change (reduce) the gate voltage $V_{g2}$ of the transistor $Tr_2$ by $\Delta V2'$. However, at this time, the transistors $Tr_1$ and $Tr_3$ are on. Therefore, a current flows from the low-voltage line $L_L$ to the source (the output terminal OUT) of the transistor $Tr_2$ and the gate of the transistor $Tr_2$ so as to charge the source (the output terminal OUT) of the transistor $Tr_2$ and the gate of the transistor $Tr_2$ to the voltage $V_{ss}$.

In this case, as the gate voltages of the transistors $Tr_1$ and $Tr_3$ are switched (reduced) from the voltage $V_{dd}$ to the voltage $V_{ss}$, on-resistances of the transistors $Tr_1$ and $Tr_3$ are gradually increased to increase time necessary to charge the source (the output terminal OUT) and the gate of the transistor $Tr_2$ to the voltage $V_L$ of the low-voltage line $L_L$.

Moreover, when full capacity at the source (the output terminal OUT) of the transistor $Tr_2$ and full capacity at the gate of the transistor $Tr_2$ are compared to each other, the capacity elements $C_1$ and $C_2$ are connected in parallel to the source (the output terminal OUT) of the transistor $Tr_2$, and the capacity elements $C_1$ and $C_2$ are connected in series to the gate of the transistor $Tr_2$. Therefore, the voltage transient of the source (the output terminal OUT) of the transistor $Tr_2$ is slower than that of the gate of the transistor $Tr_2$. As a result, time necessary to charge the source (the output terminal OUT) of the transistor $Tr_2$ to the voltage $V_L$ of the low-voltage line $L_L$ is longer than time necessary to charge the gate of the transistor $Tr_2$ to the voltage $V_L$ of the low-voltage line $L_L$.

Moreover, in the case where the input voltage $V_{in}$ is at a voltage $V_{ss}+V_{th1}$ or over, and further at a voltage $V_{ss}+V_{th3}$ or over, the transistors $Tr_1$ and $Tr_3$ operate in a linear region. Note that $V_{th1}$ is a threshold voltage of the transistor $Tr_1$, and $V_{th3}$ is a threshold voltage of the transistor $Tr_3$. On the other hand, in the case where the input voltage $V_{in}$ is smaller than the voltage $V_{ss}+V_{th1}$, and further smaller than the voltage $V_{ss}+V_{th3}$, the transistors $Tr_1$ and $Tr_3$ operate in a saturation region. Therefore, although a current illustrated in FIG. 5 flows through the source (the output terminal OUT) and the gate of the transistor $Tr_2$, each of the terminals of the transistors $Tr_1$ and $Tr_3$ is not allowed to be charged to the voltage $V_{ss}$.

Figure 6:
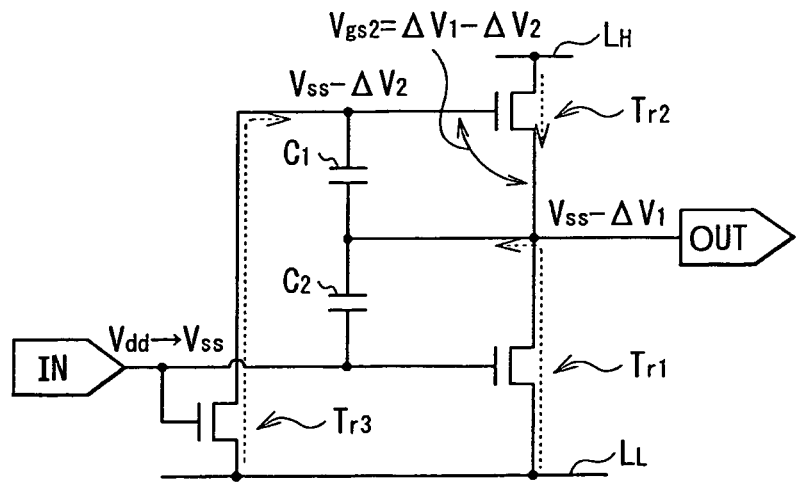
FIG. 6 is a circuit diagram for describing an example of an operation following FIG. 5.

When the input voltage $V_{in}$ is switched from the voltage $V_{dd}$ to the voltage $V_{ss}$, ultimately, the gate-source voltage $V_{gs2}$ of the transistor $Tr_2$ is changed to a voltage $\Delta V_1 - \Delta V_2$ (refer to FIGS. 3 and 6). At this time, when the gate-source voltage $V_{gs2}$ of the transistor $Tr_2$ exceeds the threshold voltage $V_{th2}$ of the transistor $Tr_2$, the transistor $Tr_2$ is turned on, and the current starts to flow from the high-voltage line $L_H$.

When the transistor $Tr_2$ is on, the source voltage $V_{s2}$ (an output voltage $V_{out}$) of the transistor $Tr_2$ is increased by the transistor $Tr_2$ in addition to the transistor $Tr_1$. Moreover, as the capacity element $C_1$ is connected between the gate and the source of the transistor $Tr_2$, a bootstrap is caused, and the gate voltage $V_{g2}$ of the transistor $Tr_2$ is increased with an increase in the source voltage $V_{s2}$ (the output voltage $V_{out}$) of the transistor $Tr_2$. After that, when the source voltage $V_{s2}$ (the output voltage $V_{out}$) and the gate voltage $V_{g2}$ of the transistor $Tr_2$ reach the voltage $V_{ss}-V_{th1}$ or over, further the voltage $V_{ss}-V_{th3}$ or over, the transistors $Tr_1$ and $Tr_3$ are turned off, and the source voltage $V_{s2}$ (the output voltage $V_{out}$) and the gate voltage $V_{g2}$ of the transistor $Tr_2$ are increased only by the transistor $Tr_2$.

Figure 7:
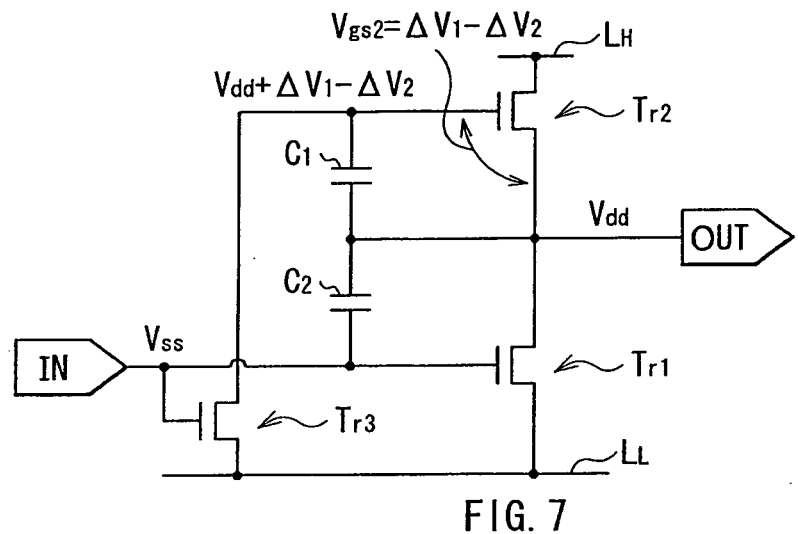
FIG. 7 is a circuit diagram for describing an example of an operation following FIG. 6.
Figure 8:
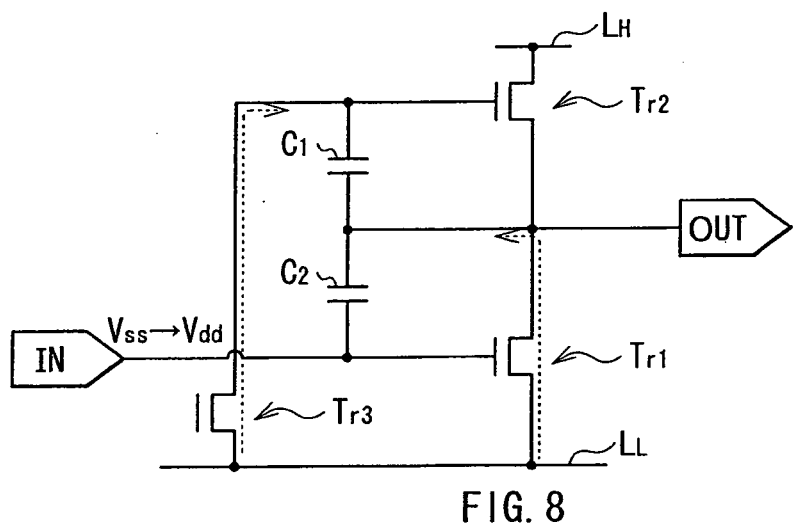
FIG. 8 is a circuit diagram for describing an example of an operation following FIG. 7.

After a lapse of a certain period, the source voltage $V_{s2}$ (the output voltage $V_{out}$) of the transistor $Tr_2$ is changed to the voltage $V_{dd}$ to output the voltage $V_{dd}$ from the output terminal OUT (refer to FIGS. 3 and 7). Then, after a lapse of another certain period, the input voltage $V_{in}$ is switched (increased) from low ($V_{ss}$) to high ($V_{dd}$) (refer to FIGS. 3 and 8). At this time, in a stage where the input voltage $V_{in}$ is lower than the voltage $V_{ss}+V_{th1}$, and further lower than a voltage $V_{ss}+V_{th3}$, the transistors $Tr_1$ and $Tr_3$ are off. Therefore, coupling through the capacity elements $C_1$ and $C_2$ is applied to the source (the output terminal OUT) and the gate of the transistor $Tr_2$ to increase the source voltage $V_{s2}$ (the output voltage $V_{out}$) and the gate voltage $V_{g2}$ of the transistor $Tr_2$. After that, when the input voltage $V_{in}$ reaches the voltage $V_{ss}+V_{th1}$ or over, and further the voltage $V_{ss}+V_{th3}$ or over, the transistors $Tr_1$ and $Tr_3$ are turned on. Therefore, a current flows toward the source (the output terminal OUT) and the gate of the transistor $Tr_2$ so as to charge the source (the output terminal OUT) and the gate of the transistor $Tr_2$ to the voltage $V_{ss}$.

In this case, as the gate voltages of the transistors $Tr_1$ and $Tr_3$ are switched (increased) from the voltage $V_{ss}$ to the voltage $V_{dd}$, on-resistances of the transistors $Tr_1$ and $Tr_3$ are gradually reduced to relatively reduce time necessary to charge the source (the output terminal OUT) and the gate of the transistor $Tr_2$ to the voltage $V_L$ of the low-voltage line $L_L$. Ultimately, the source voltage $V_{s2}$ (the output voltage $V_{out}$) and the gate voltage $V_{g2}$ of the transistor $Tr_2$ reach the voltage $V_{ss}$, and the output terminal outputs the voltage $V_{ss}$ (refer to FIGS. 3 and 4).

Figure 2:
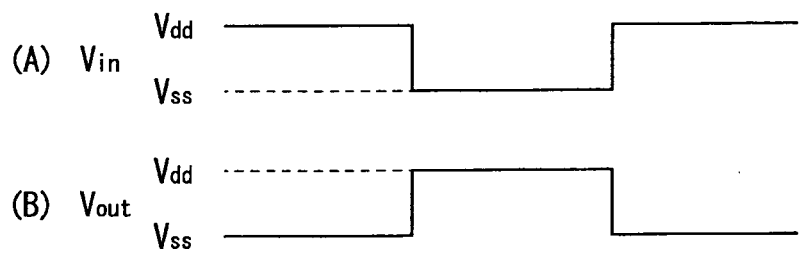
FIG. 2 is a waveform chart illustrating an example of input/output signal waveforms of the inverter circuit in FIG. 1.

As described above, the inverter circuit 1 according to the first embodiment outputs, from the output terminal OUT, a pulse signal (for example, refer to the part (B) in FIG. 2) with a substantially inverted signal waveform of a signal waveform (for example, refer to the part (A) in FIG. 2) of a pulse signal applied to the input terminal IN.

Effects

Figure 72:
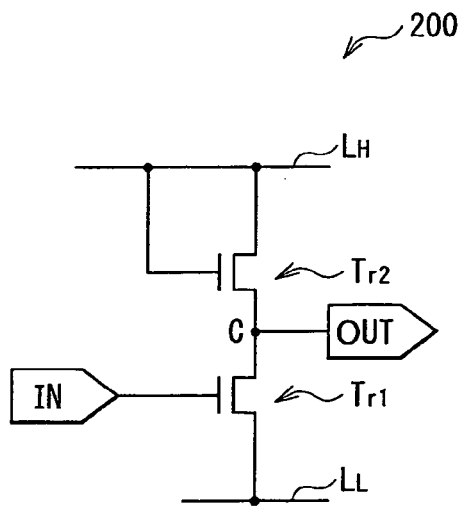
FIG. 72 is a circuit diagram illustrating an example of an inverter circuit in related art.
Figure 73:
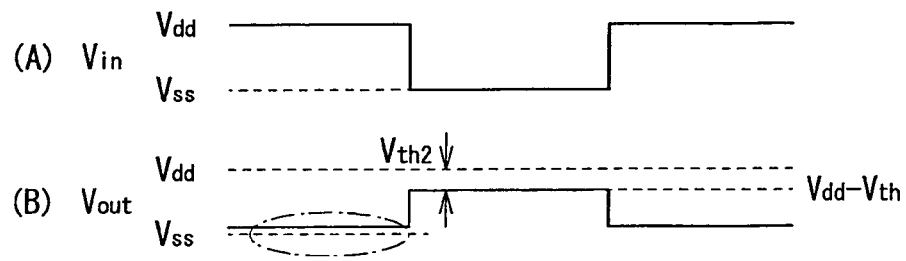
FIG. 73 is a waveform chart illustrating an example of input/output signal waveforms of the inverter circuit in FIG. 72.

The inverter circuit 200 in related art illustrated in FIG. 72 has, for example, a single channel type circuit configuration in which two n-channel MOS type transistors $Tr_1$ and $Tr_2$ are connected to each other in series. In the inverter circuit 200, for example, as illustrated in FIG. 73, when the input voltage $V_{in}$ is at the voltage $V_{ss}$, the output voltage $V_{out}$ is not at the voltage $V_{dd}$ but at a voltage $V_{dd}-V_{th2}$. In other words, the output voltage $V_{out}$ includes the threshold voltage $V_{th2}$ of the transistor $Tr_2$, and the output voltage $V_{out}$ is greatly affected by variations in the threshold voltage $V_{th2}$ of the transistor $Tr_2$.

Figure 74:
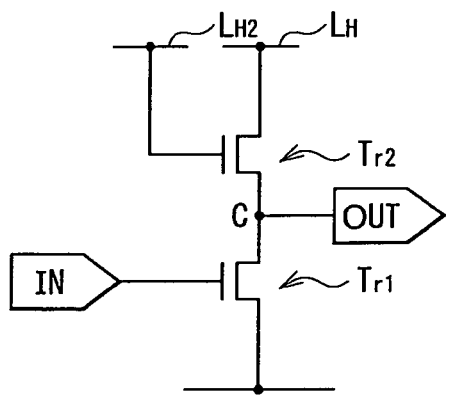
FIG. 74 is a circuit diagram illustrating another example of an inverter circuit in related art.

Therefore, it is considered that, for example, as illustrated in an inverter circuit 300 in FIG. 74, the gate and the drain of the transistor $Tr_2$ are electrically separated from each other, and the gate is connected to a high-voltage wiring line $L_{H2}$ to which a higher voltage $V_{dd2}$ ($=V_{dd}+V_{th2}$) than the voltage $V_{dd}$ of the drain is applied. Moreover, for example, a bootstrap type circuit configuration represented by an inverter circuit 400 in FIG. 75 is considered.

Figure 75:
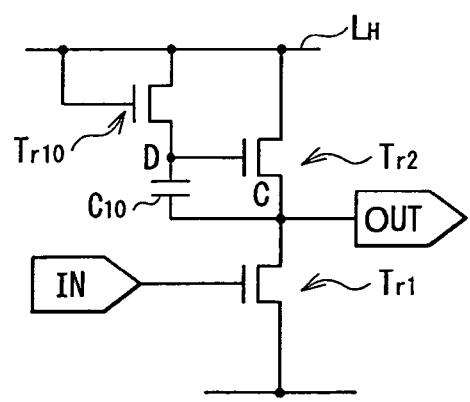
FIG. 75 is a circuit diagram illustrating still another example of an inverter circuit in related art.

However, in any of the circuits in FIGS. 72, 74 and 75, even in the case where the input voltage $V_{in}$ is high, that is, even in the case where the output voltage $V_{out}$ is low, a current (a through current) flows from the high-voltage wiring line $L_H$ to a low-voltage wiring line $L_L$ through the transistors $Tr_1$ and $Tr_2$. As a result, power consumption in the inverter circuits is increased. Moreover, in the circuits in FIGS. 72, 74 and 75, for example, as illustrated in a point encircled by a broken line in a part (B) in FIG. 73, when the input voltage $V_{in}$ is at the voltage $V_{dd}$, the output voltage $V_{out}$ is not at the voltage $V_{ss}$, and a peak value of the output voltage $V_{out}$ varies. Therefore, for example, in the case where the inverter circuits are used in a scanner in an active matrix organic EL display, threshold correction or mobility correction in a driving transistor varies from one pixel circuit to another, thereby causing variations in luminance.

On the other hand, in the inverter circuit 1 according to the first embodiment, the transistors $Tr_1$ and $Tr_3$ performing an ON/OFF operation in response to a potential difference between the input voltage $V_{in}$ and the voltage $V_L$ of the low-voltage line $L_L$ are arranged between the gate of the transistor $Tr_2$ and the low-voltage line $L_L$ and between the source of the transistor $Tr_2$ and the low-voltage line $L_L$. Therefore, when the gate voltages of the transistors $Tr_1$ and $Tr_3$ are switched (reduced) from high ($V_{dd}$) to low ($V_{ss}$), on-resistances of the transistors $Tr_1$ and $Tr_3$ are gradually increased to increase time necessary to charge the gate and the source of the transistor $Tr_2$ to the voltage $V_L$ of the low-voltage line $L_L$. Moreover, when the gate voltages of the transistors $Tr_1$ and $Tr_3$ are switched (increased) from low ($V_{ss}$) to high ($V_{dd}$), the on-resistances of the transistors $Tr_1$ and $Tr_3$ are gradually reduced to reduce time necessary to charge the gate and the source of the transistor $Tr_2$ to the voltage $V_L$ of the low-voltage line $L_L$. Further, in the inverter circuit 1 according to the first embodiment, the capacity elements $C_1$ and $C_2$ are connected in series to the gate of the transistor $Tr_2$, and are connected in parallel to the source of the transistor $Tr_2$. Therefore, the voltage transient of the source of the transistor $Tr_2$ is slower than that of the gate of the transistor $Tr_2$. As a result, when the gate voltages of the transistors $Tr_1$ and $Tr_3$ are switched (reduced) from high ($V_{dd}$) to low ($V_{ss}$), the gate-source voltage $V_{gs2}$ of the transistor $Tr_2$ exceeds the threshold voltage $V_{th2}$ of the transistor $Tr_2$, and the transistor $Tr_2$ is turned on, and immediately after that, the transistors $Tr_1$ and $Tr_3$ are turned off. In other words, when the switched input voltage Vin is applied to the gate and the source of the transistor $Tr_2$ through the capacity elements $C_1$ and $C_2$, and the gate-source voltage $V_{gs2}$ exceeds the threshold voltage $V_{th2}$ by a transient difference, the transistor $Tr_2$ is turned on, and immediately after that, the transistors $Tr_1$ and $Tr_3$ are turned off. At this time, the output voltage $V_{out}$ is changed to a voltage of the high-voltage line $L_H$. Moreover, when the gate voltages of the transistors $Tr_1$ and $Tr_3$ are switched (increased) from low ($V_{ss}$) to high ($V_{dd}$), the transistors $Tr_1$ and $Tr_3$ are turned on, and immediately after that, the transistor $Tr_2$ is turned off. At this time, the output voltage $V_{out}$ is changed to a voltage of the low-voltage line $L_L$.

Thus, in the inverter circuit 1 according to the first embodiment, a period where the transistor $Tr_1$ and the transistor $Tr_2$ are simultaneously turned on is almost eliminated. Therefore, a current (a through current) hardly flows between the high-voltage line $L_H$ and the low-voltage line $L_L$ through the transistors $Tr_1$ and $Tr_2$. As a result, power consumption is allowed to be reduced. Moreover, when the gate voltages of the transistors $Tr_1$ and $Tr_3$ are switched (reduced) from high ($V_{dd}$) to low ($V_{ss}$), the output voltage $V_{out}$ is changed to the voltage of the high-voltage line $L_H$, and when the gate voltages of the transistors $Tr_1$ and $Tr_3$ are switched (increased) from low ($V_{ss}$) to high ($V_{dd}$), the output voltage $V_{out}$ is changed to the voltage of the low-voltage line $L_L$. Therefore, variations in the output voltage $V_{out}$ are allowed to be eliminated. As a result, for example, variations in threshold correction or mobility correction in the driving transistor from one pixel circuit to another are allowed to be reduced, and variations in luminance from one pixel to another are allowed to be reduced.

Second Embodiment

Configuration

Figure 9:
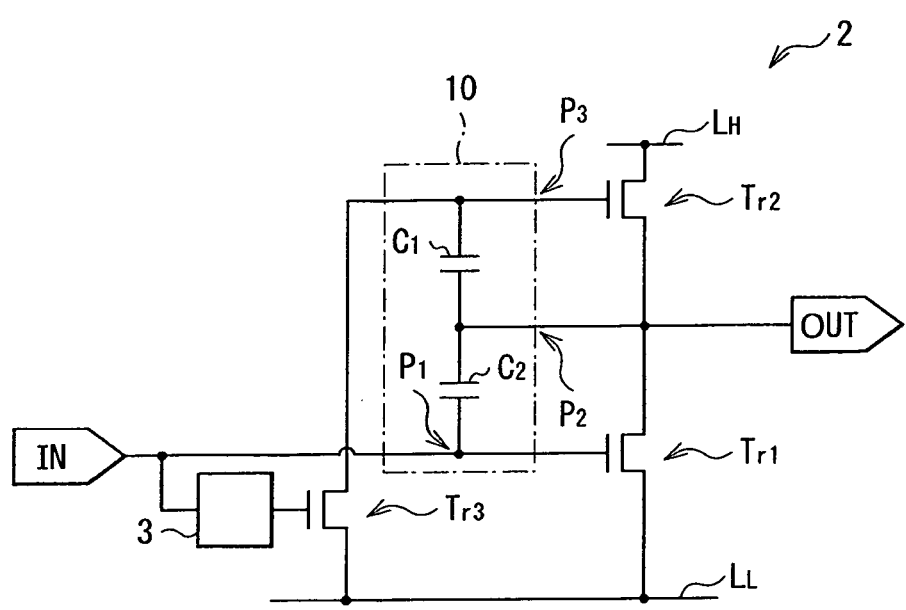
FIG. 9 is a circuit diagram illustrating an example of an inverter circuit according to a second embodiment of the disclosure.

FIG. 9 illustrates an example of a whole configuration of an inverter circuit 2 according to a second embodiment of the disclosure. As in the case of the inverter circuit 1 according to the first embodiment, the inverter circuit 2 outputs, from the output terminal OUT, a pulse signal (for example, refer to the part (B) in FIG. 2) with a substantially inverted signal waveform of a signal waveform (for example, refer to the part (A) in FIG. 2) of a pulse signal applied to the input terminal IN. The configuration of the inverter circuit 2 differs from that of the inverter circuit 1 according to the first embodiment in including a delay element 3. Hereinafter, differences between the first and second embodiments will be mainly described, and similarities between the first and second embodiments will not be described.

The delay element 3 inputs, to the gate of the transistor $Tr_3$, a voltage with a waveform obtained by delaying a voltage waveform of a signal voltage applied to the input terminal IN. The delay element 3 is arranged between the input terminal IN and the gate of the transistor $Tr_3$, and inputs, to the gate of the transistor $Tr_3$, a voltage with a slower falling edge than that of the voltage waveform of the signal voltage applied to the input terminal IN. Note that the delay element 3 may allow not only the falling edge but also the rising edge of the voltage waveform to be slower than that of the voltage waveform of the signal voltage applied to the input terminal IN. However, in this case, the delay element 3 delays the voltage waveform of the signal voltage applied to the input terminal IN so that its falling edge is slower than its rising edge.

Figure 10A:
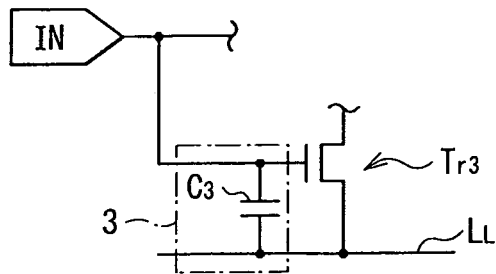
FIGS. 10A to 10D are circuit diagrams illustrating variations of a delay element in FIG. 9.

The delay element 3 has any of circuit configurations illustrated in FIGS. 10A to 10D. In FIG. 10A, the delay element 3 includes a capacity element $C_3$. An end of the capacity element $C_3$ is electrically connected to the gate of the transistor $Tr_3$, and the other end of the capacity element $C_3$ is electrically connected to the low-voltage line $L_L$.

Figure 10B:
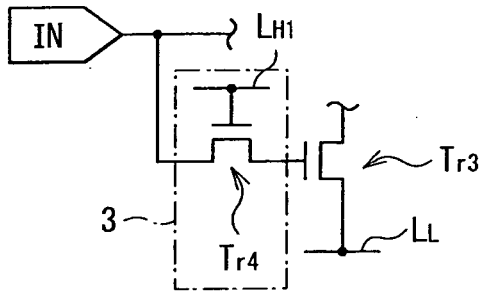

In FIG. 10B, the delay element 3 includes a transistor $Tr_4$. The transistor $Tr_4$ is configured of a transistor having channels of same conduction type as that of the transistors $Tr_1$, $Tr_2$ and $Tr_3$, for example, an n-channel MOS type TFT. A source of the transistor $Tr_4$ is electrically connected to the gate of the transistor $Tr_3$, and a drain of the transistor $Tr_4$ is electrically connected to the input terminal IN. A gate of the transistor $Tr_4$ is electrically connected to a high-voltage line $L_{H1}$. The high-voltage line $L_{H1}$ is electrically connected to a power supply (not illustrated) outputting a pulse signal allowing the transistor $Tr_4$ to perform an ON/OFF operation.

Figure 10C:
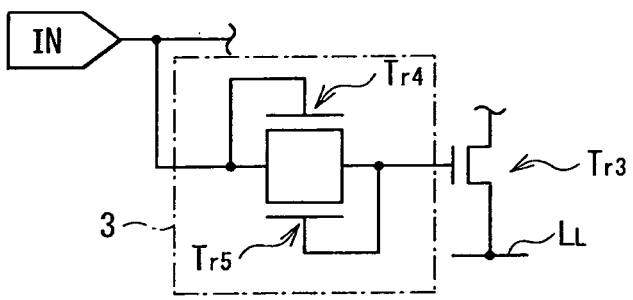

In FIG. 10C, the delay element 3 includes the above-described transistor $Tr_4$ and a transistor $Tr_5$. The transistor $Tr_5$ is configured of a transistor having channels of same conduction type as that of the transistors $Tr_1$, $Tr_2$ and $Tr_3$, for example, an n-channel MOS type TFT. A gate and a source of the transistor $Tr_5$ are electrically connected to the gate of the transistor $Tr_3$, and a drain of the transistor $Tr_5$ is electrically connected to the input terminal IN.

Figure 10D:
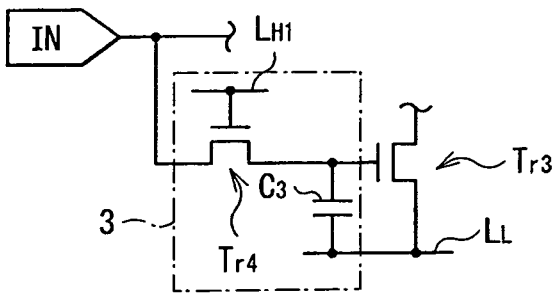

In FIG. 10D, the delay element 3 includes the above-described transistor $Tr_4$ and the above-described capacity element $C_3$.

Operation and Effects

Figure 11:
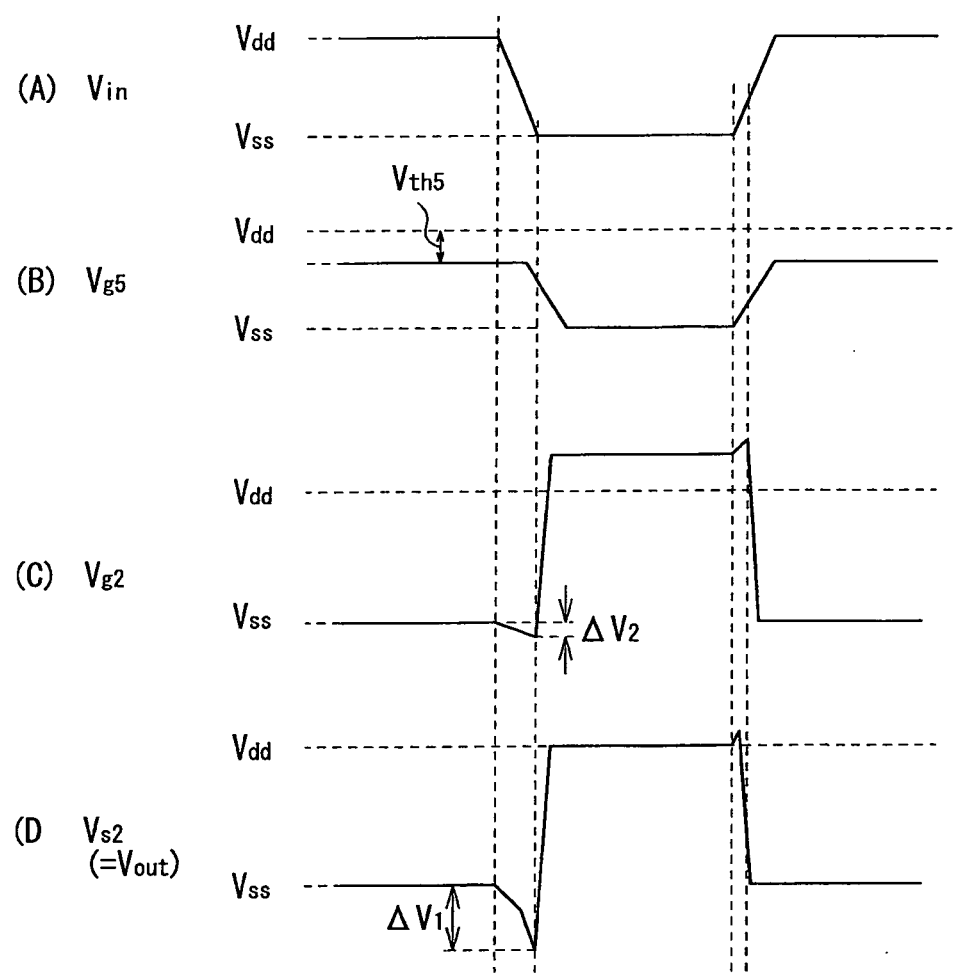
FIG. 11 is a waveform chart illustrating an example of an operation of the inverter circuit in FIG. 9.

FIG. 11 illustrates an example of the operation of the inverter circuit 2. Note that FIG. 11 illustrates waveforms in the case where a circuit configuration illustrated in FIG. 10D is used as the delay element 3. The basic operation of the inverter circuit 2 is the same as that illustrated in FIGS. 3 to 8. A different operation from that illustrated in FIGS. 3 to 8 is performed when the input voltage $V_{in}$ is switched (reduced) from high ($V_{dd}$) to low ($V_{ss}$) and when the input voltage $V_{in}$ is switched (increased) from low ($V_{ss}$) to high ($V_{dd}$).

When the input voltage $V_{in}$ is switched (reduced) from high ($V_{dd}$) to low ($V_{ss}$), the gate voltages of the transistors $Tr_1$ and $Tr_3$ are changed from the voltage $V_{dd}$ to the voltage $V_{ss}$. In the inverter circuit 1 according to the first embodiment, the voltage change causes a voltage change by $\Delta V_1$ in the source of the transistor $Tr_2$ through the capacity element $C_2$, and further causes a voltage change by $\Delta V_2$ in the gate of the transistor $Tr_2$ through the capacity elements $C_1$ and $C_2$. In this case, a coupling amount of $\Delta V_2$ is applied to the gate of the transistor $Tr_2$, because the gate voltage $V_{g3}$ of the transistor $Tr_3$ is reduced from the voltage $V_{dd}$ to the voltage $V_{ss}$, and as a result, the on-resistance of the transistor $Tr_3$ is gradually increased to slow a voltage transient for charging the gate of the transistor $Tr_2$ to the voltage $V_{ss}$. In other words, the coupling amount of $\Delta V_2$ is applied to the gate of the transistor $Tr_2$, because the transistor $Tr_3$ is switched from on to off at a timing of applying coupling.

Figure 12:
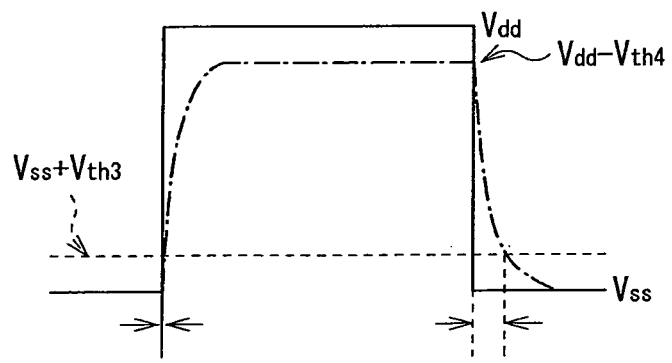
FIG. 12 is a waveform chart illustrating an example of input/output signal waveforms of the delay element in FIG. 9.
Figure 13:
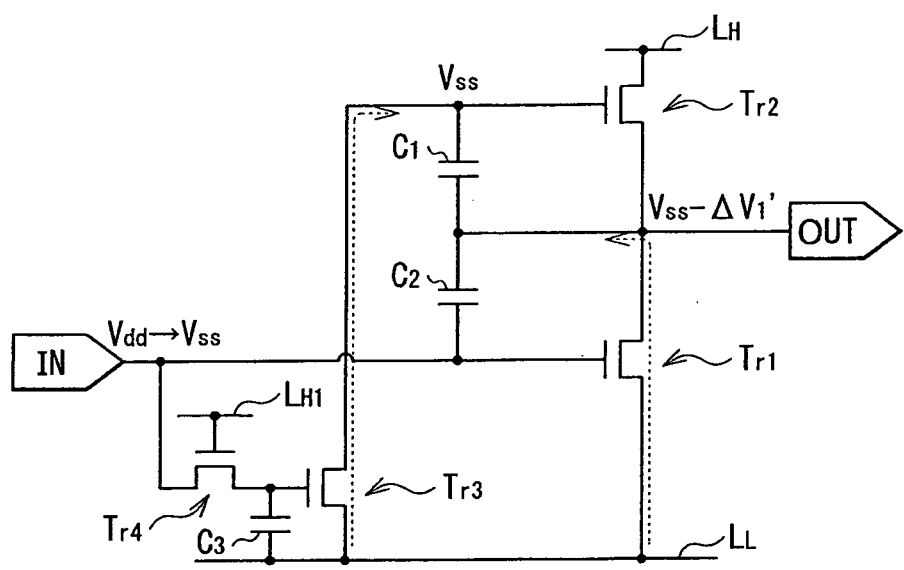
FIG. 13 is a circuit diagram for describing an example of an operation of the inverter circuit in FIG. 9.
Figure 14:
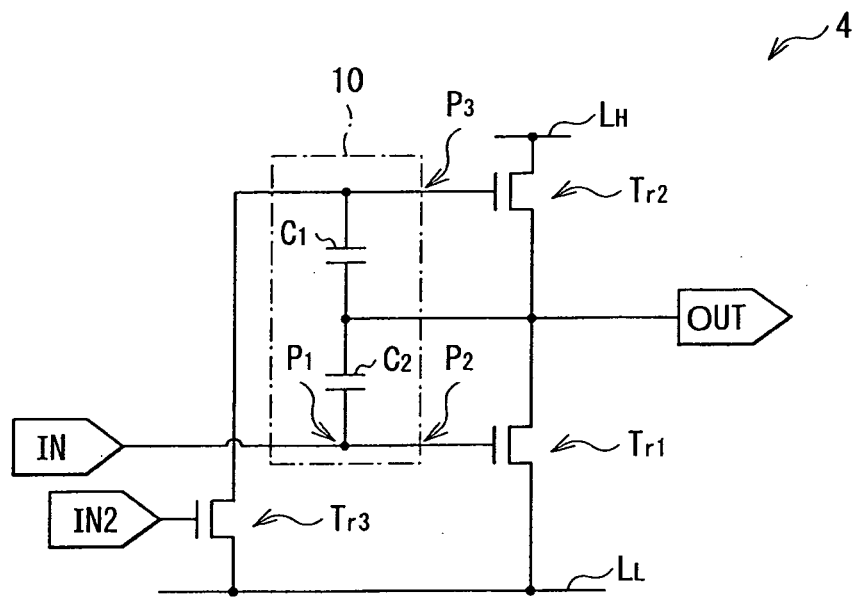
FIG. 14 is a circuit diagram illustrating a modification of the inverter circuit in FIG. 9.
Figure 15:
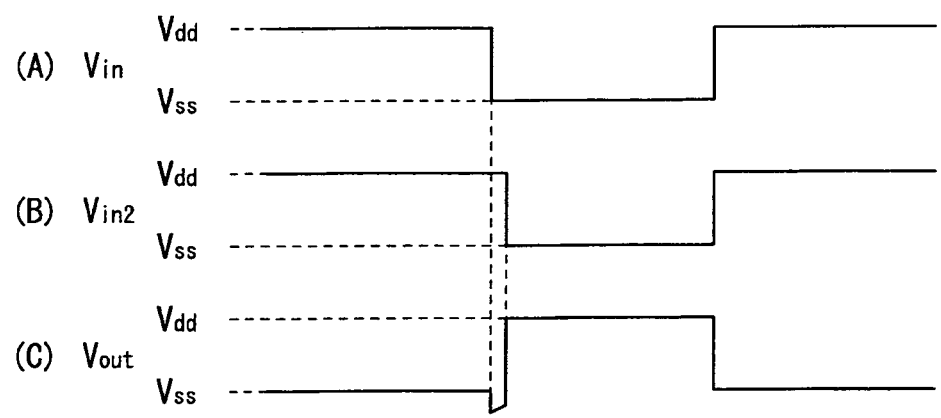
FIG. 15 is a waveform chart illustrating an example of an operation of the inverter circuit in FIG. 14.

On the other hand, in the embodiment, a signal voltage as illustrated in FIG. 12 obtained by delaying the signal voltage applied to the input terminal IN by the delay element 3 is applied to the gate of the transistor $Tr_3$. Therefore, an off point (a point of switching from on to off) of the transistor $Tr_3$ is delayed, compared to the case where the input voltage $V_{in}$ is applied as is to the gate of the transistor $Tr_3$. In other words, the transistor $Tr_3$ is still on at the timing of applying coupling through the capacity element $C_2$ (refer to FIG. 13). Therefore, ultimately, the coupling amount ($\Delta V_2$) applied to the gate of the transistor $Tr_2$ is allowed to be reduced to be smaller than that in related art (refer to a part (C) in FIG. 11), and a gate-source voltage $V_{gs2}$ of the transistor $Tr_2$ is allowed to be increased. As a result, the speed of the inverter circuit 2 is allowed to be increased.

In the embodiment, even in the case where the input voltage $V_{in}$ is switched (increased) from low ($V_{ss}$) to high ($V_{dd}$), a signal voltage as illustrated in FIG. 12 obtained by delaying the signal voltage applied to the input terminal IN by the delay element 3 is applied to the gate of the transistor $Tr_3$. Therefore, as the off point of the transistor $Tr_3$ is delayed, the transistor $Tr_3$ is turned on after the transistor $Tr_1$ is turned on, and there is a possibility that a current (a through current) flows from the high-voltage line $L_H$ to the low-voltage line $L_L$, in a state where the output voltage $V_{out}$ is switched. However, when an operation point at which the transistor $Tr_3$ is turned on and the waveform of the signal voltage, applied to the gate of the transistor $Tr_3$ are considered, even though the signal voltage applied to the gate of the transistor $Tr_3$ is delayed, the time of turning the transistor $Tr_3$ on is hardly changed at the rising edge as illustrated in FIG. 12, and on the other hand, the time of turning the transistor $Tr_3$ off is largely changed at the falling edge. Therefore, a period where the above-described through current flows is extremely short, and the power consumption of the inverter circuit 2 is not much different from that of the inverter circuit 1.

In the first embodiment, coupling caused by a change in the input voltage $V_{in}$ is applied to the source and the gate of the transistor $Tr_2$ so that the gate-source voltage $V_{gs2}$ of the transistor $Tr_2$ has a value equal to or higher than the threshold voltage $V_{th2}$ of the transistor $Tr_2$ with use of a difference in voltage transient between the source and the gate of the transistor $Tr_2$. At this time, the output terminal OUT outputs the voltage of the high-voltage line $L_H$ as the output voltage $V_{out}$, but the voltage transient of the output terminal OUT is highly dependent on the gate-source voltage $V_{gs2}$ of the transistor $Tr_2$. In other words, in the case where the gate-source voltage $V_{gs2}$ of the transistor $Tr_2$ is rapidly increased, the output voltage $V_{out}$ rapidly rises, and in the case where the gate-source voltage $V_{gs2}$ of the transistor $Tr_2$ is gradually increased, the out voltage $V_{out}$ gradually rises.

Therefore, to increase the speed of the inverter circuit 1, it is necessary for the gate-source voltage $V_{gs2}$ of the transistor $Tr_2$ to rapidly rise, and as a method of doing so, for example, it is considered to increase the capacity of the capacity element $C_2$. However, in the case where the capacity of the capacity element $C_2$ is increased, an area occupied by the inverter circuit 1 is increased. As a result, for example, in the case where the inverter circuit 1 including the capacity element $C_2$ with a larger capacity is used for a scanner or the like in an organic EL display, an area occupied by the inverter circuit 1 in a peripheral part (a frame) of a display panel may be increased to interfere with a reduction in the area of the frame. Moreover, an increase in the capacity of the capacity element $C_2$ causes a larger voltage change than $\Delta V_1$ in the source (the output terminal OUT) of the transistor $Tr_2$, thereby causing a larger voltage change than $\Delta V_2$ in the gate of the transistor $Tr_2$. As a result, even though the capacity of the capacity element $C_2$ is increased, the gate-source voltage $V_{gs2}$ of the transistor $Tr_2$ has a value not much different from $\Delta V_1 - \Delta V_2$; therefore, an increase in the capacity of the capacity element $C_2$ does not much contribute to an increase in the speed of the inverter circuit 1.

On the other hand, in the embodiment, the signal voltage as illustrated in FIG. 12 obtained by delaying the signal voltage applied to the input terminal IN by the delay element 3 is applied to the gate of the transistor $Tr_3$. Therefore, the speed of the inverter circuit 2 is allowed to be increased without increasing the capacity of the capacity element $C_2$.

Modifications of First and Second Embodiments

In the first and second embodiments, the transistors $Tr_1$, $Tr_2$ and $Tr_3$ are configured of the n-channel MOS type TFTs, but they may be configured of, for example, p-channel MOS type TFTs. However, in this case, the high-voltage line $L_H$ and the low-voltage line $L_L$ change places, and a transient response when the transistors $Tr_1$, $Tr_2$ and $Tr_3$ are switched (increased) from low ($V_{ss}$) to high ($V_{dd}$) and a transient response when the transistors $Tr_1$, $Tr_2$ and $Tr_3$ are switched (reduced) from high ($V_{dd}$) to low ($V_{ss}$) are opposite to each other.

Moreover, in the second embodiment, the signal voltage as illustrated in FIG. 12 obtained by delaying the signal voltage applied to the input terminal IN by the delay element 3 is applied to the gate of the transistor $Tr_3$, but such a signal may be applied to the gate of the transistor $Tr_3$ by another method. For example, as illustrated in an inverter circuit 4 in FIG. 14, an input terminal IN2 may be provided independently of the input terminal IN, and the input terminal IN2 and the gate of the transistor $Tr_3$ may be electrically connected to each other so as to externally apply a signal as illustrated in a part (B) in FIG. 15 to the input terminal IN2.

Figure 16:
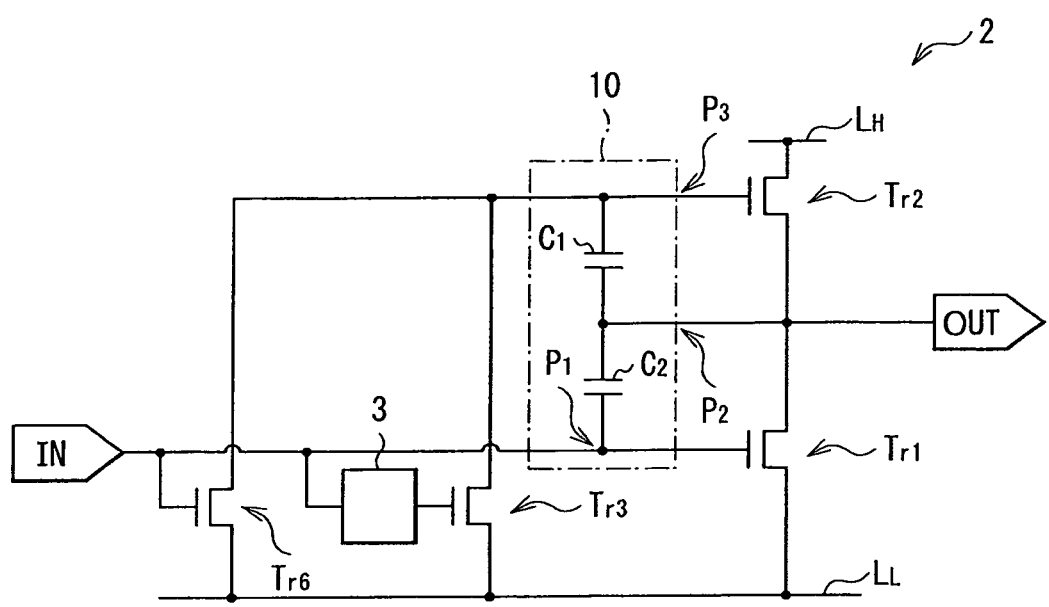
FIG. 16 is a circuit diagram illustrating another modification of the inverter circuit in FIG. 9.
Figure 17:
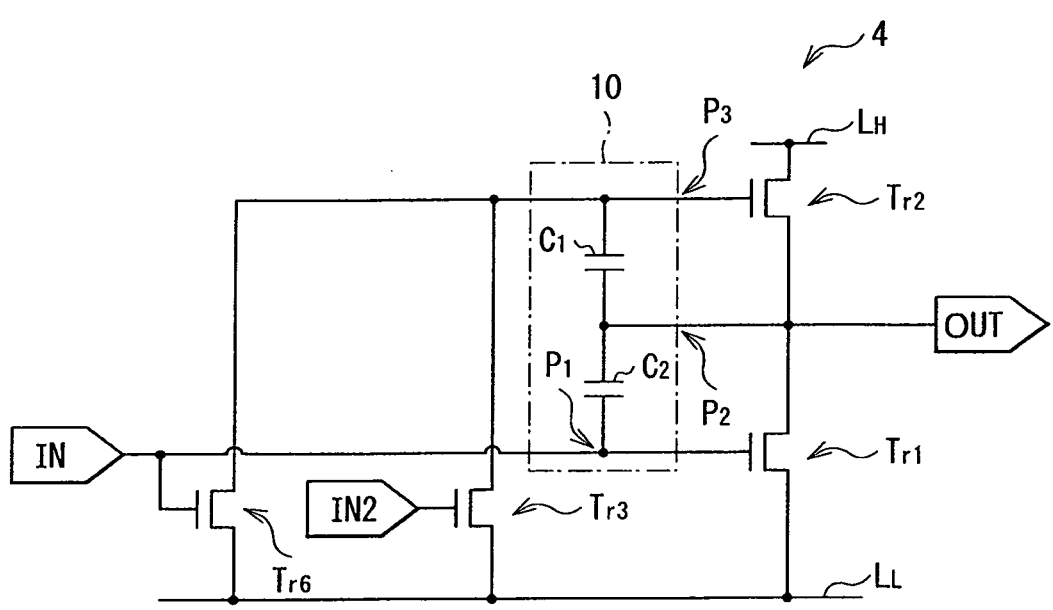
FIG. 17 is a circuit diagram illustrating another modification of the inverter circuit in FIG. 14.

Further, in the second embodiment and the modifications thereof, in the case where the input voltage $V_{in}$ is switched (increased) from low ($V_{ss}$) to high ($V_{dd}$), a current (a through current) may flow from the high-voltage line $L_H$ to the low-voltage line $L_L$; therefore, an element for preventing such a current flow may be added. For example, as illustrated in FIGS. 16 and 17, a transistor $Tr_6$ may be further included in the control element 10. Note that the transistor $Tr_5$ is configured of a transistor having channels of the same conduction type as that of the transistors $Tr_1$, $Tr_2$ and $Tr_3$, for example, an n-channel MOS type TFT.

The transistor $Tr_6$ is connected in parallel to the transistor $Tr_1$, and a gate of the transistor $Tr_6$ is connected to the input terminal IN. In such a case, when the input voltage $V_{in}$ is switched (reduced) from high ($V_{dd}$) to low ($V_{ss}$), an on-period of the transistor $Tr_3$ is increased, and on the other hand, when the input voltage $V_{in}$ is switched (increased) from low ($V_{ss}$) to high ($V_{dd}$), before turning the transistor $Tr_3$ on, the transistor $Tr_6$ is allowed to be turned on by the input voltage $V_{in}$ which is not delayed. As a result, the through current is allowed to be reduced.

Third Embodiment

Configuration

Figure 18:
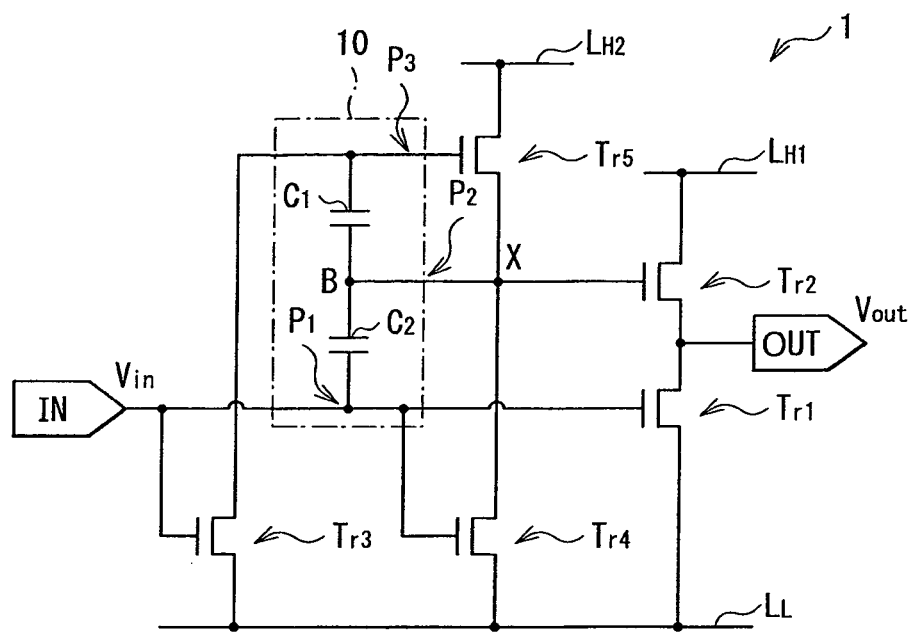
FIG. 18 is a circuit diagram illustrating an example of an inverter circuit according to a third embodiment of the disclosure.

FIG. 18 illustrates an example of a whole configuration of an inverter circuit 1 according to a third embodiment of the disclosure. The inverter circuit 1 outputs, from an output terminal OUT, a pulse signal (for example, refer to a part (B) in FIG. 19) with a substantially inverted signal waveform of a signal waveform (for example, refer to a part (A) in FIG. 19) of a pulse signal applied to an input terminal IN. The inverter circuit 1 is preferably formed on amorphous silicon or amorphous oxide semiconductor, and includes five transistors $Tr_1$ to $Tr_5$ each having channels of same conduction type. In addition to the above-described five transistors $Tr_1$ to $Tr_5$, the inverter circuit 1 includes two capacity elements $C_1$ and $C_2$, the input terminal IN and the output terminal OUT. In other words, the inverter circuit 1 has a 5Tr2C circuit configuration.

The transistors $Tr_1$, $Tr_2$ and $Tr_3$ correspond to specific examples of "a first transistor", "a second transistor" and "a third transistor" in the disclosure, respectively. Moreover, the transistors $Tr_4$ and $Tr_5$ correspond to specific examples of "a fourth transistor" and "a fifth transistor" in the disclosure, respectively. Further, the capacity elements $C_1$ and $C_2$ correspond to specific examples of "a first capacity element" and "a second capacity element" in the disclosure, respectively.

The transistors $Tr_1$ to $Tr_5$ are configured of thin-film transistors (TFTs) each having channels of same conduction type, for example, n-channel MOS (Metal Oxide Semiconductor) type thin-film transistors (TFTs). The transistor $Tr_1$ makes or breaks electrical connection between the output terminal OUT and a low-voltage line $L_L$ in response to, for example, a potential difference $V_{gs1}$ between a voltage (an input voltage $V_{in}$) of the input terminal IN and a voltage $V_L$ of the low-voltage line $L_L$ (or a potential difference corresponding thereto). A gate of the transistor $Tr_1$ is electrically connected to the input terminal IN, and one terminal of a source and a drain of the transistor $Tr_1$ is electrically connected to the low-voltage line $L_L$, and the other terminal not connected to the low-voltage line $L_L$ of the transistor $Tr_1$ is electrically connected to the output terminal OUT. The transistor $Tr_2$ makes or breaks electrical connection between a high-voltage line $L_{H1}$ and the output terminal OUT in response to a potential difference $V_{gs2}$ between a voltage $V_{s5}$ of one terminal (a first terminal X) which is not connected to a high-voltage line $L_{H2}$ of a source and a drain of the transistor $Tr_5$ and a voltage (an output voltage $V_{out}$) of the output terminal OUT (or a potential difference corresponding thereto). A gate of the transistor $Tr_2$ is electrically connected to the first terminal X of the transistor $Tr_5$. One terminal of a source and a drain of the transistor $Tr_2$ is electrically connected to the output terminal OUT, and the other terminal not connected to the output terminal OUT of the transistor $Tr_2$ is electrically connected to a high-voltage line $L_H'$.

The transistor $Tr_3$ makes or breaks electrical connection between a gate of the transistor $Tr_5$ and the low-voltage line $L_L$ in response to a potential difference $V_{gs3}$ between the input voltage $V_{in}$ and the voltage $V_L$ of the low-voltage line $L_L$ (or a potential difference corresponding thereto). A gate of the transistor $Tr_3$ is electrically connected to the input terminal IN. One terminal of a source and a drain of the transistor $Tr_3$ is electrically connected to the low-voltage line $L_L$, and the other terminal not connected to the low-voltage line $L_L$ of the transistor $Tr_3$ is electrically connected to the gate of the transistor $Tr_5$. The transistor Tr4 makes or breaks electrical connection between the first terminal X of the transistor $Tr_5$ and the low-voltage line $L_L$ in response to a potential different $V_{gs4}$ between the input voltage $V_{in}$ and the voltage $V_L$ of the low-voltage line $L_L$ (or a potential difference corresponding thereto). A gate of the transistor $Tr_4$ is electrically connected to the input terminal IN. One terminal of a source and a drain of the transistor $Tr_4$ is electrically connected to the low-voltage line $L_L$, and the other terminal not connected to the low-voltage line $L_L$ of the transistor $Tr_4$ is electrically connected to the first terminal X of the transistor $Tr_5$. In other words, the transistors $Tr_1$, $Tr_3$ and $Tr_4$ are connected to the same voltage line (the low-voltage line $L_L$). Therefore, a terminal on a side close to the low-voltage line $L_L$ of the transistor $Tr_1$, a terminal on a side close to the low-voltage line $L_L$ of the transistor $Tr_3$ and a terminal on a side close to the low-voltage line $L_L$ of the transistor $Tr_4$ have the same potential. The transistor $Tr_5$ makes and breaks electrical connection between a high-voltage line $L_{H2}$ and the first terminal X in response to a voltage $V_{gs5}$ between terminals of the capacity element $C_1$ (or a potential difference corresponding thereto). The gate of the transistor $Tr_5$ is electrically connected to the terminal not connected to the low-voltage line $L_L$ of the source and the drain of the transistor $Tr_3$. One terminal of the source and the drain of the transistor $Tr_5$ is electrically connected to the high-voltage line $L_{H2}$. The other terminal not connected to the high-voltage line $L_{H2}$ of the transistor $Tr_5$ is connected to the gate of the transistor $Tr_2$ and the terminal not connected to the low-voltage line $L_L$ of the source and the drain of the transistor $Tr_4$.

The low-voltage line $L_L$ corresponds to a specific example of "a first voltage line", "a third voltage line" and "a fourth voltage line" in the disclosure. The high-voltage line $L_{H1}$ and the high-voltage line $L_{H2}$ correspond to specific examples of "a second voltage line" and "a fifth voltage line" in the disclosure, respectively.

The high-voltage lines $L_{H1}$ and $L_{H2}$ are connected to a power supply (not illustrated) outputting a higher voltage (a constant voltage) than the voltage $V_L$ of the low-voltage line $L_L$. A voltage $V_{H1}$ of the high-voltage line $L_{H1}$ is at a voltage $V_{dd1}$ during the drive of the inverter circuit 1, and a voltage $V_{H2}$ of the high-voltage line $L_{H2}$ is at a voltage $V_{dd2}$ ($\geq V_{dd1} - V_{dd2}$) during the drive of the inverter circuit 1. Note that $V_{th2}$ is a threshold voltage of the transistor $Tr_2$. On the other hand, the low-voltage line $L_L$ is connected to a power supply (not illustrated) outputting a lower voltage (a constant voltage) than the voltage $V_{H1}$ of the high-voltage line $L_{H1}$, and the voltage $V_L$ of the low-voltage line $L_L$ is at a voltage $V_{ss}$ ($<V_{dd1}$) during the drive of the inverter circuit 1.

The capacity elements $C_1$ and $C_2$ are inserted in series between the input terminal IN and the gate of the transistor $Tr_2$. An electrical connection point B between the capacity element $C_1$ and the capacity element $C_2$ is eclectically connected to the first terminal X of the transistor $Tr_5$. The capacity element $C_1$ is inserted on a side close to the gate of the transistor $Tr_5$, and the capacity element $C_2$ is inserted on a side close to the gate of the transistor $Tr_1$. The capacity of the capacity element $C_2$ is larger than that of the capacity element $C_1$. Both of the capacities of the capacity elements $C_1$ and $C_2$ preferably satisfy the following expression (1). If the capacities of the capacity elements $C_1$ and $C_2$ satisfy the expression (1), at a falling edge of an input voltage $V_{in}$ which will be described later, a gate-source voltage of the transistor $Tr_5$ is allowed to reach a threshold voltage $V_{th5}$ or over of the transistor $Tr_5$, and the transistor $Tr_5$ is allowed to be turned on. As a result, the output voltage $V_{out}$ is allowed to be switched from low to high.

$$C_2(V_{dd}-V_{ss})/(C_1+C_2)>V_{th5} \tag{1}$$

The inverter circuit 1 corresponds to an inverter circuit (an inverter circuit 200 in FIG. 72) in related art further including a control element 10 and the transistors $Tr_1$ to $Tr_5$ which are inserted between the transistors $T_{r1}$ and $T_{r2}$ in an output stage and the input terminal IN. In this case, for example, as illustrated in FIG. 18, the control element 10 includes a terminal $P_1$ electrically connected to the input terminal IN, a terminal $P_2$ electrically connected to the first terminal X of the transistor $Tr_5$, and a terminal $P_3$ electrically connected to the gate of the transistor $Tr_5$. Moreover, for example, as illustrated in FIG. 18, the control element 10 includes the capacity elements $C_1$ and $C_2$.

The terminals $P_1$, $P_2$ and $P_3$ correspond to specific examples of "a second terminal", "a third terminal" and "a fourth terminal" in the disclosure, respectively.

For example, when a falling-edge voltage is applied to the terminal $P_1$, the control element 10 allows a voltage transient of the second terminal $P_2$ to be slower than a voltage transient of the third terminal $P_3$. More specifically, when the falling-edge voltage is applied to the input terminal IN, the control element 10 allows a voltage transient of the source (the first terminal X) of the transistor $Tr_5$ to be slower than a voltage transient of the gate of the transistor $Tr_5$. Note that the operation of the control element 10 will be described with the following description of the operation of the inverter circuit 1.

Operation

Figure 20:
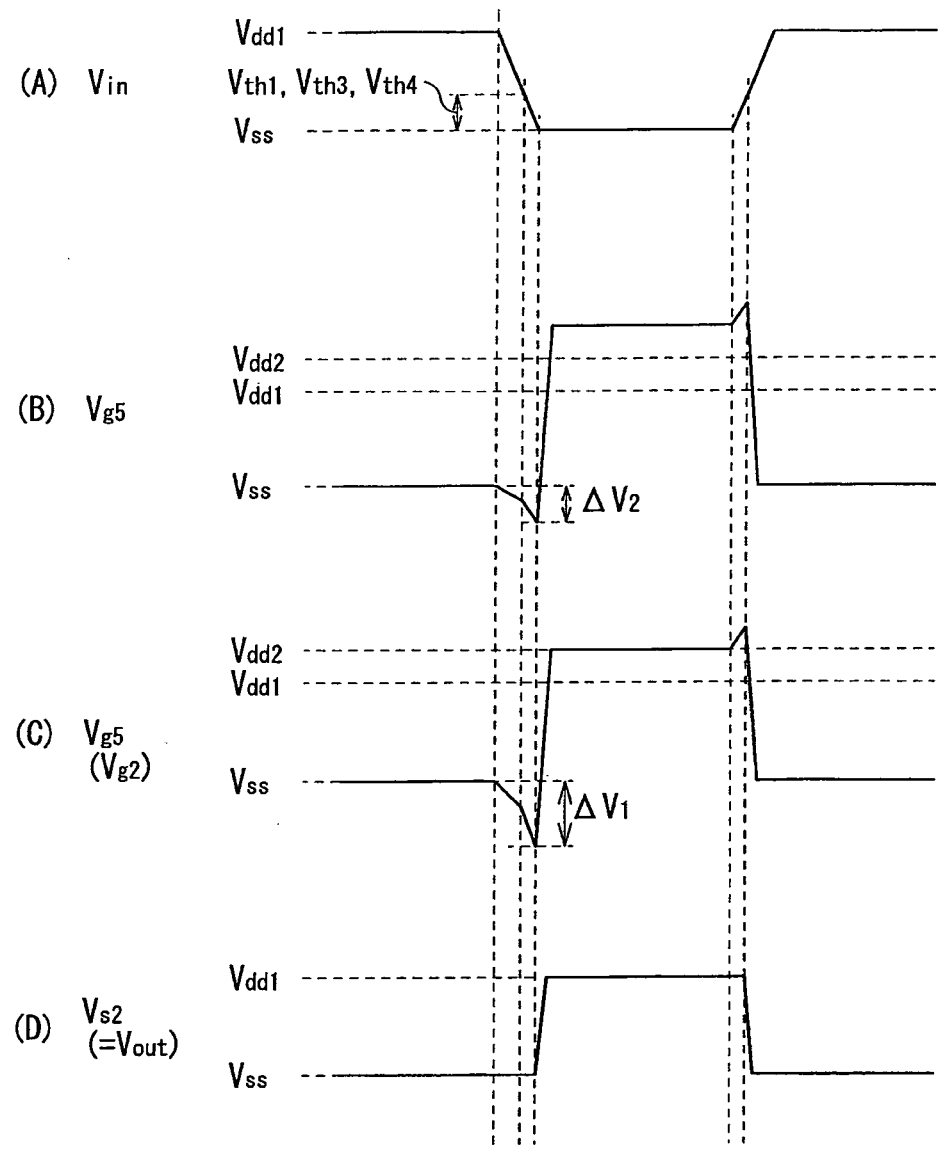
FIG. 20 is a waveform chart illustrating an example of an operation of the inverter circuit in FIG. 18.
Figure 21:
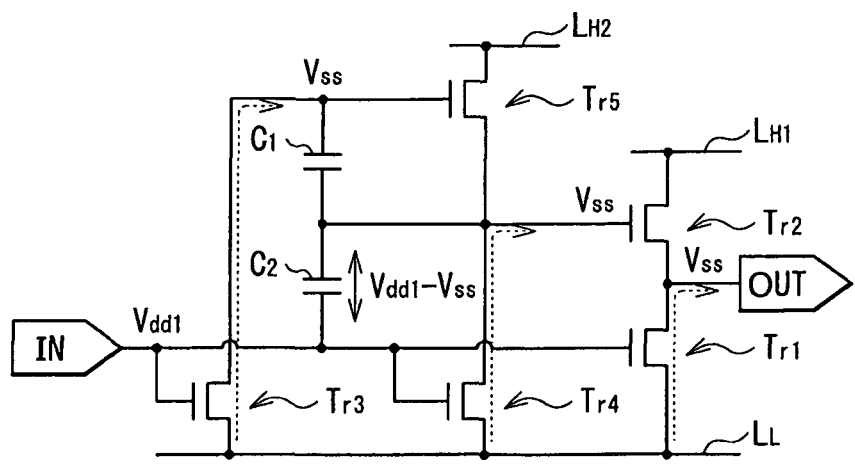
FIG. 21 is a circuit diagram for describing an example of an operation of the inverter circuit in FIG. 18.

Next, an example of the operation of the inverter circuit 1 will be described below referring to FIGS. 20 to 39. FIG. 20 is a waveform chart illustrating an example of the operation of the inverter circuit 1. FIGS. 21 to 26 are circuit diagrams sequentially illustrating an example of the operation of the inverter circuit 1.

First, when the input voltage $V_1$ is high ($V_{dd1}$), the transistors $Tr_1$, $Tr_3$ and $Tr_4$ are turned on. Then, the gate voltage $V_{g2}$ and the source voltage $V_{s2}$ of the transistor $Tr_2$ are charged to a voltage $V_L$ (=$V_{ss}$) of the low-voltage line $L_L$, and the gate voltage $V_{g5}$ and the source voltage $V_{s5}$ of the transistor $Tr_5$ are charged to the voltage $V_L$ (=$V_{ss}$) of the low-voltage line $L_L$ (refer to FIGS. 20 and 21). Therefore, the transistor $Tr_2$ is turned off (in the case where the transistor $Tr_2$ is turned off at a voltage $V_{gs2}$=0 V), and the transistor $Tr_5$ is turned off (in the case where the transistor $Tr_5$ is turned off at a voltage $V_{gs5}$=0 V), and the voltage $V_{ss}$ is taken out as the output voltage $V_{out}$. At this time, the capacity element $C_2$ is charged to a voltage of $V_{dd2}-V_{ss}$.

Figure 22:
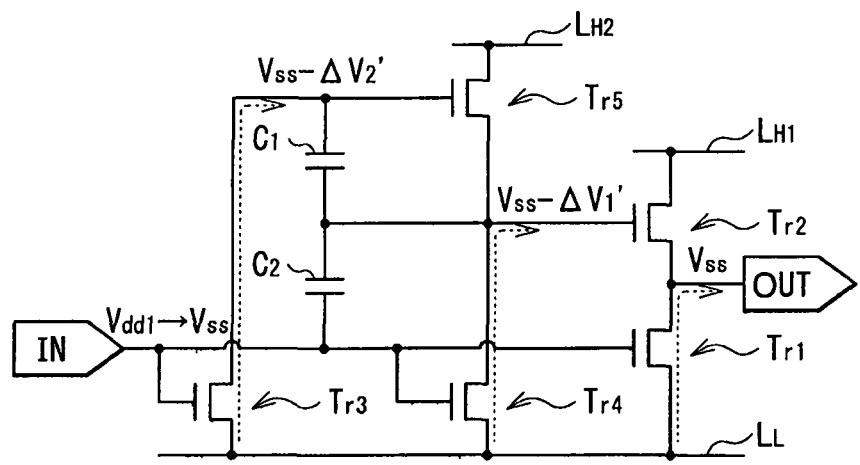
FIG. 22 is a circuit diagram for describing an example of an operation following FIG. 21.

Next, when the input voltage $V_{in}$ is switched (reduced) from high ($V_{dd1}$) to low ($V_{ss}$), gate voltages $V_{g1}$, $V_{g3}$ and $V_{g4}$ of the transistors $Tr_1$, $Tr_3$ and $Tr_4$ are switched (reduced) from the voltage $V_{dd1}$ to the voltage $V_{ss}$ (refer to FIGS. 20 and 22). Therefore, a change in the gate voltage $V_{g1}$ of the transistor $Tr_1$ propagates to the gate of the transistor $Tr_2$ through the capacity element $C_2$ to change (reduce) the gate voltage $V_{g2}$ of the transistor $Tr_2$ by $\Delta V1'$. Moreover, the change in the gate voltage $V_{g1}$ of the transistor $Tr_1$ propagates to the gate of the transistor $Tr_5$ through the capacity elements $C_1$ and $C_2$ to change (reduce) the gate voltage $V_{g5}$ of the transistor $Tr_5$ by $\Delta V2'$. However, at this time, the transistors $Tr_3$ and $Tr_4$ are on. Therefore, a current flows from the low-voltage line $L_L$ to the source and the gate of the transistor $Tr_5$ so as to charge the source and the gate of the transistor $Tr_5$ to the voltage $V_{ss}$.

In this case, as the gate voltages of the transistors $Tr_3$ and $Tr_4$ are switched (reduced) from the voltage $V_{dd1}$ to the voltage $V_{ss}$, on-resistances of the transistors $Tr_3$ and $Tr_4$ are gradually increased to increase time necessary to charge the source and the gate of the transistor $Tr_5$ to the voltage $V_L$ of the low-voltage line $L_L$.

Moreover, when full capacity at the source of the transistor $Tr_5$ and full capacity at the gate of the transistor $Tr_5$ are compared to each other, the capacity elements $C_1$ and $C_2$ are connected in parallel to the source of the transistor $Tr_5$, and the capacity elements $C_1$ and $C_2$ are connected in series to the gate of the transistor $Tr_5$. Therefore, the voltage transient of the source of the transistor $Tr_5$ is slower than that of the gate of the transistor $Tr_5$. As a result, time necessary to charge the source of the transistor $Tr_5$ to the voltage $V_L$ of the low-voltage line $L_L$ is longer than time necessary to charge the gate of the transistor $Tr_5$ to the voltage $V_L$ of the low-voltage line $L_L$.

Moreover, in the case where the input voltage $V_{in}$ is at a voltage $V_{ss}+V_{th3}$ or over, and further at a voltage $V_{ss}+V_{th4}$ or over, the transistors $Tr_3$ and $Tr_4$ operate in a linear region. Note that $V_{th3}$ is a threshold voltage of the transistor $Tr_3$, and $V_{th4}$ is a threshold voltage of the transistor $Tr_4$. On the other hand, in the case where the input voltage $V_{in}$ is smaller than the voltage $V_{ss}+V_{th3}$, and further smaller than the voltage $V_{ss}+V_{th4}$, the transistors $Tr_3$ and $Tr_4$ operate in a saturation region. Therefore, although the current illustrated in FIG. 22 flows through the source and the gate of the transistor $Tr_5$, each of the terminals of the transistors $Tr_3$ and $Tr_4$ is not allowed to be charged to the voltage $V_{ss}$.

Figure 23:
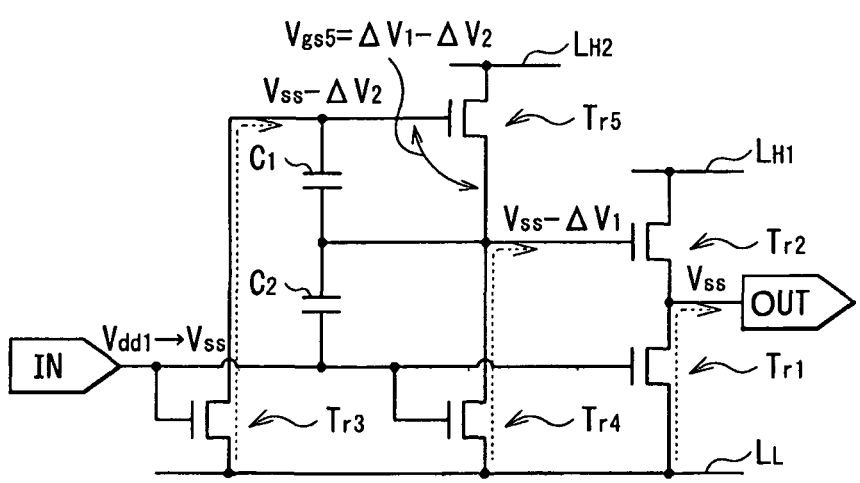
FIG. 23 is a circuit diagram for describing an example of an operation following FIG. 22.

When the input voltage $V_{in}$ is switched from the voltage $V_{dd1}$ to the voltage $V_{ss}$, ultimately, the gate-source voltage $V_{gs5}$ of the transistor $Tr_5$ is changed to a voltage $\Delta V_1 - \Delta V_2$ (refer to FIGS. 20 and 23). At this time, when the gate-source voltage $V_{gs5}$ of the transistor $Tr_5$ exceeds the threshold voltage $V_{th5}$ of the transistor $Tr_5$, the transistor $Tr_5$ is turned on, and the current starts to flow from the high-voltage line $L_{H2}$.

When the transistor $Tr_5$ is on, the source voltage $V_{s5}$ of the transistor $Tr_5$ is increased by the transistor $Tr_5$ in addition to the transistor $Tr_4$. Moreover, as the capacity element $C_1$ is connected between the gate and the source of the transistor $Tr_5$, a bootstrap is caused, and the gate voltage $V_{g5}$ of the transistor $Tr_5$ is increased with an increase in the source voltage $V_{s5}$ of the transistor $Tr_5$. After that, when the source voltage $V_{s5}$ and the gate voltage $V_{g5}$ of the transistor $Tr_5$ reach the voltage $V_{ss}-V_{th3}$ or over, further the voltage $V_{ss}-V_{th4}$ or over, the transistors $Tr_3$ and $Tr_4$ are turned off, and the source voltage $V_{s5}$ and the gate voltage $V_{g5}$ of the transistor $Tr_5$ are increased only by the transistor $Tr_5$.

After a lapse of a certain period, when the source voltage $V_{s5}$ of the transistor $Tr_5$ (the gate voltage $V_{g2}$ of the transistor $Tr_2$) reaches a voltage $V_{ss}+V_{th2}$ or over, the transistor $Tr_2$ is turned on, and a current starts to flow from the high-voltage line $L_{H1}$ (refer to FIGS. 20 and 24). Note that $V_{th2}$ is a threshold voltage of the transistor $Tr_2$. As a result, the voltage $V_{out}$ of the output terminal OUT is gradually increased from the voltage $V_{ss}$. Ultimately, the gate voltage $V_{g2}$ of the transistor $Tr_2$ is increased to the voltage $V_{H2}$ of the high-voltage line $L_{H2}$ by the current from the transistor $Tr_5$ (refer to FIGS. 20 and 25). In this case, the voltage $V_{H2}$ of the high-voltage line $L_{H2}$ is at a voltage $V_{dd2}$ which is larger than a voltage $V_{dd1}+V_{th2}$ during the drive of the inverter circuit 1, so the transistor $Tr_2$ outputs the voltage $V_{dd1}$ which is the voltage $V_{H1}$ of the high-voltage line $L_{H1}$ to the output terminal OUT. As a result, the output terminal OUT outputs the voltage $V_{dd1}$ (refer to FIGS. 20 and 25).

After a lapse of another certain period, the input voltage $V_{in}$ is switched (increased) from low ($V_{ss}$) to high ($V_{dd1}$) (refer to FIGS. 20 and 26). At this time, in a stage where the input voltage $V_{in}$ is lower than the voltage $V_{ss}+V_{th3}$, and further lower than the voltage $V_{ss}+V_{th4}$, the transistors $Tr_3$ and $Tr_4$ are off. Therefore, coupling through the capacity elements $C_1$ and $C_2$ is applied to the source and the gate of the transistor $Tr_5$ to increase the source voltage $V_{s5}$ and the gate voltage $V_{g5}$ of the transistor $Tr_5$. After that, when the input voltage $V_{in}$ reaches voltages $V_{ss}+V_{th1}$, $V_{ss}-V_{th3}$ and $V_{ss}+V_{th4}$ or over, the transistors $Tr_1$, $Tr_3$ and $Tr_4$ are turned on. Therefore, a current flows toward the source (the output terminal OUT) of the transistor $Tr_2$ and the source and the gate of the transistor $Tr_5$ so as to charge the source (the output terminal OUT) of the transistor $Tr_2$ and the source and the gate of the transistor $Tr_5$ to the voltage $V_{ss}$.

In this case, as the gate voltages $V_{g1}$, $V_{g3}$ and $V_{g4}$ of the transistors $Tr_1$, $Tr_3$ and $Tr_4$ are switched (increased) from the voltage $V_{ss}$ to the voltage $V_{dd1}$, on-resistances of the transistors $Tr_1$, $Tr_3$ and $Tr_4$ are gradually reduced to relatively reduce time necessary to charge the sources and the gates of the transistors $Tr_2$ and $Tr_5$ to the voltage $V_L$ of the low-voltage line $L_L$. Ultimately, the source voltage $V_{s2}$ of the transistor $Tr_2$ and the source voltage $V_{s5}$ and the gate voltage $V_{g5}$ of the transistor $Tr_5$ reach the voltage $V_{ss}$, and the output terminal outputs the voltage $V_{ss}$ (refer to FIGS. 20 and 21).

Figure 19:
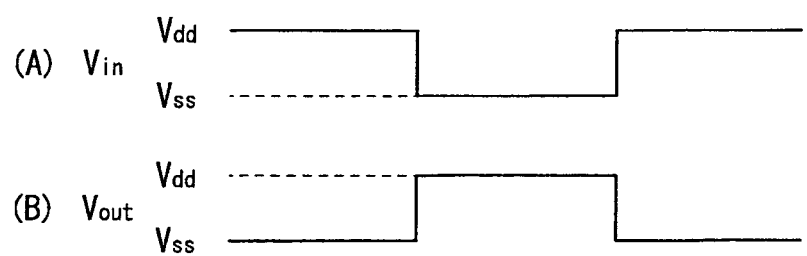
FIG. 19 is a waveform chart illustrating an example of input/output signal waveforms of the inverter circuit in FIG. 18.

As described above, the inverter circuit 1 according to the third embodiment outputs, from the output terminal OUT, a pulse signal (for example, refer to the part (B) in FIG. 19) with a substantially inverted signal waveform of a signal waveform (for example, refer to the part (A) in FIG. 19) of a pulse signal applied to the input terminal IN.

Effects

The inverter circuit 200 in related art illustrated in FIG. 72 has, for example, a single channel type circuit configuration in which two n-channel MOS type transistors $Tr_1$ and $Tr_2$ are connected to each other in series. In the inverter circuit 200, for example, as illustrated in FIG. 73, when the input voltage $V_{in}$ is at the voltage $V_{ss}$, the output voltage $V_{out}$ is not at the voltage $V_{dd}$ but at a voltage $V_{dd}-V_{th2}$. In other words, the output voltage $V_{out}$ includes the threshold voltage $V_{th2}$ of the transistor $Tr_2$, and the output voltage $V_{out}$ is greatly affected by variations in the threshold voltage $V_{th2}$ of the transistor $Tr_2$.

Therefore, it is considered that, for example, as illustrated in an inverter circuit 300 in FIG. 74, the gate and the drain of the transistor $Tr_2$ are electrically separated from each other, and the gate is connected to the high-voltage wiring line $L_{H2}$ to which a higher voltage $V_{dd2}$ ($\geq V_{dd}+V_{th2}$) than the voltage $V_{dd}$ of the drain is applied. Moreover, for example, a bootstrap type circuit configuration represented by an inverter circuit 400 in FIG. 75 is considered.

However, in any of the circuits in FIGS. 72, 74 and 75, even in the case where the input voltage $V_{in}$ is high, that is, even in the case where the output voltage $V_{out}$ is low, a current (a through current) flows from the high-voltage wiring line $L_H$ to the low-voltage wiring line $L_L$ through the transistors $Tr_1$ and $Tr_2$. As a result, power consumption in the inverter circuits is increased. Moreover, in the circuits in FIGS. 72, 74 and 75, for example, as illustrated in a point encircled by a broken line in a part (B) in FIG. 73, when the input voltage $V_{in}$ is at the voltage $V_{dd}$, the output voltage $V_{out}$ is not at the voltage $V_{ss}$, and a peak value of the output voltage $V_{out}$ varies. Therefore, for example, in the case where the inverter circuits are used in a scanner in an active matrix organic EL display, threshold correction or mobility correction in a driving transistor varies from one pixel circuit to another, thereby causing variations in luminance.

On the other hand, in the inverter circuit 1 according to the third embodiment, the transistors $Tr_1$, $Tr_3$ and $Tr_4$ performing an ON/OFF operation in response to a potential difference between the input voltage $V_{in}$ and the voltage $V_L$ of the low-voltage line $L_L$ are arranged between the gate of the transistor $Tr_5$ and the low-voltage line $L_L$, between the source of the transistor $Tr_5$ and the low-voltage line $L_L$, and between the source of the transistor $Tr_2$ and the low-voltage line $L_L$. Therefore, when the gate voltages of the transistors $Tr_1$, $Tr_3$ and $Tr_4$ are switched (reduced) from high ($V_{dd1}$) to low ($V_{ss}$), on-resistances of the transistors $Tr_1$, $Tr_3$ and $Tr_4$ are gradually increased to increase time necessary to charge the gates and the sources of the transistors $Tr_2$ and $Tr_5$ to the voltage $V_L$ of the low-voltage line $L_L$. Moreover, when the gate voltages of the transistors $Tr_1$, $Tr_3$ and $Tr_4$ are switched (increased) from low ($V_{ss}$) to high ($V_{dd1}$), the on-resistances of the transistors $Tr_1$, $Tr_3$ and $Tr_4$ are gradually reduced to reduce time necessary to charge the gates and the sources of the transistors $Tr_2$ and $Tr_5$ to the voltage $V_L$ of the low-voltage line $L_L$. Further, in the inverter circuit 1 according to the third embodiment, the capacity elements $C_1$ and $C_2$ are connected in series to the gate of the transistor $Tr_5$, and are connected in parallel to the source of the transistor $Tr_5$. Therefore, the voltage transient of the source of the transistor $Tr_5$ is slower than that of the gate of the transistor $Tr_5$. As a result, when the gate voltages of the transistors $Tr_1$, $Tr_3$ and $Tr_4$ are switched (reduced) from high ($V_{dd1}$) to low ($V_{ss}$), the gate-source voltage $V_{gs5}$ of the transistor $Tr_5$ exceeds the threshold voltage $V_{th5}$ of the transistor $Tr_5$, and the transistor $Tr_5$ is turned on, and immediately after that, the transistors $Tr_1$, $Tr_3$ and $Tr_4$ are turned off. In other words, when the switched input voltage Vin is applied to the gate and the source of the transistor $Tr_5$ through the capacity elements $C_1$ and $C_2$, and the gate-source voltage $V_{gs5}$ exceeds the threshold voltage $V_{th5}$ by a transient difference, the transistors $Tr_2$ and $Tr_5$ are turned on, and immediately after that, the transistors $Tr_1$, $Tr_3$ and $Tr_4$ are turned off. At this time, output voltage $V_{out}$ is changed to a voltage of the high-voltage line $L_{H1}$. Moreover, when the gate voltages of the transistors $Tr_1$, $Tr_3$ and $Tr_4$ are switched (increased) from low ($V_{ss}$) to high ($V_{dd1}$), the transistors $Tr_1$, $Tr_3$ and $Tr_4$ are turned on, and immediately after that, the transistors $Tr_2$ and $Tr_5$ are turned off. At this time, the output voltage $V_{out}$ is changed to a voltage of the low-voltage line $L_L$.

Thus, in the inverter circuit 1 according to the third embodiment, a period where the transistor $Tr_1$ and the transistor $Tr_2$ are simultaneously turned on or a period where the transistor $Tr_4$ and the transistor $Tr_5$ are simultaneously turned on is almost eliminated. Therefore, a current (a through current) hardly flows between the high-voltage line $L_{H1}$ and the low-voltage line $L_L$ through the transistors $Tr_1$ and $Tr_2$ and between the high-voltage line $L_{H2}$ and the low-voltage line $L_L$ through the transistors $Tr_4$ and $Tr_5$. As a result, power consumption is allowed to be reduced. Moreover, when the gate voltages of the transistors $Tr_1$, $Tr_3$ and $Tr_4$ are switched (reduced) from high ($V_{dd1}$) to low ($V_{ss}$), the output voltage $V_{out}$ is changed to the voltage of the high-voltage line $L_{H1}$, and when the gate voltages of the transistors $Tr_1$, $Tr_3$ and $Tr_4$ are switched (increased) from low ($V_{ss}$) to high ($V_{dd1}$), the output voltage $V_{out}$ is changed to the voltage of the low-voltage line $L_L$. Therefore, variations in the output voltage $V_{out}$ are allowed to be eliminated. As a result, for example, variations in threshold correction or mobility correction in the driving transistor from one pixel circuit to another are allowed to be reduced, and variations in luminance from one pixel to another are allowed to be reduced.

Fourth Embodiment

Configuration

Figure 27:
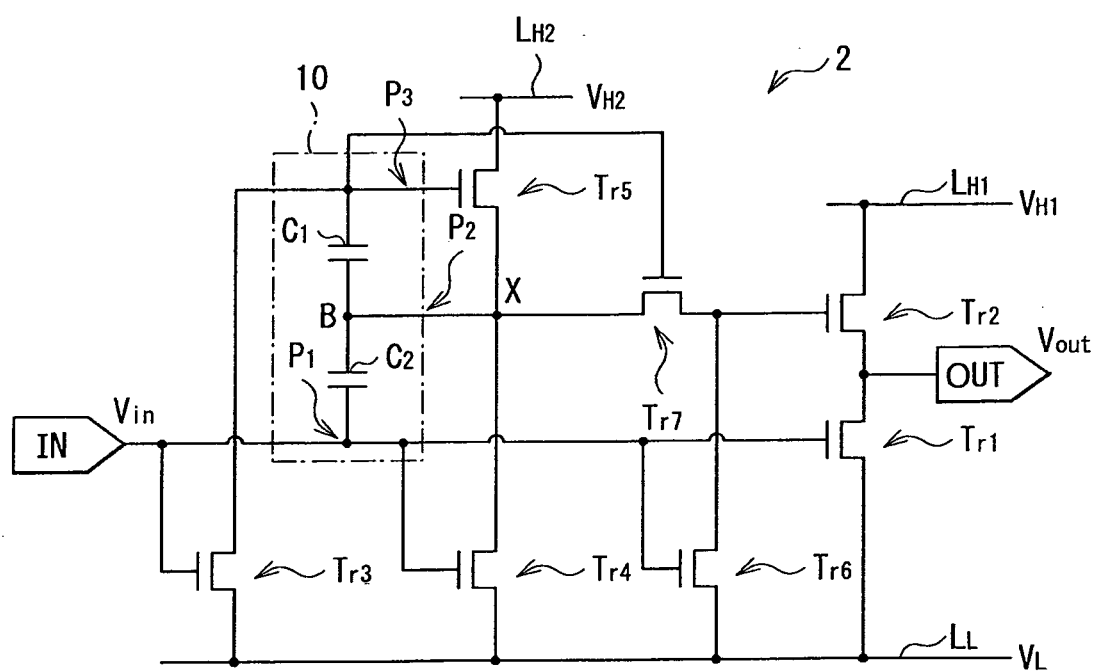
FIG. 27 is a circuit diagram illustrating an example of an inverter circuit according to a fourth embodiment of the disclosure.

FIG. 27 illustrates an example of a whole configuration of an inverter circuit 2 according to a fourth embodiment of the disclosure. As in the case of the inverter circuit 1 according to the third embodiment, the inverter circuit 2 outputs, from the output terminal OUT, a pulse signal (for example, refer to the part (B) in FIG. 19) with a substantially inverted signal waveform of a signal waveform (for example, refer to the part (A) in FIG. 19) of a pulse signal applied to the input terminal IN. The configuration of the inverter circuit 2 differs from that of the inverter circuit 1 according to the third embodiment in further including transistors $Tr_6$ and $Tr_7$ preceding the transistors $Tr_1$ and $Tr_2$ in an output stage. Hereinafter, differences between the third and fourth embodiments will be mainly described, and similarities between the third and fourth embodiments will not be described.

The transistors $Tr_6$ and $Tr_7$ are configured of transistors each having channels of the same conduction type as that of the transistor $Tr_1$ or the like, for example, n-channel MOS type TFTs. The transistor $Tr_6$ makes or breaks electrical connection between the gate of the transistor $Tr_2$ and the low-voltage line $L_L$ in response to, for example, a potential difference $V_{gs6}$ between the voltage (the input voltage $V_{in}$) of the input terminal IN and the voltage $V_L$ of the low-voltage line $L_L$ (or a potential difference corresponding thereto). A gate of the transistor $Tr_6$ is electrically connected to the input terminal IN, and one terminal of a source and a drain of the transistor $Tr_6$ is electrically connected to the low-voltage line $L_L$, and the other terminal not connected to the low-voltage line $L_L$ of the transistor $Tr_6$ is electrically connected to the gate of the transistor $Tr_2$. The transistor $Tr_7$ makes or breaks electrical connection between the source (the first terminal X) of the transistor $Tr_5$ and the gate of the transistor $Tr_2$ in response to a potential difference $V_{gs7}$ between the gate voltage $V_{g5}$ of the transistor $Tr_5$ and the voltage $V_{s5}$ of the source (the first terminal X) of the transistor $Tr_5$ (or a potential difference corresponding thereto). A gate of the transistor $Tr_7$ is electrically connected to the gate of the transistor $Tr_5$. One terminal of a source and a drain of the transistor $Tr_7$ is electrically connected to the source (the first terminal X) of the transistor $Tr_5$, and the other terminal not connected to the first terminal X of the transistor. $Tr_7$ is electrically connected to the gate of the transistor $Tr_2$.

Operation

Figure 28:
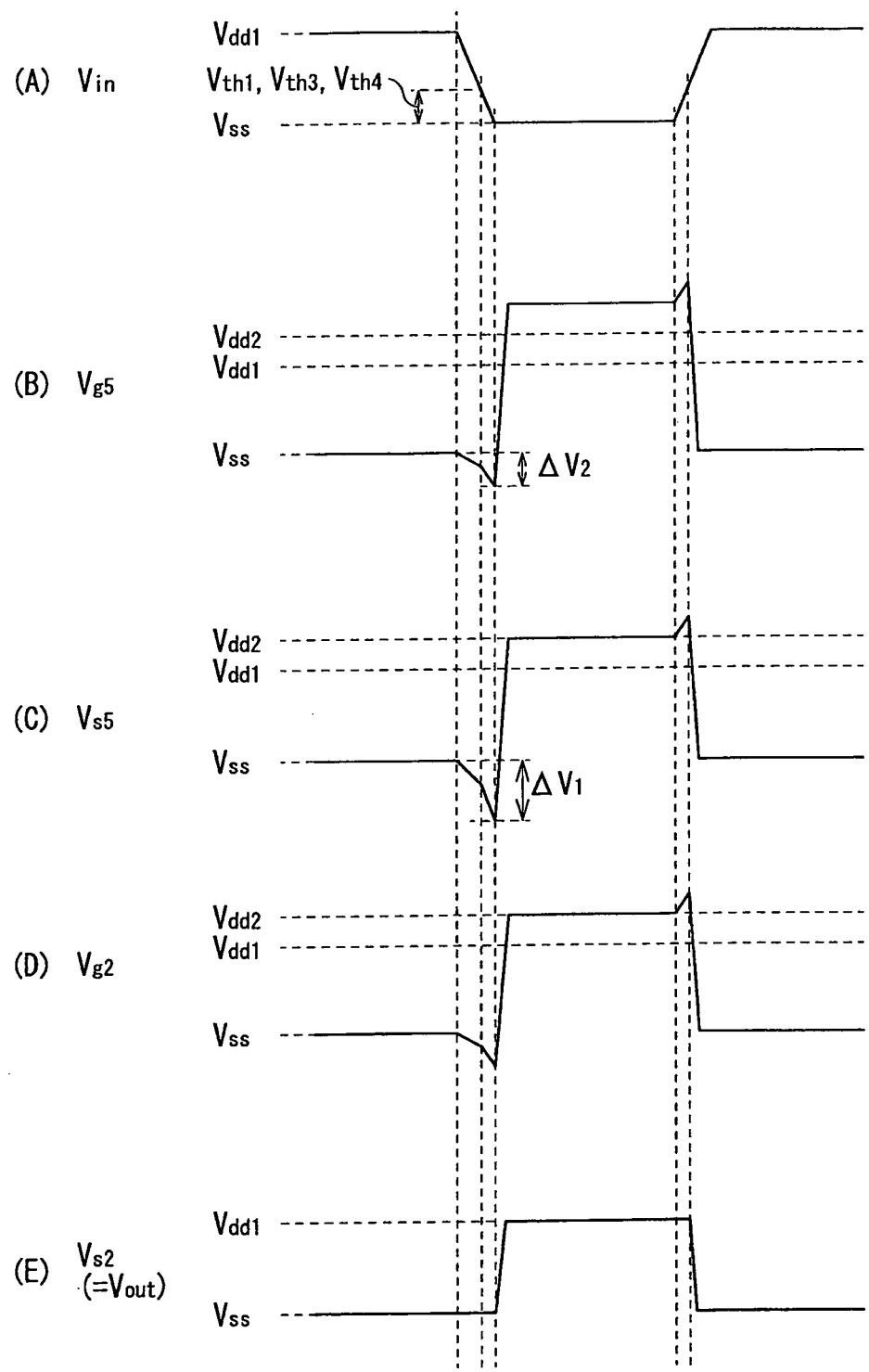
FIG. 28 is a waveform chart illustrating an example of an operation of the inverter circuit in FIG. 27.
Figure 29:
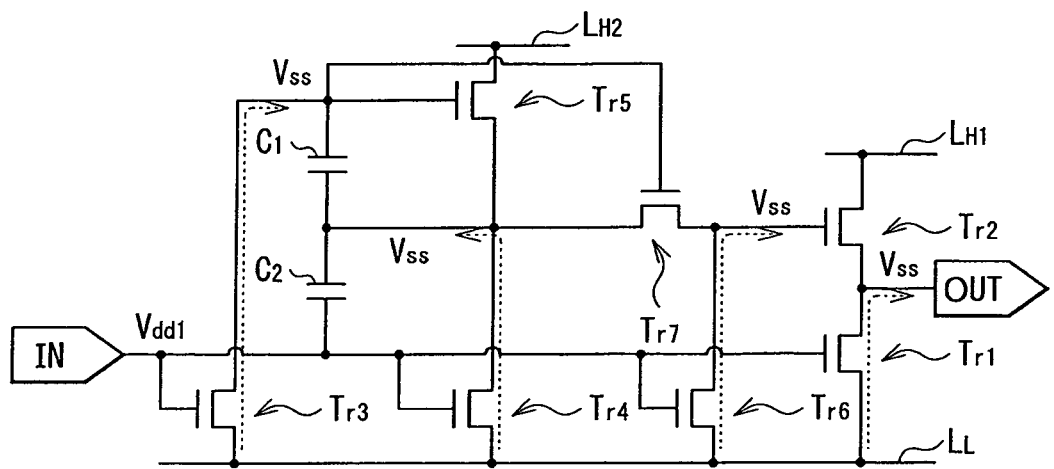
FIG. 29 is a circuit diagram for describing an example of an operation of the inverter circuit in FIG. 27.

Next, an example of the operation of the inverter circuit 2 will be described below referring to FIGS. 28 to 47. FIG. 28 is a waveform chart illustrating an example of the operation of the inverter circuit 2. FIGS. 29 to 34 are circuit diagrams sequentially illustrating an example of the operation of the inverter circuit 2.

First, when the input voltage $V_{in}$ is high ($V_{dd1}$), the transistors $Tr_1$, $Tr_3$, $Tr_4$ and $Tr_6$ are turned on. Then, the gate voltage $V_{g2}$ and the source voltage $V_{s2}$ of the transistor $Tr_2$ are charged to the voltage $V_L$ (=$V_{ss}$) of the low-voltage line $L_L$, and the gate voltage $V_{g5}$ and the source voltage $V_{s5}$ of the transistor $Tr_5$ are charged to the voltage $V_L$ (=$V_{ss}$) of the low-voltage line $L_L$ (refer to FIGS. 28 and 29). Therefore, the transistor $Tr_2$ is turned off (in the case where the transistor $Tr_2$ is turned off at a voltage $V_{gs2}$=0 V), and the transistor $Tr_5$ is turned off (in the case where the transistor $Tr_5$ is turned off at a voltage $V_{gs5}$=0 V), and then the voltage $V_{ss}$ is taken out as the output voltage $V_{out}$. At this time, the capacity element $C_2$ is charged to a voltage of $V_{dd2}$−$V_{ss}$.

Figure 30:
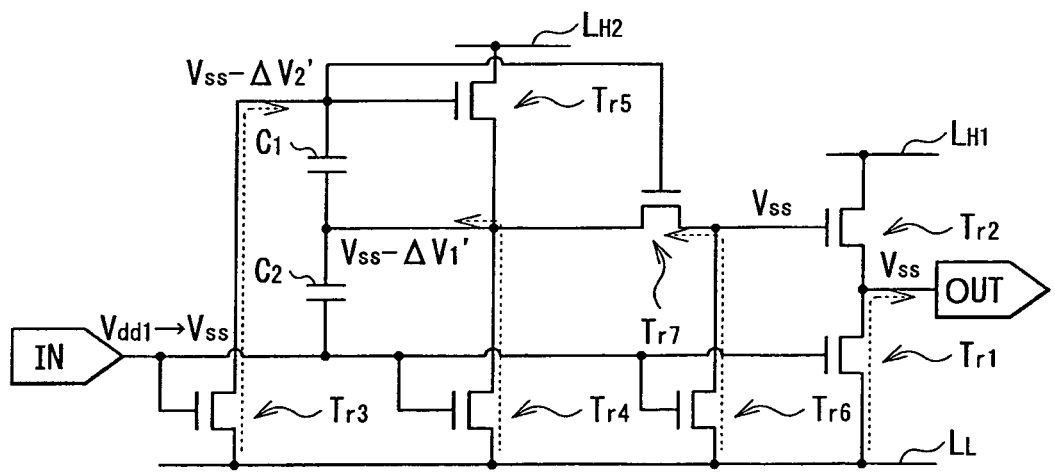
FIG. 30 is a circuit diagram for describing an example of an operation following FIG. 29.

Next, when the input voltage $V_{in}$ is switched (reduced) from high ($V_{dd1}$) to low ($V_{ss}$), gate voltages $V_{g1}$, $V_{g3}$, $V_{g4}$ and $V_{g6}$ of the transistors $Tr_1$, $Tr_3$, $Tr_4$ and $Tr_6$ are switched (reduced) from the voltage $V_{dd1}$ to the voltage $V_{ss}$ (refer to FIGS. 28 and 30). Therefore, a change in the gate voltage $V_{g1}$ of the transistor $Tr_1$ propagates to the source of the transistor $Tr_5$ through the capacity element $C_2$ to change (reduce) the source voltage $V_{s5}$ of the transistor $Tr_5$ by $\Delta V_1'$. Moreover, the change in the gate voltage $V_{g1}$ of the transistor $Tr_1$ also propagates to the gate of the transistor $Tr_5$ through the capacity elements $C_1$ and $C_2$ to change (reduce) the gate voltage $V_{g5}$ of the transistor $Tr_5$ by $\Delta V_2'$. However, at this time, the transistors $Tr_3$, $Tr_4$ and $Tr_6$ are on. Therefore, a current flows from the low-voltage line $L_L$ to the source and the gate of the transistor $Tr_5$ and the source and the drain of the transistor $Tr_7$ so as to charge the source and the gate of the transistor $Tr_5$ and the source and the drain of the transistor $Tr_7$ to the voltage $V_{ss}$.

In this case, as the gate voltages of the transistors $Tr_3$, Tr4 and $Tr_6$ are switched (reduced) from the voltage $V_{dd1}$ to the voltage $V_{ss}$, on-resistances of the transistors $Tr_3$, $Tr_4$ and $Tr_6$ are gradually increased to increase time necessary to charge the source and the gate of the transistor $Tr_5$ and the source and the drain of the transistor $Tr_1$ to the voltage $V_L$ of the low-voltage line $L_L$.

Moreover, when full capacity at the source of the transistor $Tr_5$ and full capacity at the gate of the transistor $Tr_5$ are compared to each other, the capacity elements $C_1$ and $C_2$ are connected in parallel to the source of the transistor $Tr_5$, and the capacity elements $C_1$ and $C_2$ are connected in series to the gate of the transistor $Tr_5$. Therefore, the voltage transient of the source of the transistor $Tr_5$ is slower than that of the gate of the transistor $Tr_5$. As a result, time necessary to charge the source of the transistor $Tr_5$ to the voltage $V_L$ of the low-voltage line $L_L$ is longer than time necessary to charge the gate of the transistor $Tr_5$ to the voltage $V_L$ of the low-voltage line $L_L$.

Moreover, in the case where the input voltage $V_{in}$ is at a voltage $V_{ss}$+$V_{th3}$ or over, and further at a voltage $V_{ss}$+$V_{th4}$ or over, the transistors $Tr_3$ and $Tr_4$ operate in a linear region. On the other hand, in the case where the input voltage $V_{in}$ is smaller than the voltage $V_{ss}$+$V_{th3}$, and further smaller than the voltage $V_{ss}$+$V_{th4}$, the transistors $Tr_3$ and $Tr_4$ operate in a saturation region. Therefore, although the current illustrated in FIG. 30 flows through the source and the gate of the transistor $Tr_5$, each of the terminals of the transistors $Tr_3$ and $Tr_4$ is not allowed to be charged to the voltage $V_{ss}$.

Figure 31:
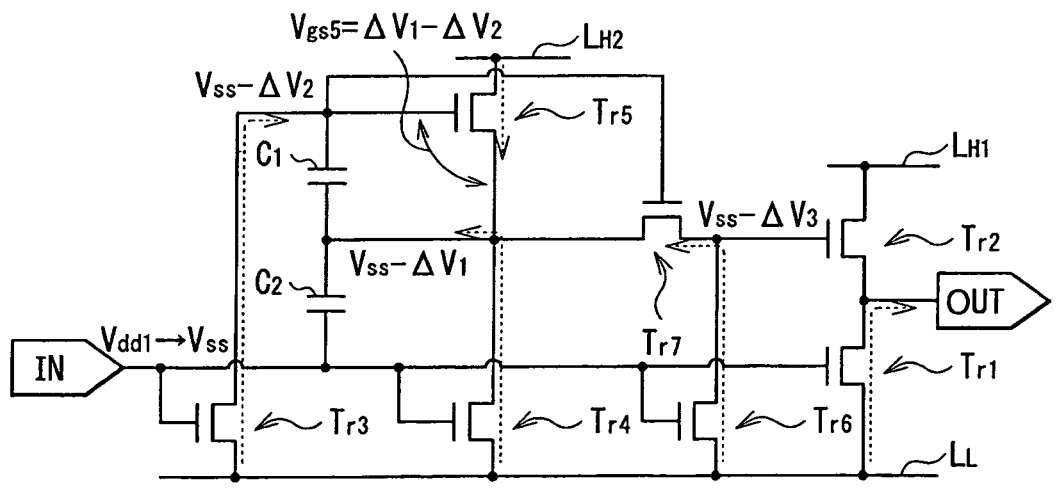
FIG. 31 is a circuit diagram for describing an example of an operation following FIG. 30.

When the input voltage $V_{in}$ is switched from the voltage $V_{dd1}$ to the voltage $V_{ss}$, ultimately, the gate-source voltage $V_{gs5}$ of the transistor $Tr_5$ is changed to a voltage $\Delta V_1$−$\Delta V_2$ (refer to FIGS. 28 and 31). At this time, when the gate-source voltage $V_{gs5}$ of the transistor $Tr_5$ exceeds the threshold voltage $V_{th5}$ of the transistor $Tr_5$, the transistor $Tr_5$ is turned on, and the current starts to flow from the high-voltage line $L_{H2}$. Moreover, at this time, when the gate voltage $V_{g2}$ of the transistor $Tr_2$ is at a voltage $V_{ss}$−$\Delta V_3$, and the transistor $Tr_7$ operates at a saturation region.

When the transistor $Tr_5$ is on, the source voltage $V_{s5}$ of the transistor $Tr_5$ is increased by the transistor $Tr_5$ in addition to the transistors $Tr_4$ and $TR_6$. Moreover, as the capacity element $C_1$ is connected between the gate and the source of the transistor $Tr_5$, a bootstrap is caused, and the gate voltage $V_{g5}$ of the transistor $Tr_5$ is increased with an increase in the source voltage $V_{s5}$ of the transistor $Tr_5$. After that, when the source voltage $V_{s5}$ and the gate voltage $V_{g5}$ of the transistor $Tr_5$ reach the voltage $V_{ss}$−$V_{th3}$ or over, further the voltage $V_{ss}$−$V_{th4}$ or over, the transistors $Tr_1$ and $Tr_4$ are turned off, and when the source voltage $V_{s5}$ of the transistor $Tr_5$ reaches a voltage $V_{ss}$−$V_{th6}$ or over, the transistor $Tr_6$ is turned off. As a result, the source voltage $V_{s5}$ and the gate voltage $V_{g5}$ of the transistor $Tr_5$ are increased by a current from the transistor $Tr_5$. Moreover, when the gate voltage $V_{g5}$ of the transistor $Tr_5$ is increased, the transistor $Tr_7$ is switched from the saturation region to the linear region to operate, and the source voltage $V_{s5}$ of the transistor $Tr_5$ and the gate voltage $V_{g2}$ of the transistor $Tr_2$ have the same potential.

Figure 32:
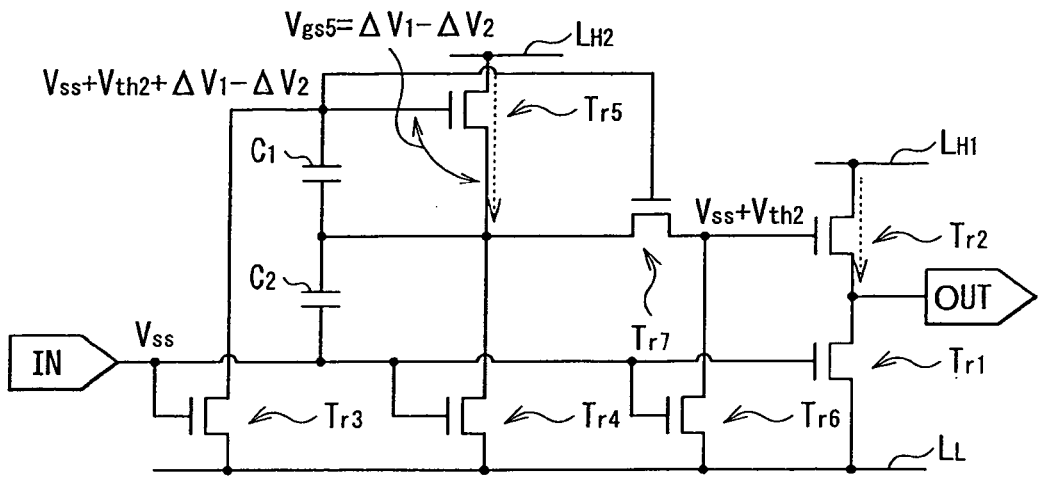
FIG. 32 is a circuit diagram for describing an example of an operation following FIG. 31.
Figure 33:
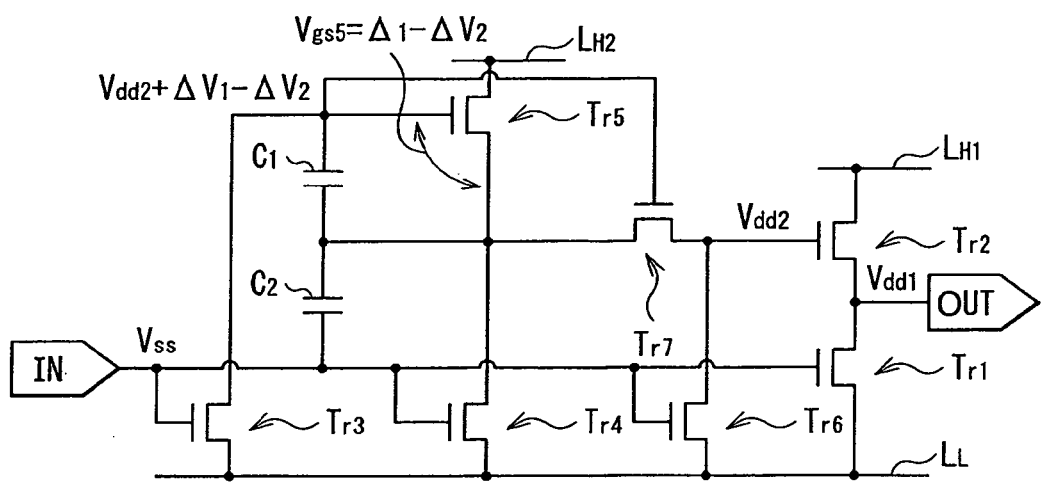
FIG. 33 is a circuit diagram for describing an example of an operation following FIG. 32.

After a lapse of a certain period, when the source voltage $V_{s5}$ of the transistor $Tr_5$ (the gate voltage $V_{g2}$ of the transistor $Tr_2$) reaches a voltage $V_{ss}$+$V_{th2}$ or over, the transistor $Tr_2$ is turned on, and a current starts to flow from the high-voltage line $L_{H1}$ (refer to FIGS. 28 and 32). As a result, the voltage $V_{out}$ of the output terminal OUT is gradually increased from the voltage $V_{ss}$. Ultimately, the gate voltage $V_{g2}$ of the transistor $Tr_2$ is increased to the voltage $V_{H2}$ of the high-voltage line $L_{H2}$ by the current from the transistor $Tr_5$ (refer to FIGS. 28 and 33). In this case, the voltage $V_{H2}$ of the high-voltage line $L_{H2}$ is at a voltage $V_{dd2}$ which is larger than a voltage $V_{dd1}$+$V_{th2}$ during the drive of the inverter circuit 2, so the transistor $Tr_2$ outputs the voltage $V_{dd1}$ which is the voltage $V_{H1}$ of the high-voltage line $L_{H1}$ to the output terminal OUT. As a result, the output terminal OUT outputs the voltage $V_{dd1}$ (refer to FIGS. 28 and 33).

Figure 34:
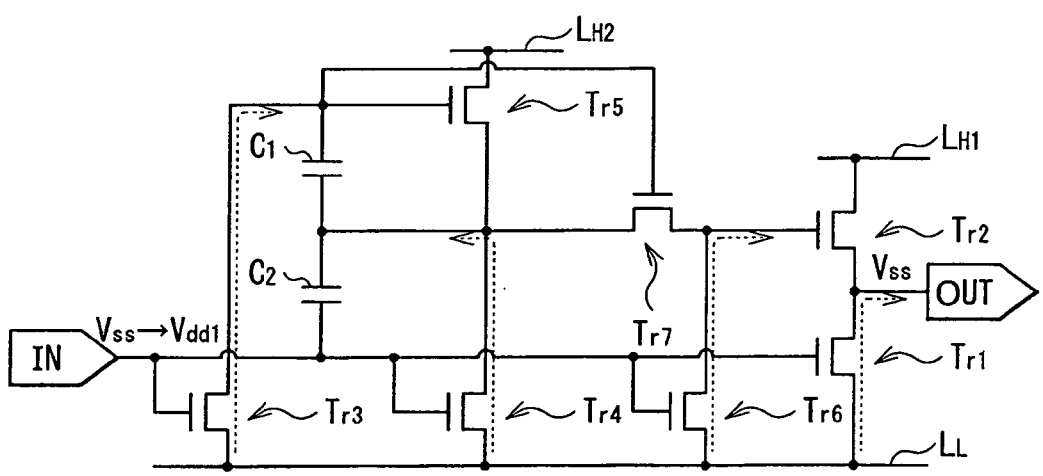
FIG. 34 is a circuit diagram for describing an example of an operation following FIG. 33.

After a lapse of another certain period, the input voltage $V_{in}$ is switched (increased) from low ($V_{ss}$) to high ($V_{dd1}$) (refer to FIGS. 28 and 34). At this time, in a stage where the input voltage $V_{in}$ is lower than the voltage $V_{SS}$+$V_{th3}$, and further lower than the voltage $V_{ss}$+$V_{th4}$, the transistors $Tr_3$ and $Tr_4$ are off. Therefore, coupling through the capacity elements $C_1$ and $C_2$ is applied to the source and the gate of the transistor $Tr_5$ to increase the source voltage $V_{s5}$ and the gate voltage $V_{g5}$ of the transistor $Tr_5$. After that, when the input voltage $V_{in}$ reaches voltages $V_{ss}$+$V_{th1}$, $V_{ss}$+$V_{th3}$, $V_{ss}$+$V_{th4}$ and $V_{ss}$+$V_{th6}$ or over, the transistors $Tr_1$, $Tr_3$, $Tr_4$ and $Tr_6$ are turned on. Therefore, a current flows toward the source (the output terminal OUT) of the transistor $Tr_2$ and the source and the gate of the transistor $Tr_5$ so as to charge the source (the output terminal OUT) of the transistor $Tr_2$ and the source and the gate of the transistor $Tr_5$ to a voltage $V_{ss}$.

In this case, the gate of the transistor $Tr_7$ is connected to the gate of the transistor $Tr_5$. As the capacity elements $C_1$ and $C_2$ are connected in series to the gate of the transistor $Tr_5$, the voltage transient of the gate of the transistor $Tr_5$ is fast. Accordingly, the voltage transient of the gate of the transistor $Tr_7$ is fast, and the transistor $Tr_7$ is turned off early. When the transistor $Tr_7$ is turned off, the gate of the transistor $Tr_2$ and the gate of the transistor $Tr_5$ are interrupted by each other. As a result, as illustrated in FIG. 34, the transistor $Tr_6$ charges the gate of the transistor $Tr_2$, and the transistor $Tr_4$ charges the source of the transistor $Tr_5$. Therefore, the voltage transient of the gate of the transistor $Tr_2$ is faster than the voltage transient of the source of the transistor $Tr_2$, and the voltage transient of the gate of the transistor $Tr_5$ is faster than the voltage transient of the source of the transistor $Tr_5$. As a result, at a rising edge of the input voltage $V_{in}$, a period where the transistors $Tr_1$ and Tr$_2$ are simultaneously on is allowed to be further reduced, and a current (a through current) flowing between the high-voltage line L$_{H1}$ and the low-voltage line L$_L$ and between the high-voltage line L$_{H2}$ and the low-voltage line L$_L$ is allowed to be further reduced.

Thus, in the inverter circuit 2 according to the fourth embodiment, a period where the transistor Tr$_1$ and the transistor Tr$_2$ are simultaneously turned on is almost eliminated. Therefore, as a current (a through current) hardly flows between the high-voltage line L$_{H1}$ and the low-voltage line L$_L$ and between the high-voltage line L$_{H2}$ and the low-voltage line L$_L$, power consumption is allowed to be reduced. Moreover, when the gate voltages of the transistors Tr$_1$ and Tr$_3$ are switched (reduced) from high (V$_{dd1}$) to low (V$_{ss}$), the output voltage V$_{out}$ is changed to the voltage of the high-voltage line L$_H$, and when the gate voltages of the transistors Tr$_1$ and Tr$_3$ are switched (increased) from low (V$_{ss}$) to high (V$_{dd1}$), the output voltage V$_{out}$ is changed to the voltage of the low-voltage line L$_L$. Therefore, variations in the output voltage V$_{out}$ are allowed to be eliminated. As a result, for example, variations in threshold correction or mobility correction in the driving transistor from one pixel circuit to another are allowed to be reduced, and variations in luminance from one pixel to another are allowed to be reduced.

Modifications of Third and Fourth Embodiments

Figure 35:
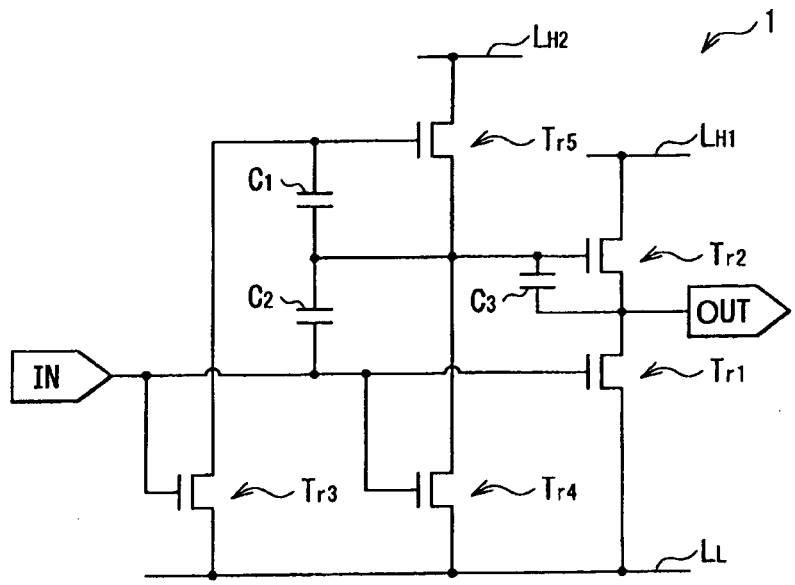
FIG. 35 is a circuit diagram illustrating a modification of the inverter circuit in FIG. 27.
Figure 36:
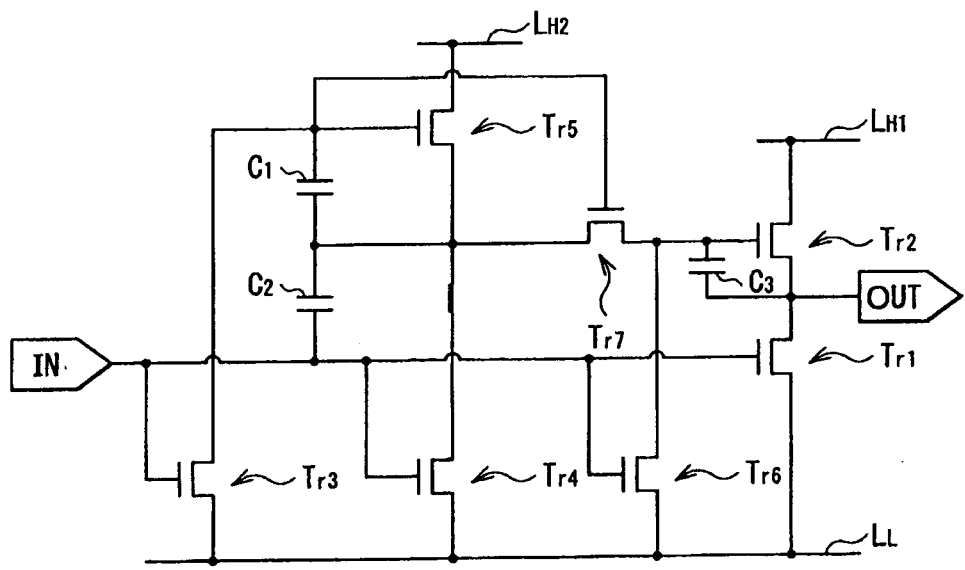
FIG. 36 is a circuit diagram illustrating another modification of the inverter circuit in FIG. 27.

In the third and fourth embodiments, as illustrated in FIGS. 35 and 36, a capacity element C3 for bootstrap may be arranged between the gate of the transistor Tr$_2$ and the source (the output terminal OUT) of the transistor Tr$_2$.

Figure 37:
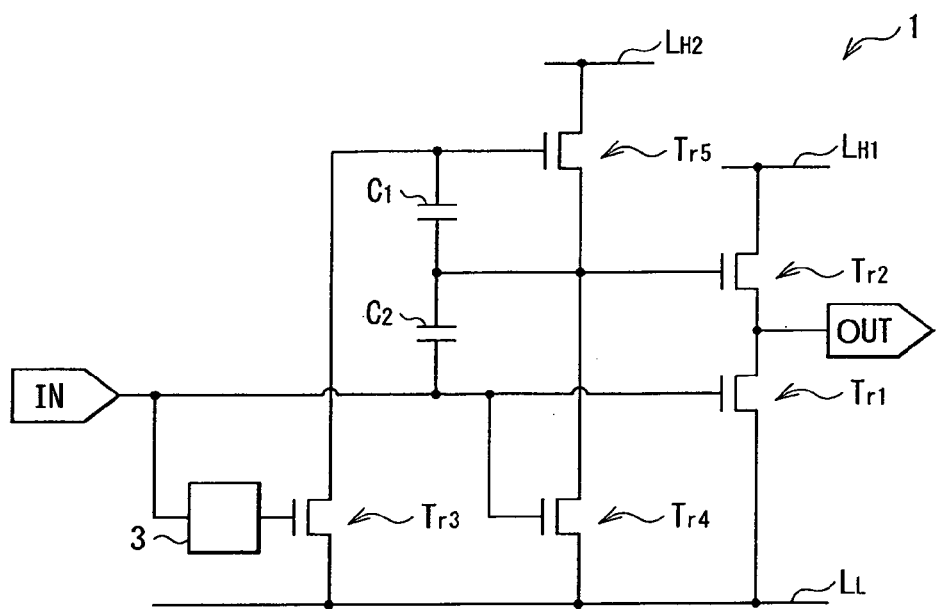
FIG. 37 is a circuit diagram illustrating an example of the inverter circuit in FIG. 18 including a delay element.
Figure 38:
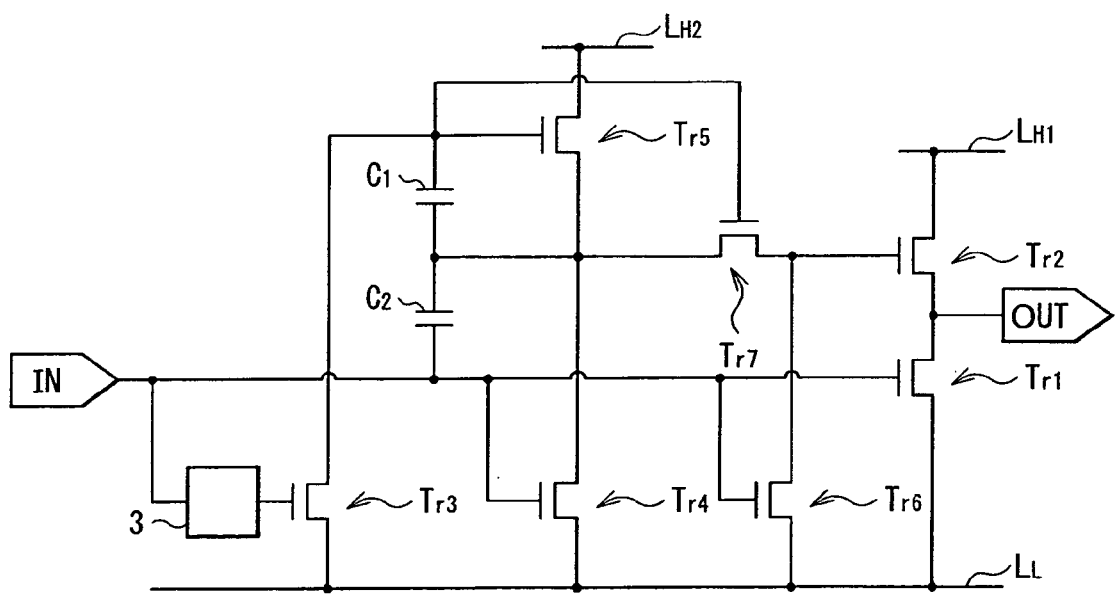
FIG. 38 is a circuit diagram illustrating an example of the inverter circuit in FIG. 27 including a delay element.

Moreover, in the third and fourth embodiments, for example, as illustrated in FIGS. 37 and 38, a delay element 3 may be arranged between the input terminal IN and the gate of the transistor Tr$_3$.

The delay element 3 inputs, to the gate of the transistor Tr$_3$, a voltage with a waveform obtained by delaying a voltage waveform of a signal voltage applied to the input terminal IN. For example, the delay element 3 inputs, to the gate of the transistor Tr$_3$, a voltage with a slower falling edge than that of the voltage waveform of the signal voltage applied to the input terminal IN. Note that the delay element 3 may allow not only the falling edge but also the rising edge of the voltage waveform to be slower than that of the voltage waveform of the signal voltage applied to the input terminal IN. However, in this case, the delay element 3 delays the voltage waveform of the signal voltage applied to the input terminal IN so that its falling edge is slower than its rising edge.

Figure 39A:
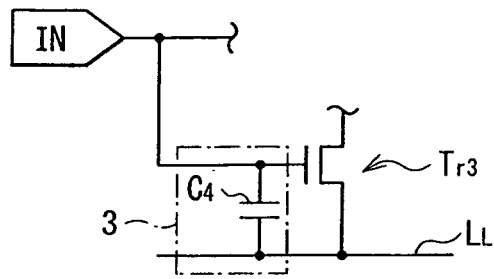
FIGS. 39A to 39D are circuit diagrams illustrating variations of the delay element in FIGS. 37 and 38.

The delay element 3 has any of circuit configurations illustrated in FIGS. 39A to 39D. In FIG. 39A, the delay element 3 includes a capacity element C$_4$. An end of the capacity element C$_4$ is electrically connected to the gate of the transistor Tr$_3$, and the other end of the capacity element C$_4$ is electrically connected to the low-voltage line L$_L$.

Figure 39B:
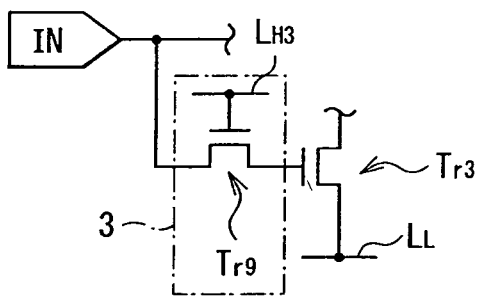

In FIG. 39B, the delay element 3 includes a transistor Tr$_9$. The transistor Tr$_9$ is configured of a transistor having channels of same conduction type as that of the transistor Tr$_1$ or the like, for example, an n-channel MOS type TFT. A source of the transistor Tr$_9$ is electrically connected to the gate of the transistor Tr$_3$, and a drain of the transistor Tr$_9$ is electrically connected to the input terminal IN. A gate of the transistor Tr$_9$ is electrically connected to a high-voltage line L$_{H3}$. The high-voltage line L$_{H3}$ is electrically connected to a power supply (not illustrated) outputting a pulse signal allowing the transistor Tr$_9$ to perform an ON/OFF operation.

Figure 39C:
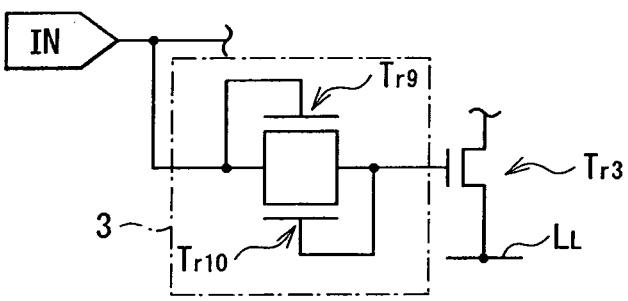

In FIG. 39C, the delay element 3 includes the above-described transistor Tr$_9$ and a transistor Tr$_{10}$. The transistor Tr$_{10}$ is configured of a transistor having channels of same conduction type as that of the transistor Tr$_1$ or the like, for example, an n-channel MOS type TFT. A gate and a source of the transistor Tr$_{10}$ are electrically connected to the gate of the transistor Tr$_3$, and a drain of the transistor Tr$_{10}$ is electrically connected to the input terminal IN.

Figure 39D:
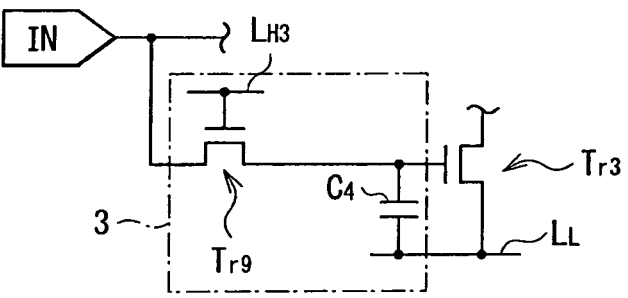

In FIG. 39D, the delay element 3 includes the above-described transistor Tr$_9$ and the above-described capacity element C$_4$.

Operation and Effects

Figure 40:
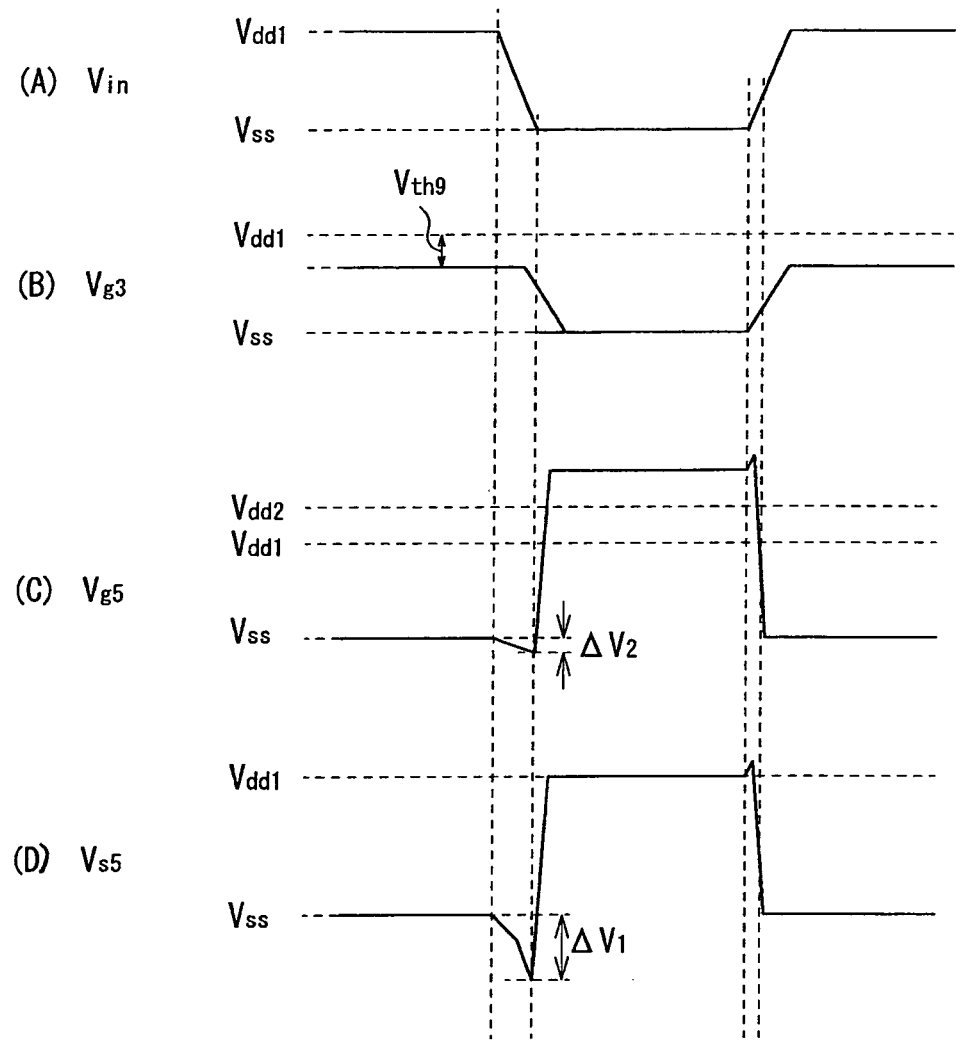
FIG. 40 is a waveform chart illustrating an example of an operation of the inverter circuits in FIGS. 37 and 38.

FIG. 40 illustrates an example of the operation of the inverter circuit according to any of the modifications. Note that FIG. 40 illustrates waveforms in the case where a circuit configuration illustrated in FIG. 39D is used as the delay element 3. The basic operations of the inverter circuits according to the modifications are the same as that illustrated in FIGS. 20 to 25 or FIGS. 28 to 34. A different operation from that illustrated in FIGS. 20 to 25 or FIGS. 28 to 34 is performed when the input voltage V$_{in}$ is switched (reduced) from high (V$_{dd1}$) to low (V$_{ss}$) and when the input voltage V$_{in}$ is switched (increased) from low (V$_{ss}$) to high (V$_{dd1}$).

When the input voltage V$_{in}$ is switched (reduced) from high (V$_{dd1}$) to low (V$_{ss}$), the gate voltages of the transistors Tr$_3$ and Tr$_4$ are changed from the voltage V$_{dd1}$ to the voltage V$_{ss}$. In the inverter circuits 1 and 2 according to the third and fourth embodiments, the voltage change causes a voltage change by ΔV$_1$ in the source of the transistor Tr$_5$ through the capacity element C$_2$, and further causes a voltage change by ΔV$_2$ in the gate of the transistor Tr$_5$ through the capacity elements C$_1$ and C$_2$. In this case, a coupling amount of ΔV$_2$ is applied to the gate of the transistor Tr$_5$, because the gate voltage V$_{g3}$ of the transistor Tr$_3$ is reduced from the voltage V$_{dd1}$ to the voltage V$_{ss}$, and as a result, the on-resistance of the transistor Tr$_3$ is gradually increased to slow a voltage transient for charging the gate of the transistor Tr$_5$ to the voltage V$_{ss}$. In other words, the coupling amount of ΔV$_2$ is applied to the gate of the transistor Tr$_5$, because the transistor Tr$_3$ is switched from on to off at a timing of applying coupling.

Figure 41:
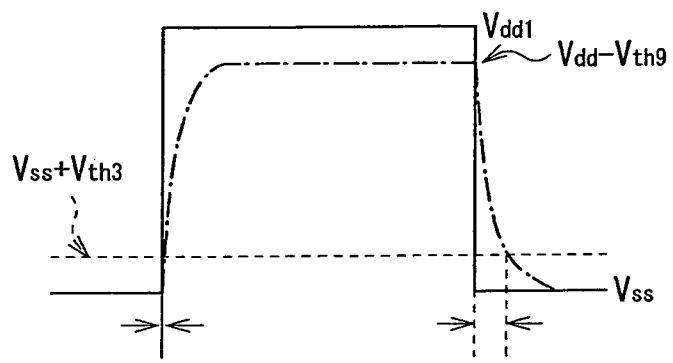
FIG. 41 is a waveform chart illustrating an example of input/output signal waveforms of the delay element in FIGS. 37 and 38.

On the other hand, in the modifications, a signal voltage as illustrated in FIG. 41 obtained by delaying the signal voltage applied to the input terminal IN by the delay element 3 is applied to the gate of the transistor Tr$_3$. Therefore, an off point (a point of switching from on to off) of the transistor Tr$_3$ is delayed, compared to the case where the input voltage V$_{in}$ is applied as is to the gate of the transistor Tr$_3$. In other words, the transistor Tr$_3$ is still on at the timing of applying coupling through the capacity element C$_2$ (refer to FIG. 42). Therefore, ultimately, the coupling amount (ΔV$_2$) applied to the gate of the transistor Tr$_5$ is allowed to be reduced to be smaller than that in related art, and a gate-source voltage V$_{gs5}$ of the transistor Tr$_5$ is allowed to be increased. As a result, the speed of the inverter circuit is allowed to be increased.

Figure 42:
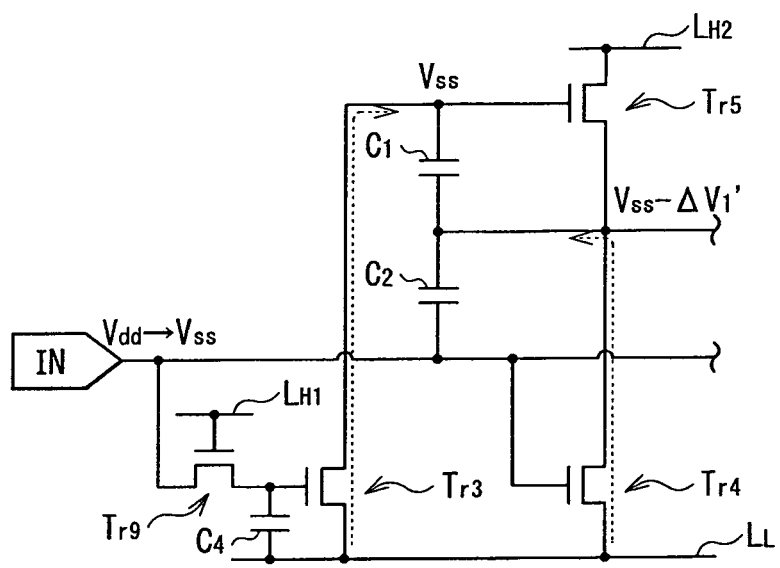
FIG. 42 is a circuit diagram for describing an example of an operation of the inverter circuits in FIGS. 37 and 38.

In the modifications, even in the case where the input voltage V$_{in}$ is switched (increased) from low (V$_{ss}$) to high (V$_{dd1}$), a signal voltage as illustrated in FIG. 41 obtained by delaying the signal voltage applied to the input terminal IN by the delay element 3 is applied to the gate of the transistor Tr$_3$. Therefore, as the off point of the transistor Tr$_3$ is delayed, and the transistor Tr$_3$ is turned on after the transistor Tr$_1$ is turned on, and there is a possibility that a current (a through current) flows from the high-voltage line L$_{H1}$ to the low-voltage line L$_L$ in a state where the output voltage V$_{out}$ is switched. However, when an operation point at which the transistor Tr$_3$ is turned on and the waveform of the signal voltage applied to the gate of the transistor Tr$_3$ are considered, even though the signal voltage applied to the gate of the transistor Tr$_3$ is delayed, the time of turning the transistor Tr$_3$ on is hardly changed at the rising edge as illustrated in FIG. 42, and on the other hand, the time of turning the transistor $Tr_3$ off is largely changed at the falling edge. Therefore, a period where the above-described through current flows is extremely short, and the power consumption of the inverter circuits according to the modifications is not much different from that of the inverter circuits 1 and 2.

In the third and fourth embodiments, coupling caused by a change in the input voltage $V_{in}$ is applied to the source and the gate of the transistor $Tr_5$ so that the gate-source voltage $V_{gs5}$ of the transistor $Tr_5$ has a value equal to or higher than the threshold voltage $V_{th5}$ of the transistor $Tr_5$ with use of a difference in voltage transient between the source and the gate of the transistor $Tr_5$. At this time, the output terminal OUT outputs the voltage of the high-voltage line $L_{H1}$ as the output voltage $V_{out}$, but the voltage transient of the output terminal OUT is highly dependent on the gate-source voltage $V_{gs2}$ of the transistor $Tr_2$. In other words, in the case where the gate-source voltage $V_{gs2}$ of the transistor $Tr_2$ is rapidly increased, the output voltage $V_{out}$ rapidly rises, and in the case where the gate-source voltage $V_{gs2}$ of the transistor $Tr_2$ is gradually increased, the output voltage $V_{out}$ gradually rises.

Therefore, to increase the speed of the inverter circuit, it is necessary for the gate-source voltage $V_{gs2}$ of the transistor $Tr_2$ to rapidly rise, as a method of doing so, for example, it is considered to increase the capacity of the capacity element $C_2$. However, in the case where the capacity of the capacity element $C_2$ is increased, an area occupied by the inverter circuit is increased. As a result, for example, in the case where the inverter circuit including the capacity element $C_2$ with a larger capacity is used for a scanner or the like in an organic EL display, an area occupied by the inverter circuit in a peripheral part (a frame) of a display panel may be increased to interfere with a reduction in the area of the frame. Moreover, an increase in the capacity of the capacity element $C_2$ causes a larger voltage change than $\Delta V_1$ in the source (the output terminal OUT) of the transistor $Tr_2$, thereby causing a larger voltage change than $\Delta V_2$ in the gate of the transistor $Tr_2$. As a result, even though the capacity of the capacity element $C_2$ is increased, the gate-source voltage $V_{gs2}$ of the transistor $Tr_2$ has a value not much different from $\Delta V_1 - \Delta V_2$; therefore, an increase in the capacity of the capacity element $C_2$ does not much contribute to an increase in the speed of the inverter circuit.

On the other hand, in the modifications, the signal voltage as illustrated in FIG. 41 obtained by delaying the signal voltage applied to the input terminal IN by the delay element 3 is applied to the gate of the transistor $Tr_3$. Therefore, the speed of the inverter circuit is allowed to be increased without increasing the capacity of the capacity element $C_2$.

Moreover, in the third and fourth embodiments and the modifications thereof, the transistors $Tr_1$ to $Tr_{10}$ are configured of the n-channel MOS type TFTs, but they may be configured of, for example, p-channel MOS type TFTs. However, in this case, a transient response when the transistors $Tr_1$ to $Tr_{10}$ are switched (increased) from low to high and a transient response when the transistors $Tr_1$ to $Tr_{10}$ are switched (reduced) from high to low are opposite to each other. Moreover, the high-voltage line $L_{H1}$ is replaced with a low-voltage line $L_{L1}$, and the high-voltage line $L_{H2}$ is replaced with a low-voltage line $L_{L2}$, and the low-voltage line $L_L$ is replaced with the high-voltage line $L_H$.

Note that in this case, the low-voltage lines $L_{L1}$ and $L_{L2}$ are connected to a power supply (not illustrated) outputting a lower voltage (a constant voltage) than the voltage of the high-voltage line $L_H$. The voltage of the low-voltage line $L_{L1}$ is at a voltage $V_{ss1}$ during the drive of the inverter circuit, and the voltage of the low-voltage line $L_{L2}$ is at a voltage $V_{ss2}$ ($\leq V_{ss1} - V_{th2}$) during the drive of the inverter circuit. On the other hand, the high-voltage line $L_H$ is connected to a power supply (not illustrated) outputting a higher voltage (a constant voltage) than the voltages of the low-voltage lines $L_{L1}$ and $L_{L2}$, and the voltage of the high-voltage line $L_H$ is at a voltage $V_{dd}$ ($>V_{ss1}$) during the drive of the inverter circuit.

Fifth Embodiment

Configuration

Figure 43:
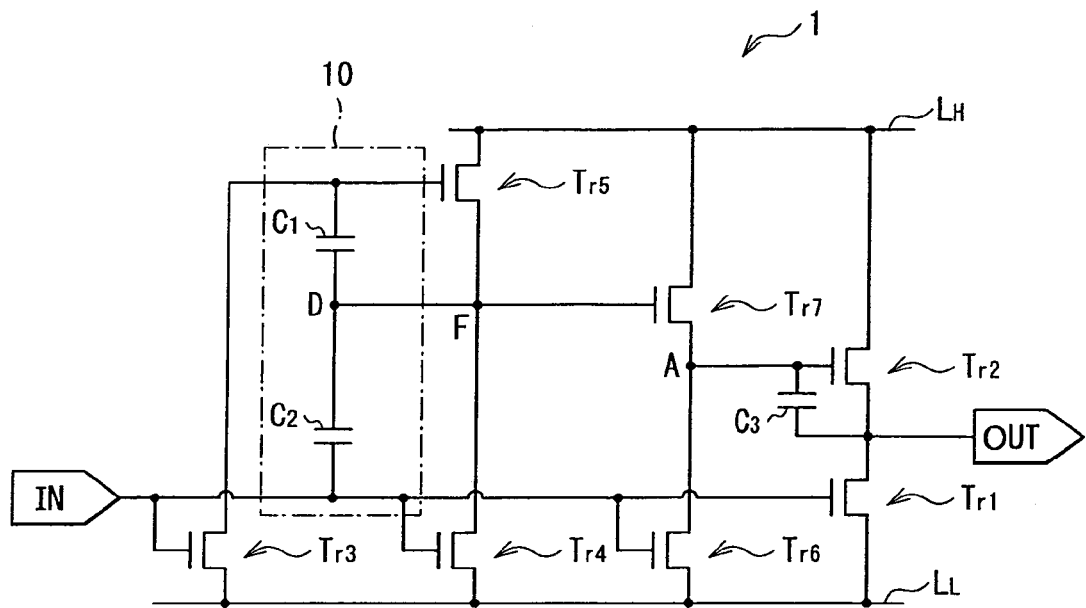
FIG. 43 is a circuit diagram illustrating an example of an inverter circuit according to a fifth embodiment of the disclosure.

FIG. 43 illustrates an example of a whole configuration of an inverter circuit 1 according to a fifth embodiment of the disclosure. The inverter circuit 1 outputs, from an output terminal OUT, a pulse signal (for example, refer to a part (B) in FIG. 44) with a substantially inverted signal waveform of a signal waveform (for example, refer to a part (A) in FIG. 44) of a pulse signal applied to an input terminal IN. The inverter circuit 1 is preferably formed on amorphous silicon or amorphous oxide semiconductor, and includes seven transistors $Tr_1$ to $Tr_7$ each having channels of same conduction type. In addition to the above-described seven transistors $Tr_1$ to $Tr_7$, the inverter circuit 1 includes three capacity elements $C_1$ to $C_3$, the input terminal IN and the output terminal OUT. In other words, the inverter circuit 1 has a 7Tr3C circuit configuration.

The transistors $Tr_1$, $Tr_2$, $Tr_3$, $Tr_4$, $Tr_5$, $Tr_6$ and $Tr_7$ correspond to specific examples of "a first transistor", "a second transistor", "a third transistor", "a fourth transistor", "a fifth transistor", "a sixth transistor", and "a seventh transistor" in the disclosure, respectively. Moreover, the capacity elements $C_1$, $C_2$ and $C_3$ correspond to specific examples of "a first capacity element", "a second capacity element" and "a third capacity element" in the disclosure, respectively.

The transistors $Tr_1$ to $Tr_7$ are configured of thin-film transistors (TFTs) each having channels of same conductive type, for example, n-channel MOS (Metal Oxide Semiconductor) type thin-film transistors (TFTs). The transistor $Tr_1$ makes or breaks electrical connection between the output terminal OUT and a low-voltage line $L_L$ in response to, for example, a potential difference $V_{gs1}$ between a voltage (an input voltage $V_{in}$) of the input terminal IN and a voltage $V_L$ of the low-voltage line $L_L$ (or a potential difference corresponding thereto). A gate of the transistor $Tr_1$ is electrically connected to the input terminal IN, and one terminal of a source and a drain of the transistor $Tr_1$ is electrically connected to the low-voltage line $L_L$, and the other terminal not connected to the low-voltage line $L_L$ of the transistor $Tr_1$ is electrically connected to the output terminal OUT. The transistor $Tr_2$ makes or breaks electrical connection between a high-voltage line $L_H$ and the output terminal OUT in response to a potential difference $V_{gs2}$ between a voltage $V_{s7}$ of a terminal (a terminal A) not connected to the high-voltage line $L_H$ of a source and a drain of the transistor $Tr_7$ and a voltage (output voltage $V_{out}$) of the output terminal OUT (or a potential difference corresponding thereto). A gate of the transistor $Tr_2$ is electrically connected to the terminal A of the transistor $Tr_7$. One terminal of a source and a drain of the transistor $Tr_2$ is electrically connected to the output terminal OUT, and the other terminal not connected to the output terminal OUT of the transistor $Tr_2$ is electrically connected to the high-voltage line $L_H$.

The transistor $Tr_3$ makes or breaks electrical connection between a gate of the transistor $Tr_5$ and the low-voltage line $L_L$ in response to a potential difference $V_{gs3}$ between the input voltage $V_{in}$ and the voltage $V_L$ of the low-voltage line $L_L$ (or a potential difference corresponding thereto). A gate of the transistor Tr3 is electrically connected to the input terminal IN. One terminal of a source and a drain of the transistor $Tr_3$ is electrically connected to the low-voltage line $L_L$, and the other terminal not connected to the low-voltage line $L_L$ of the transistor $Tr_3$ is electrically connected to a gate of the transistor $Tr_5$. The transistor $Tr_4$ makes or breaks electrical connection between one terminal (a terminal F) not connected to the high-voltage line $L_H$ of a source and a drain of the transistor $Tr_5$ and the low-voltage line $L_L$ in response to a potential difference $V_{gs4}$ between the input voltage $V_{in}$ and the voltage $V_L$ of the low-voltage line $L_L$ (or a potential difference corresponding thereto). A gate of the transistor $Tr_4$ is electrically connected to the input terminal IN. One terminal of a source and a drain of the transistor $Tr_4$ is electrically connected to the low-voltage line $L_L$, and the other terminal not connected to the low-voltage line $L_L$ of the transistor $Tr_4$ is electrically connected to the terminal F of the transistor $Tr_5$. The transistor $Tr_5$ makes or breaks electrical connection between the high-voltage line $L_H$ and the terminal F in response to a voltage $V_{gs5}$ between terminals of the capacity element $C_1$ (or a potential difference corresponding thereto). The gate of the transistor $Tr_5$ is electrically connected to the terminal not connected to the low-voltage line $L_L$ of the source and the drain of the transistor $Tr_1$. One terminal of the source and the drain of the transistor $Tr_5$ is electrically connected to the high-voltage line $L_H$. The other terminal (the terminal F) not connected to the high-voltage line $L_H$ of the transistor $Tr_5$ is electrically connected to a gate of the transistor $Tr_7$ and the terminal not connected to the low-voltage line $L_L$ of the source and the drain of the transistor $Tr_4$.

The transistor $Tr_6$ makes or breaks electrical connection between the terminal (the terminal A) not connected to the high-voltage line $L_H$ of the source and the drain of the transistor $Tr_7$ and the low-voltage line $L_L$ in response to a potential difference $V_{gs6}$ between the input voltage $V_{in}$ and the voltage $V_L$ of the low-voltage line $L_L$ (or a potential difference corresponding thereto). A gate of the transistor $Tr_6$ is electrically connected to the input terminal IN. One terminal of a source and a drain of the transistor $Tr_6$ is electrically connected to the low-voltage line $L_L$, and the other terminal not connected to the low-voltage line $L_L$ of the transistor $Tr_6$ is electrically connected to the terminal A of the transistor $Tr_7$. In other words, the transistors $Tr_1$, $Tr_3$, $Tr_4$ and $Tr_6$ are connected to the same voltage line (the low-voltage line $L_L$). Therefore, a terminal on a side close to the low-voltage line $L_L$ of the transistor $Tr_1$, a terminal on a side close to the low-voltage line $L_L$ of the transistor $Tr_3$, a terminal on a side close to the low-voltage line $L_L$ of the transistor $Tr_4$ and a terminal on a side close to the low-voltage line $L_L$ of the transistor $Tr_6$ have the same potential. The transistor $Tr_7$ makes or breaks electrical connection between the high-voltage line $L_H$ and the gate of the transistor $Tr_2$ in response to a potential difference $V_{gs7}$ between the voltage $V_{s5}$ of the terminal (a terminal F) not connected to the high-voltage line $L_H$ of the source and the drain of the transistor $Tr_5$ and the gate voltage $V_{g2}$ of the transistor $Tr_2$ (or a potential difference corresponding thereto). The gate of the transistor $Tr_7$ is electrically connected to the terminal F of the transistor $Tr_5$. One terminal of the source and the drain of the transistor $Tr_7$ is electrically connected to the gate of the transistor $Tr_2$, and the other terminal not connected to the gate of the transistor $Tr_2$ of the transistor $Tr_7$ is electrically connected to the high-voltage line $L_H$. In other words, the transistors $Tr_2$, $Tr_5$ and $Tr_7$ are connected to the same voltage line (the high-voltage line $L_H$). Therefore, a terminal on a side close to the high-voltage line $L_H$ of the transistor $Tr_2$, a terminal on a side close to the high-voltage line $L_H$ of the transistor $Tr_5$ and a terminal on a side close to the high-voltage line $L_H$ of the transistor $Tr_7$ have the same potential.

The low-voltage line $L_L$ corresponds to a specific example of "a first voltage line", "a third voltage line", "a fourth voltage line" and "a sixth voltage line" in the disclosure. The high-voltage line $L_H$ corresponds to a specific example of "a second voltage line", "a fifth voltage line" and "a seventh voltage line" in the disclosure.

The high-voltage line $L_H$ is connected to a power supply (not illustrated) outputting a higher voltage (a constant voltage) than the voltage $V_L$ of the low-voltage line $L_L$, and the voltage $V_H$ of the high-voltage line $L_H$ is at a voltage $V_{dd}$ during the drive of the inverter circuit 1. The voltage $V_{dd}$ has the same voltage value as that of a high voltage of a signal voltage (the input voltage $V_{in}$) applied to the input terminal IN. On the other hand, the low-voltage line $L_L$ is connected to a power supply (not illustrated) outputting a lower voltage (a constant voltage) than the voltage $V_H$ of the high-voltage line $L_H$, and the voltage $V_L$ of the low-voltage line $L_L$ is at a voltage $V_{ss}$ ($<V_{dd}$) during the drive of the inverter circuit 1.

The capacity elements $C_1$ and $C_2$ are inserted in series between the input terminal IN and the gate of the transistor $Tr_5$. An electrical connection point D between the capacity element $C_1$ and the capacity element $C_2$ is electrically connected to the terminal F of the transistor $Tr_5$. The capacity element $C_1$ is inserted on a side close to the gate of the transistor $Tr_5$, and the capacity element $C_2$ is inserted on a side close to the gate of the transistor $Tr_1$. The capacity of the capacity element $C_2$ is larger than that of the capacity element $C_1$. Both of the capacities of the capacity elements $C_1$ and $C_2$ preferably satisfy the following expression (1). If the capacities of the capacity elements $C_1$ and $C_2$ satisfy the expression (1), at a falling edge of an input voltage $V_{in}$ which will be described later, a gate-source voltage of the transistor $Tr_5$ is allowed to reach a threshold voltage $V_{th5}$ or over of the transistor $Tr_5$, and the transistor $Tr_5$ is allowed to be turned on. As a result, the output voltage $V_{out}$ is allowed to be switched from low to high.

$$C_2(V_{dd}-V_{ss})/(C_1+C_2)>V_{th5} \qquad (1)$$

In this case, a circuit part including the capacity elements $C_1$ and $C_2$ configures a control element 10 in the inverter circuit 1. For example, as illustrated in FIG. 43, the control element 10 includes a terminal $P_1$ electrically connected to the input terminal IN, a terminal $P_2$ electrically connected to the terminal F of the transistor $Tr_5$ and a terminal P3 electrically connected to the gate of the transistor $Tr_5$.

The terminals $P_1$, $P_2$ and $P_3$ correspond to a specific example of "a second terminal", "a third terminal" and "a fourth terminal" in the disclosure, respectively.

For example, when a falling-edge voltage is applied to the terminal $P_1$, the control element 10 allows a voltage transient of the terminal $P_2$ to be slower than a voltage transient of the terminal $P_3$. More specifically, when the falling-edge voltage is applied to the input terminal IN, the control element 10 allows a voltage transient of the source of the transistor $Tr_5$ to be slower than a voltage transient of the gate of the transistor $Tr_5$. Note that the operation of the control element 10 will be described with the following description of the operation of the inverter circuit 1. The source of the transistor $Tr_5$ corresponds to a specific example of "a first terminal" in the disclosure.

Operation

Figure 45:
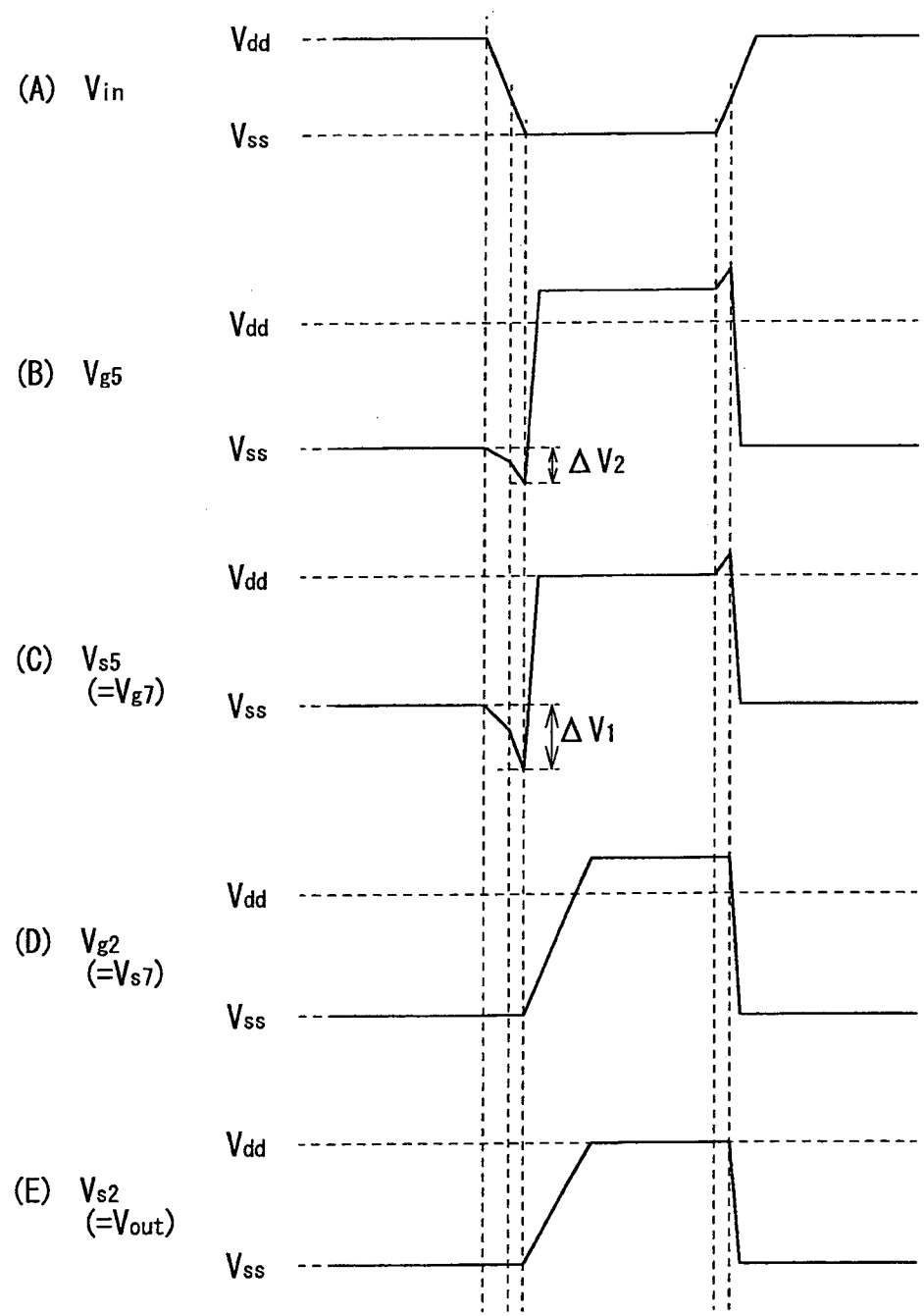
FIG. 45 is a waveform chart illustrating an example of an operation of the inverter circuit in FIG. 43.
Figure 46:
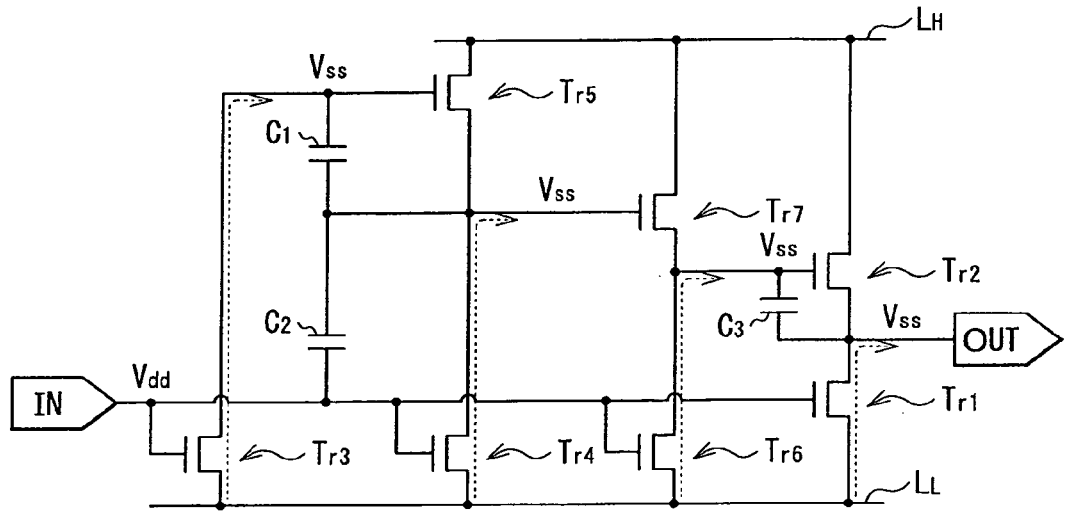
FIG. 46 is a circuit diagram for describing an example of an operation of the inverter circuit in FIG. 43.

Next, an example of the operation of the inverter circuit 1 will be described below referring to FIGS. 45 to 69. FIG. 45 is a waveform chart illustrating an example of the operation of the inverter circuit 1. FIGS. 46 to 51 are circuit diagrams sequentially illustrating an example of the operation of the inverter circuit 1.

First, when the input voltage $V_{in}$ is high ($V_{dd}$), the transistors $Tr_1$, $Tr_3$, $Tr_4$ and $Tr_6$ are turned on. Accordingly, the gate voltages $V_{g2}$, $V_{g5}$ and $V_{g7}$ and the source voltages $V_{s2}$, $V_{s5}$ and $V_{s7}$ of the transistors $Tr_2$, $Tr_5$ and $Tr_7$ are charged to the voltage $V_L$ (=$V_{ss}$) of the low-voltage line $L_L$ (refer to FIGS. 45 and 46). Therefore, the transistors $Tr_2$, $Tr_5$ and $Tr_7$ are turned off (in the case where the transistors $Tr_2$, $Tr_5$ and $Tr_7$ are turned off at voltages $V_{gs2}$, $V_{gs5}$ and $V_{gs7}$=0 V, respectively), and the voltage $V_{ss}$ is taken out as the output voltage $V_{out}$. At this time, the capacity element $C_2$ is charged to a voltage of $V_{dd}$-$V_{ss}$.

Figure 47:
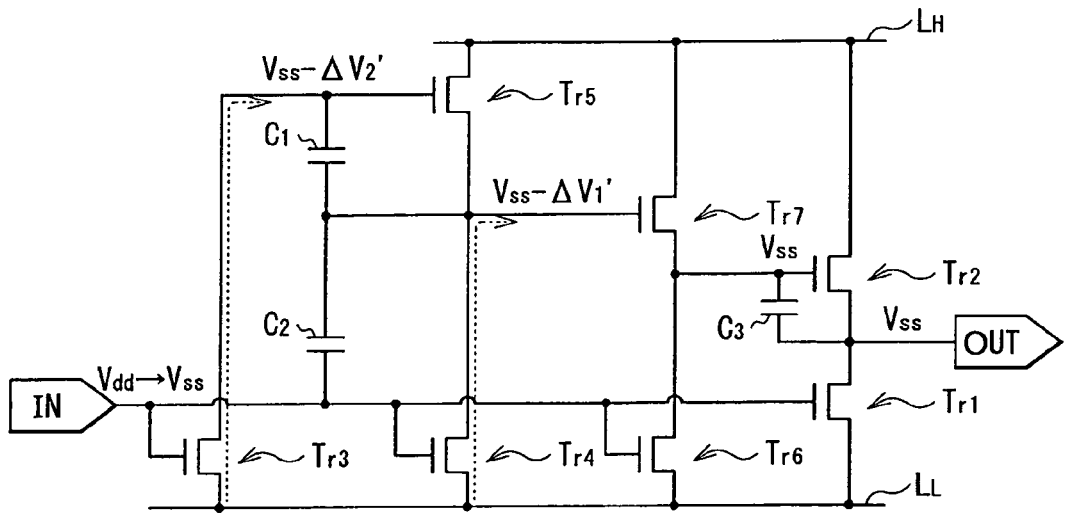
FIG. 47 is a circuit diagram for describing an example of an operation following FIG. 46.

Next, when the input voltage $V_{in}$ is switched (reduced) from high ($V_{dd}$) to low ($V_{ss}$), gate voltages $V_{g1}$, $V_{g3}$, $V_{g4}$ and $V_{g6}$ of the transistors $Tr_1$, $Tr_3$, $Tr_4$ and $Tr_6$ are switched (reduced) from the voltage $V_{dd}$ to the voltage $V_{ss}$ (refer to FIGS. 45 and 47). Therefore, a change in the gate voltage $V_{g1}$ of the transistor $Tr_1$ propagates to the gate of the transistor $Tr_7$ through the capacity element $C_2$ to change (reduce) the gate voltage $V_{g7}$ of the transistor $Tr_7$ by $\Delta V1'$. Moreover, the change in the gate voltage $V_{g1}$ of the transistor $Tr_1$ also propagates to the gate of the transistor $Tr_5$ through the capacity elements $C_1$ and $C_2$ to change (reduce) the gate voltage $V_{g5}$ of the transistor $Tr_5$ by $\Delta V2'$. However, at this time, the transistors $Tr_1$, $Tr_3$, $Tr_4$ and $Tr_6$ are on. Therefore, a current flows from the low-voltage line $L_L$ to the sources and the gates of the transistors $Tr_2$, $Tr_5$ and $Tr_7$ so as to charge the sources and the gates of the transistors $Tr_2$, $Tr_5$ and $Tr_7$ to the voltage $V_{ss}$.

In this case, as the gate voltages of the transistors $Tr_1$, $Tr_3$, $Tr_4$ and $Tr_6$ are switched (reduced) from the voltage $V_{dd}$ to the voltage $V_{ss}$, on-resistances of the transistors $Tr_1$, $Tr_3$, $Tr_4$ and $Tr_6$ are gradually increased to increase time necessary to charge the sources and the gates of the transistors $Tr_2$, $Tr_5$ and $Tr_7$ to the voltage $V_L$ of the low-voltage line $L_L$.

Moreover, when full capacity at the source of the transistor $Tr_5$ and full capacity at the gate of the transistor $Tr_5$ are compared to each other, the capacity elements $C_1$ and $C_2$ are connected in parallel to the source of the transistor $Tr_5$, and the capacity elements $C_1$ and $C_2$ are connected in series to the gate of the transistor $Tr_5$. Therefore, the voltage transient of the source of the transistor $Tr_5$ is slower than that of the gate of the transistor $Tr_5$. As a result, time necessary to charge the source of the transistor $Tr_5$ to the voltage $V_L$ of the low-voltage line $L_L$ is longer than time necessary to charge the gate of the transistor $Tr_5$ to the voltage $V_L$ of the low-voltage line $L_L$.

Moreover, in the case where the input voltage $V_{in}$ is at a voltage $V_{ss}$+$V_{th3}$ or over, and further at a voltage $V_{ss}$+$V_{th4}$ or over, the transistors $Tr_3$ and $Tr_4$ operate in a linear region. Note that $V_{th3}$ is a threshold voltage of the transistor $Tr_3$, and $V_{th4}$ is a threshold voltage of the transistor $Tr_4$. On the other hand, in the case where the input voltage $V_{in}$ is smaller than the voltage $V_{ss}$+$V_{th3}$, and further smaller than the voltage $V_{ss}$+$V_{th4}$, the transistors $Tr_3$ and $Tr_4$ operate in a saturation region. Therefore, although a current illustrated in FIG. 47 flows through the source and the gate of the transistor $Tr_5$, each of the terminals of the transistors $Tr_3$ and $Tr_4$ is not allowed to be charged to the voltage $V_{ss}$.

Figure 48:
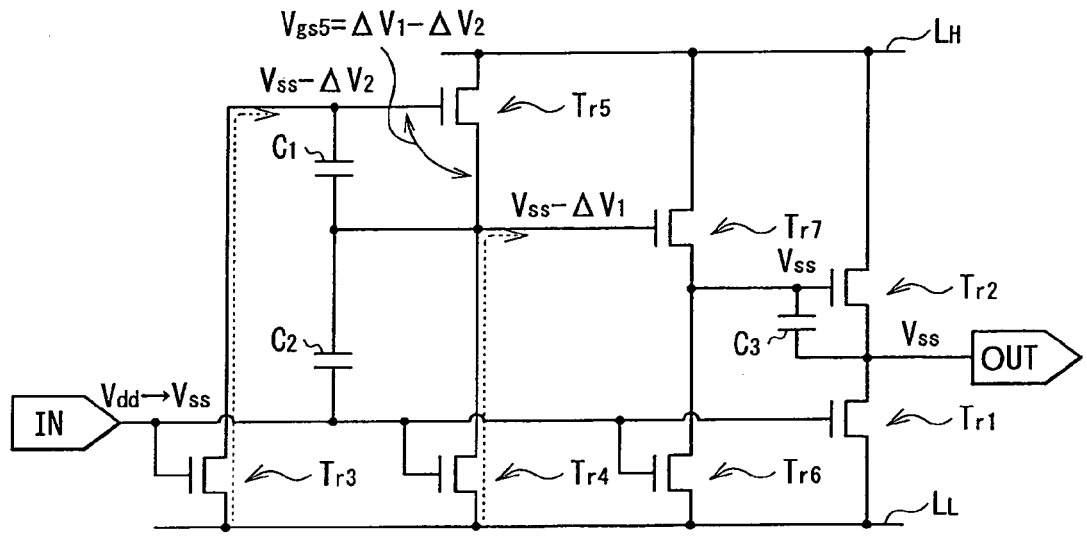
FIG. 48 is a circuit diagram for describing an example of an operation following FIG. 47.

When the input voltage $V_{in}$ is switched from the voltage $V_{dd}$ to the voltage $V_{ss}$, ultimately, the gate-source voltage $V_{gs5}$ of the transistor $Tr_5$ is chanted to a voltage $\Delta V_1 - \Delta V_2$ (refer to FIGS. 45 and 48). At this time, when the gate-source voltage $V_{gs5}$ of the transistor $Tr_5$ exceeds the threshold voltage $V_{th5}$ of the transistor $Tr_5$, the transistor $Tr_5$ is turned on, and the current starts to flow from the high-voltage line $L_H$.

When the transistor $Tr_5$ is on, the source voltage $V_{s5}$ of the transistor $Tr_5$ is increased by the transistor $Tr_5$ in addition to the transistor $Tr_4$. Moreover, as the capacity element $C_1$ is connected between the gate and the source of the transistor $Tr_5$, a bootstrap is caused, and the gate voltage $V_{g5}$ of the transistor $Tr_5$ is increased with an increase in the source voltage $V_{s5}$ of the transistor $Tr_5$. After that, when the source voltage $V_{s5}$ and the gate voltage $V_{g5}$ of the transistor $Tr_5$ reach the voltage $V_{ss}$-$V_{th3}$ or over, further the voltage $V_{ss}$-$V_{th4}$ or over, the transistors $Tr_3$ and $Tr_4$ are turned off, and the source voltage $V_{s5}$ and the gate voltage $V_{g5}$ of the transistor $Tr_5$ are increased only by the transistor $Tr_5$.

Figure 49:
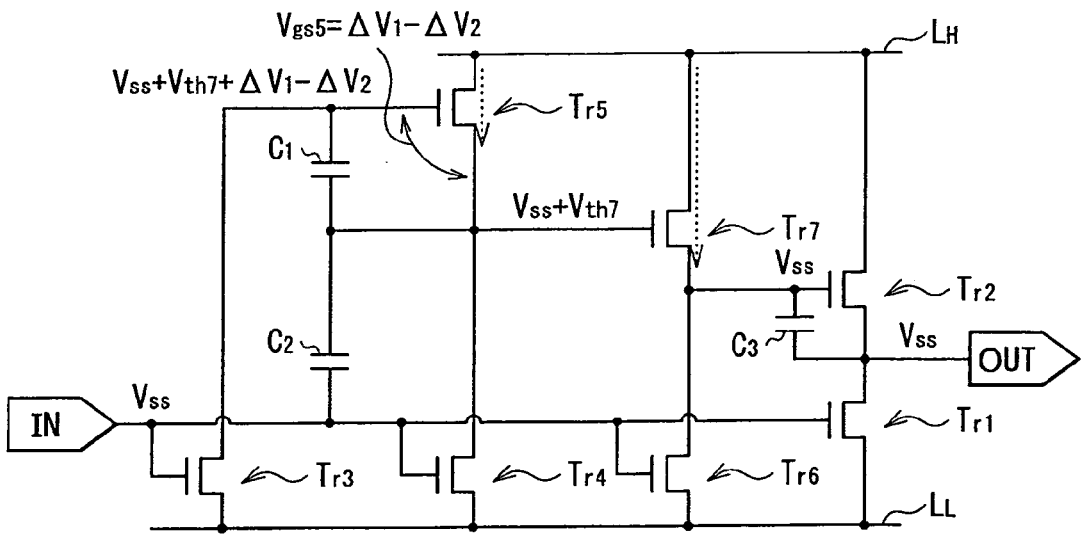
FIG. 49 is a circuit diagram for describing an example of an operation following FIG. 48.
Figure 50:
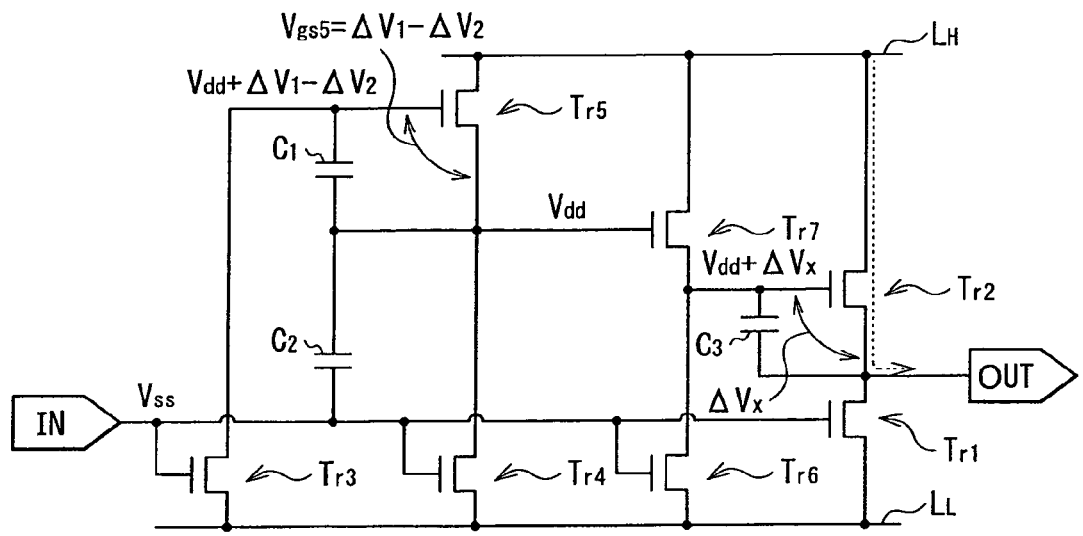
FIG. 50 is a circuit diagram for describing an example of an operation following FIG. 49.

After a lapse of a certain period, when the source voltage $V_{s5}$ of the transistor $Tr_5$ (the gate voltage $V_{g1}$ of the transistor $Tr_7$) reaches a voltage $V_{ss}$+$V_{th7}$ or over, the transistor $Tr_7$ is turned on, and a current starts to flow through the transistor $Tr_7$ (refer to FIGS. 45 and 49). Note that $V_{th7}$ is a threshold voltage of the transistor $Tr_7$. As a result, the source voltage $V_{s7}$ of the transistor $Tr_7$ (the gate voltage $V_{g2}$ of the transistor $Tr_2$) is gradually increased from the voltage $V_{ss}$.

Now, the gate voltage $V_{g2}$ and the source voltage $V_{s2}$ of the transistor $Tr_2$ will be considered below. The capacity element $C_3$ is connected between the gate and the source of the transistor $Tr_2$. The capacity element $C_3$ causes a bootstrap, and the source voltage $V_{s2}$ and the gate voltage $V_{g2}$ of the transistor $Tr_2$ are changed in conjunction with each other. The gate voltage $V_{g2}$ of the transistor $Tr_2$ is increased by a current from the transistor $Tr_7$ and an increase in the source voltage $V_{s2}$ of the transistor $Tr_2$. Therefore, compared to the case where the gate voltage $V_{g2}$ of the transistor $Tr_2$ is increased only by a current through the transistor $Tr_2$, the voltage transient of the gate of the transistor $Tr_2$ is faster. As a result, a gate-source voltage $V_{gs2}$ of the transistor $Tr_2$ is gradually increased.

At this time, as the transistor $Tr_5$ is on, the gate voltage $V_{g7}$ of the transistor $Tr_7$ does not follow an increase in the source voltage $V_{s7}$ of the transistor $Tr_7$ and is changed to the voltage $V_H$ (=$V_{dd}$) of the high-voltage line $L_H$ ultimately. Therefore, the current from the transistor $Tr_7$ is reduced with an increase in the gate voltage $V_{g2}$ of the transistor $Tr_2$ (the source voltage $V_{s7}$ of the transistor $Tr_7$). When the case where the gate-source voltage $V_{gs7}$ of the transistor $Tr_7$ reaches the threshold voltage $V_{th7}$ of the transistor. $Tr_7$ is considered, a current flowing from the high-voltage line $L_H$ is reduced to an extremely small amount, and the gate voltage $V_{g2}$ of the transistor $Tr_2$ is hardly changed by the current through the transistor $Tr_7$. However, at this time, as the transistor $Tr_2$ is on, and the source voltage $V_{s2}$ of the transistor $Tr_2$ is increased, the gate voltage $V_{g2}$ of the transistor $Tr_2$ keeps on increasing by a bootstrap operation. As a result, the transistor $Tr_7$ is completely turned off. At this time, in the case where the gate-source voltage $V_{gs2}$ of the transistor $Tr_2$ is at a voltage $\Delta V_{ss}$, when the voltage $\Delta V_{ss}$ is larger than the threshold voltage $V_{th2}$ of the transistor $Tr_2$, the gate voltage $V_{g2}$ and the source voltage $V_{s2}$ of the transistor $Tr_2$ keeps on increasing even after the transistor $Tr_7$ is turned off, and ultimately, the voltage $V_H$ (=$V_{dd}$) of the high-voltage line $L_H$ is taken out as the voltage $V_{out}$ (refer to FIGS. 45 and 50).

Figure 51:
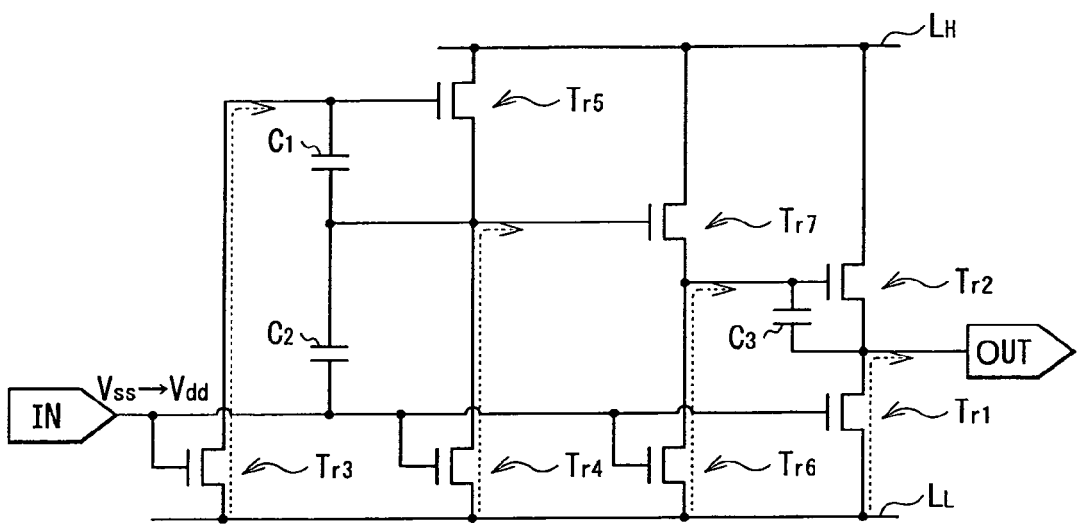
FIG. 51 is a circuit diagram for describing an example of an operation following FIG. 50.

Then, after a lapse of another certain period, the input voltage $V_{in}$ is switched (increased) from low ($V_{ss}$) to high ($V_{dd}$) (refer to FIGS. 45 and 51). At this time, in a stage where the input voltage $V_{in}$ is lower than the voltage $V_{ss}$+$V_{th3}$, and further lower than the voltage $V_{ss}$+$V_{th4}$, the transistors $Tr_3$ and $Tr_4$ are off. Therefore, coupling through the capacity elements $C_1$ and $C_2$ is applied to the source and the gate of the transistor $Tr_5$ to increase the source voltage $V_{s5}$ and the gate voltage $V_{g5}$ of the transistor $Tr_5$. After that, when the input voltage $V_{in}$ reaches the voltage $V_{ss}$+$V_{th1}$, $V_{ss}$+$V_{th3}$, $V_{ss}$+$V_{th6}$ and $V_{ss}$+

$V_{th4}$ or over, the transistors $Tr_1$, $Tr_3$, $Tr_4$ and $Tr_6$ are turned on. Therefore, a current flows toward the source (the output terminal OUT) and the gate of the transistor $Tr_2$ and the source and the gate of the transistor $Tr_5$ so as to charge the source (the output terminal OUT) and the gate of the transistor $Tr_2$ and the source and the gate of the transistor $Tr_5$ to the voltage $V_{ss}$.

In this case, as the gate voltages $V_{g1}$, $V_{g3}$, $V_{g4}$ and $V_{g6}$ of the transistor $Tr_1$, $Tr_3$, $Tr_4$ and $Tr_6$ are switched (increased) from the voltage $V_{dd}$ to the voltage $V_{ss}$, on-resistances of the transistors $Tr_1$, $Tr_3$, $Tr_4$ and $Tr_6$ are gradually reduced to relatively reduce time necessary to charge the sources and the gates of the transistors $Tr_2$ and $Tr_5$ to the voltage $V_L$ of the low-voltage line $L_L$. Ultimately, the source voltage $V_{s2}$ of the transistor $Tr_2$ and the source voltage $V_{s5}$ and the gate voltage $V_{g5}$ of the transistor $Tr_5$ reach the voltage $V_{ss}$, and the output terminal outputs the voltage $V_{ss}$ (refer to FIGS. 45 and 46).

Figure 44:
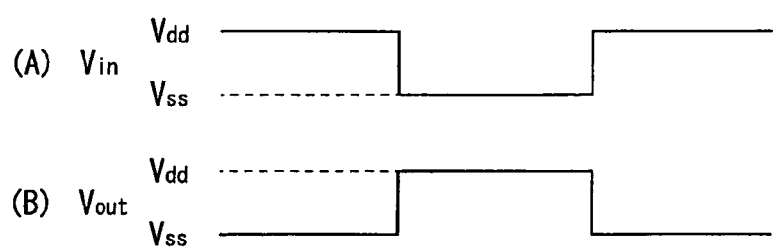
FIG. 44 is a waveform chart illustrating an example of input/output signal waveforms of the inverter circuit in FIG. 43.

As described above, the inverter circuit 1 according to the fifth embodiment outputs, from the output terminal OUT, a pulse signal (for example, refer to the part (B) in FIG. 44) with a substantially inverted signal waveform of a signal waveform (for example, refer to the part (A) in FIG. 44) of a pulse signal applied to the input terminal IN.

Effects

The inverter circuit 200 in related art illustrated in FIG. 72 has, for example, a single channel type circuit configuration in which two n-channel MOS type transistors $Tr_1$ and $Tr_2$ are connected to each other in series. In the inverter circuit 200, for example, as illustrated in FIG. 73, when the input voltage $V_{in}$ is at the voltage $V_{ss}$, the output voltage $V_{out}$ is not at the voltage $V_{dd}$ but at a voltage $V_{dd}-V_{th2}$. In other words, the output voltage $V_{out}$ includes the threshold voltage $V_{th2}$ of the transistor $Tr_2$, and the output voltage $V_{out}$ is greatly affected by variations in the threshold voltage $V_{th2}$ of the transistor $Tr_2$.

Therefore, it is considered that, for example, as illustrated in an inverter circuit 300 in FIG. 74, the gate and the drain of the transistor $Tr_2$ are electrically separated from each other, and the gate is connected to the high-voltage wiring line $L_{H2}$ to which a higher voltage $V_{dd2}$ ($\geqq V_{dd}+V_{th2}$) than the voltage $V_{dd}$ of the drain is applied. Moreover, for example, a bootstrap type circuit configuration represented by an inverter circuit 400 in FIG. 75 is considered.

However, in any of the circuits in FIGS. 72, 74 and 75, even in the case where the input voltage $V_{in}$ is high, that is, even in the case where the output voltage $V_{out}$ is low, a current (a through current) flows from the high-voltage wiring line $L_H$ to the low-voltage wiring line $L_L$ through the transistors $Tr_1$ and $Tr_2$. As a result, power consumption in the inverter circuits is increased. Moreover, in the circuits in FIGS. 72, 74 and 75, for example, as illustrated in a point encircled by a broken line in a part (B) in FIG. 73, when the input voltage $V_{in}$ is at the voltage $V_{dd}$, the output voltage $V_{out}$ is not at the voltage $V_{ss}$, and a peak value of the output voltage. $V_{out}$ varies. Therefore, for example, in the case where the inverter circuits are used in a scanner in an active matrix organic EL display, threshold correction or mobility correction in the driving transistor varies from one pixel circuit to another, thereby causing variations in luminance.

On the other hand, in the inverter circuit 1 according to the fifth embodiment, the transistors $Tr_1$, $Tr_3$, $Tr_4$ and $Tr_6$ performing an ON/OFF operation in response to a potential difference between the input voltage $V_{in}$ and the voltage $V_L$ of the low-voltage line $L_L$ are arranged between the gate of the transistor $Tr_5$ and the low-voltage line $L_L$, between the gate of the transistor $Tr_7$ and the low-voltage line $L_L$, between the gate of the transistor $Tr_2$ and the low-voltage line $L_L$, and between the source of the transistor $Tr_2$ and the low-voltage line $L_L$. Therefore, when the gate voltages of the transistors $Tr_1$, $Tr_3$, $Tr_4$ and $Tr_6$ are switched (reduced) from high ($V_{dd}$) to low ($V_{ss}$), on-resistances of the transistors $Tr_1$, $Tr_3$, $Tr_4$ and $Tr_6$ are gradually increased to increase time necessary to charge the gates and the sources of the transistors $Tr_2$, $Tr_5$ and $Tr_7$ to the voltage $V_L$ of the low-voltage line $L_L$. Moreover, when the gate voltages of the transistors $Tr_1$, $Tr_3$, $Tr_4$ and $Tr_6$ are switched (increased) from low ($V_{ss}$) to high ($V_{dd}$), the on-resistances of the transistors $Tr_1$, $Tr_3$, $Tr_4$ and $Tr_6$ are gradually reduced to reduce time necessary to charge the gates and the sources of the transistors $Tr_2$, $Tr_5$ and $Tr_7$ to the voltage $V_L$ of the low-voltage line $L_L$. Further in the embodiment of the disclosure, the capacity element $C_1$ and the capacity element $C_2$ which are connected in series to each other are inserted between the input terminal IN and the gate of the transistor $Tr_5$. Moreover, the source of the transistor $Tr_5$ is electrically connected between the capacity element $C_1$ and the capacity element $C_2$. Therefore, the capacity element $C_1$ and the capacity element $C_2$ are connected in parallel to the source of the transistor $Tr_5$, and are electrically connected in series to the gate of the transistor $Tr_5$. As a result, the voltage transient of the source of the transistor $Tr_5$ is slower than that of the gate of the transistor $Tr_5$. Therefore, when the gate voltages of the transistor $Tr_3$, the transistor $Tr_4$, the transistor $Tr_6$ and the transistor $Tr_1$ are switched (reduced) from high ($V_{dd}$) to low ($V_{ss}$), the gate-source voltage $V_{gs5}$ of the transistor $Tr_5$ exceeds the threshold voltage $V_{th5}$ of the transistor $Tr_5$, and the transistor $Tr_5$ is turned on, and immediately after that, the transistor $Tr_4$ is turned off. At this time, while the transistor $Tr_7$ is turned on, the transistor $Tr_4$ is turned off, and while the transistor $Tr_2$ is turned on, the transistor $Tr_6$ is turned off, and after that, the transistor $Tr_7$ is turned off. As a result, the output voltage $V_{out}$ is changed to the voltage of the high-voltage line $L_H$. Moreover, the gate voltages of the transistor $Tr_3$, the transistor $Tr_4$, the transistor $Tr_6$ and the transistor $Tr_1$ are switched (increased) from low ($V_{ss}$) to high ($V_{dd}$), the transistor $Tr_3$, the transistor $Tr_4$ and the transistor $Tr_6$ are turned on, and immediately after that, the transistor $Tr_5$ is turned off. At this time, while the transistor $Tr_2$ is turned off, the transistor $Tr_1$ is turned on; therefore, the output voltage is changed to a voltage of the low-voltage line $V_L$.

Thus, in the inverter circuit 1 according to the fifth embodiment, a period where the transistor $Tr_1$ and the transistor $Tr_2$ are simultaneously turned on, a period where the transistor $Tr_4$ and the transistor $Tr_5$ are simultaneously turned on, or a period where the transistor $Tr_6$ and the transistor $Tr_7$ are simultaneously turned on is almost eliminated. Therefore, a current (a through current) hardly flows between the high-voltage line $L_H$ and the low-voltage line $L_L$ through the transistors $Tr_1$ and $Tr_2$, though the transistors $Tr_4$ and $Tr_5$, or through the transistor $Tr_6$ and $Tr_7$. As a result, power consumption is allowed to be reduced. Moreover, when the gate voltages of the transistors $Tr_1$, $Tr_3$, $Tr_4$ and $Tr_6$ are switched (reduced) from high ($V_{dd}$) to low ($V_{ss}$), the output voltage $V_{out}$ is changed to the voltage of the high-voltage line $L_H$, and when the gate voltages of the transistors $Tr_1$, $Tr_3$, $Tr_4$ and $Tr_6$ are switched from low ($V_{ss}$) to high ($V_{dd}$), the output voltage $V_{out}$ is changed to the voltage of the low-voltage line $L_L$. Therefore, variations in the output voltage $V_{out}$ are allowed to be eliminated. As a result, for example, variations in threshold correction or mobility correction in the driving transistor from one pixel circuit to another are allowed to be reduced, and variations in luminance from one pixel to another are allowed to be reduced.

Moreover, in the fifth embodiment, the capacity elements $C_1$ and $C_2$ are directly connected to the output terminal OUT; therefore, a coupling amount applied to the gate and the source of the transistor $Tr_5$ are not affected by parasitic capacitance in an output stage. Therefore, the gate-source voltage $V_{gs5}$ of the transistor $Tr_5$ is allowed to be increased, and the speed of the inverter circuit 1 is allowed to be increased accordingly.

Further in the fifth embodiment, only one common voltage line on a low voltage side and only one common voltage line on a high voltage side are arranged in the inverter circuit 1, and the voltage of the high-voltage line $L_H$ as the voltage line on the high voltage side has the same voltage value ($V_{dd}$) as that of a high voltage of the signal voltage (the input voltage $V_{in}$) applied to the input terminal IN during the drive of the inverter circuit 1. Therefore, it is only necessary for the inverter circuit 1 to have the same resistance to pressure as that of the inverter circuits in related art illustrated in FIGS. 72, 74 and 75, and it is not necessary to increase the resistance to pressure of the inverter circuit 1. Therefore, it is not necessary to use an element with high resistance to pressure in the inverter circuit 1, and there is no decline in yields due to a defect in resistance to pressure; therefore, manufacturing cost is allowed to be kept low.

Moreover, in the fifth embodiment, the inverter circuit 1 includes the minimum number of voltage lines, and as described above, the speed of the inverter circuit 1 is allowed to be increased without increasing the capacity of the capacity element $C_2$. Therefore, for example, in the case where the inverter circuit 1 is used for a scanner or the like in an active matrix organic EL display, an area occupied by the inverter circuit 1 in a peripheral part (a frame) of a display panel is allowed to be reduced, thereby achieving a reduction in the area of the frame.

Sixth Embodiment

Figure 52:
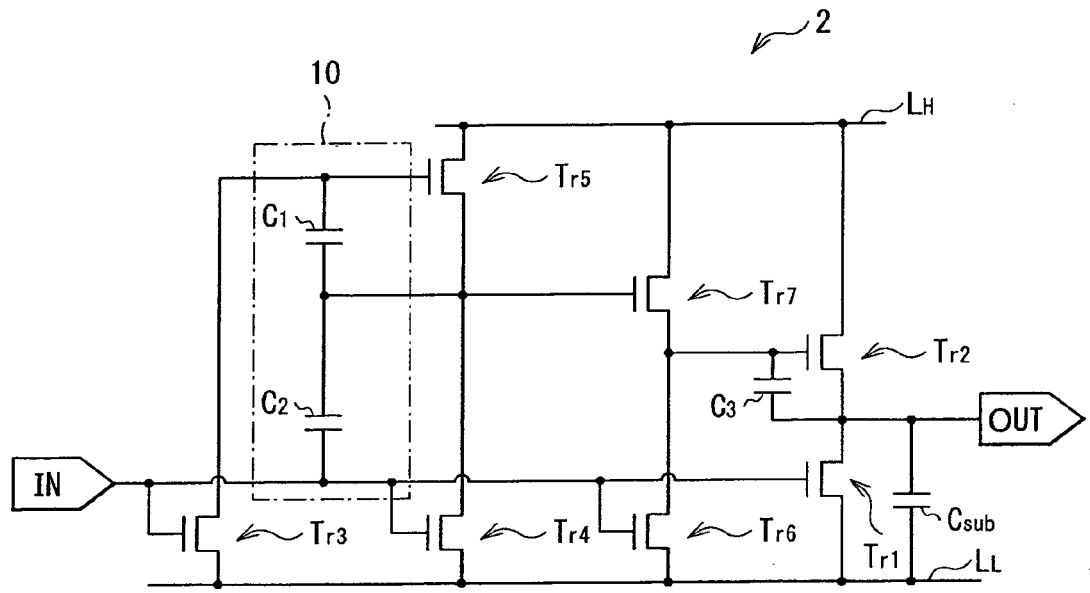
FIG. 52 is a circuit diagram illustrating an example of an inverter circuit according to a sixth embodiment of the disclosure.

FIG. 52 illustrates an example of a whole configuration of an inverter circuit 2 according to a sixth embodiment of the disclosure. As in the case of the inverter circuit 1 according to the fifth embodiment, the inverter circuit 2 outputs, from the output terminal OUT, a pulse signal (for example, refer to the part (B) in FIG. 44) with a substantially inverted signal waveform of a signal waveform (for example, refer to the part (A) in FIG. 44) of a pulse signal applied to the input terminal IN. The configuration of the inverter circuit 2 differs from that of the inverter circuit 1 according to the fifth embodiment of the disclosure in increasing the capacity of the capacity element $C_3$ and providing a subsidiary capacitance $C_{sub}$ between the output terminal OUT and the low-voltage line $L_L$. Hereinafter, first, an issue which may occur in the inverter circuit 1 according to the fifth embodiment will be described, and after that, a characteristic part of the inverter circuit 2 according to the sixth embodiment will be described. Note that the subsidiary capacitance $C_{sub}$ corresponds to a specific example of "a fourth capacity element" in the disclosure.

Issue

Figure 53:
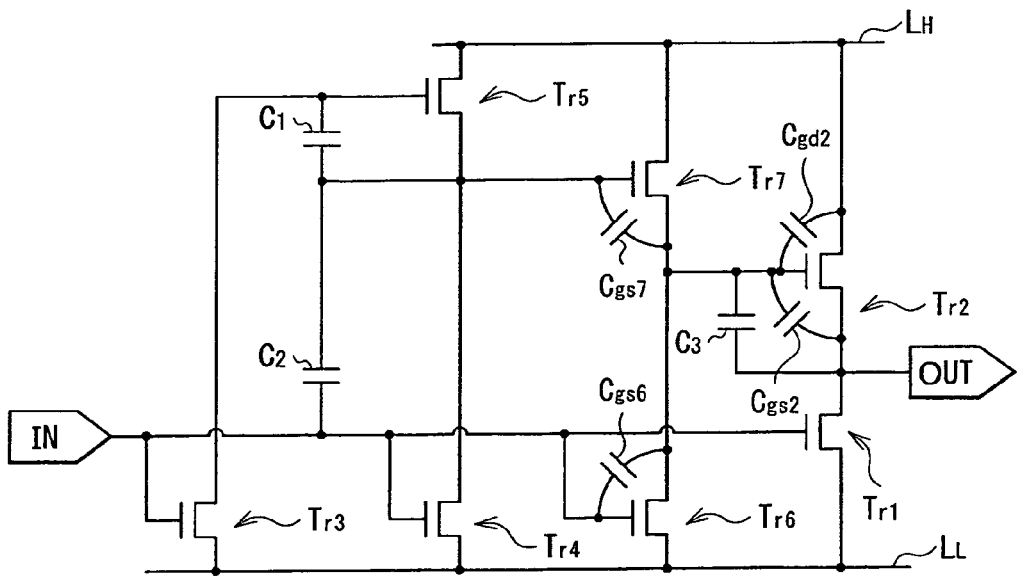
FIG. 53 is a circuit diagram for describing parasitic capacitance of the inverter circuit in FIG. 43.

The gate voltage $V_{g2}$ and the source voltage $V_{s2}$ (the output voltage $V_{out}$) of the transistor $Tr_2$ of the inverter circuit 1 according to the fifth embodiment will be considered below. As described above, the gate voltage $V_{g2}$ of the transistor $Tr_2$ is increased by a current from the transistor $Tr_7$ and an increase in the source voltage $V_{s2}$ of the transistor $Tr_2$ through the capacity element $C_3$. At this time, as the current from the transistor $Tr_7$ is reduced with an increase in the gate voltage $V_{g2}$ of the transistor $Tr_2$, after the transistor $Tr_7$ is turned off, the gate voltage $V_{g2}$ of the transistor $Tr_2$ is increased only by an increase in the source voltage $V_{s2}$ of the transistor $Tr_2$. In the inverter circuit 1, parasitic capacitances $C_{gs2}$ and $C_{gd2}$ as illustrated in FIG. 53 are present in the gate of the transistor $Tr_2$. Therefore, a change amount $\Delta V_g$ of the gate voltage $V_{g2}$ of the transistor $Tr_2$ is changed relative to a change amount $\Delta V$, of the source voltage $V_{s2}$ of the transistor $Tr_2$ at a constant ratio g as illustrated in Mathematical Expression 1. The ratio g is called a bootstrap gain.

Mathematical Expression 1

To increase the speed of the inverter circuit 1, typically, the sizes of the transistors $Tr_1$ and $Tr_2$ outputting the output voltage $V_{out}$ are increased. In the case where the size of the transistor $Tr_1$ is increased, when the input voltage $V_{in}$ is switched (increased) from low ($V_{ss}$) to high ($V_{dd}$), a larger amount of current is allowed to flow between the gate and the source of the transistor $Tr_1$. Therefore, when the size of the transistor $Tr_1$ is increased, the speed of a falling-edge transient of the output voltage $V_{out}$ is increased.

Figure 54:
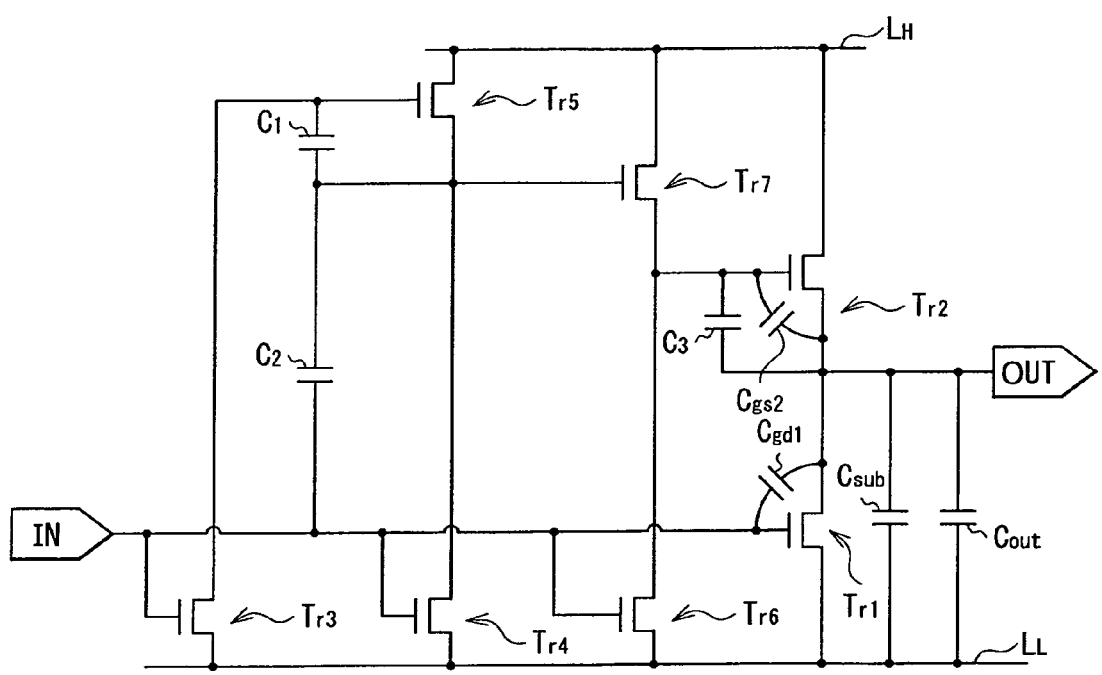
FIG. 54 is a circuit diagram for describing a parasitic capacitance of the inverter circuit in FIG. 52.
Figure 55:
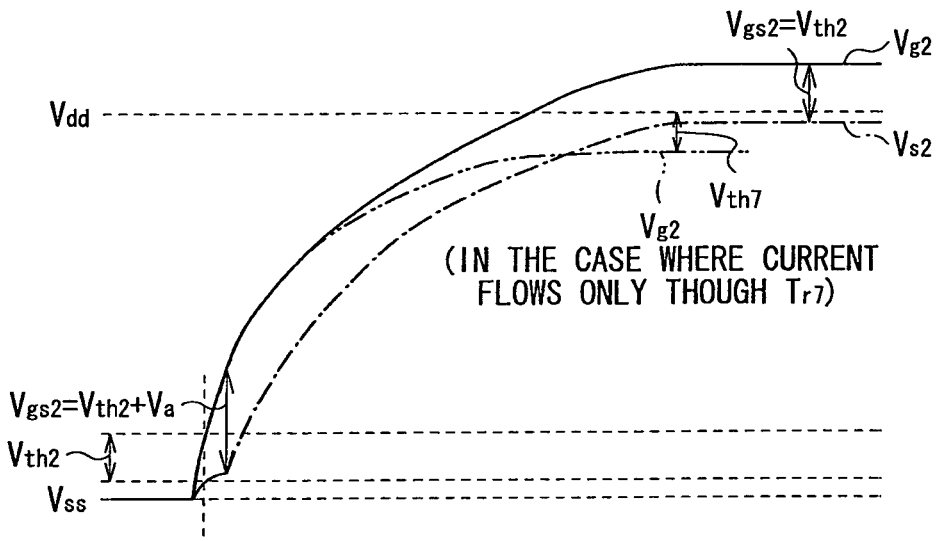
FIG. 55 is a waveform chart for describing an example of an operation of the inverter circuit in FIG. 52.

Next, the case where the size of the transistor $Tr_2$ is increased will be considered below. The transistor $Tr_2$ does not operate directly by the input voltage $V_{in}$, and the transistor $Tr_2$ operates by the current from the transistor $Tr_7$. When the gate voltage $V_{g2}$ of the transistor $Tr_2$ is increased by the transistor $Tr_7$, as illustrated in FIG. 54, coupling is applied to the output terminal OUT through a capacitance $C_{gs2}$ between the gate and the source of the transistor $Tr_2$. The coupling amount (a change amount $\Delta V_s$) is as illustrated in Mathematical Expression 2.

Mathematical Expression 2

A ratio β of the change amount $\Delta V$, to the change amount $\Delta V_g$ is called "input gain". Note that in FIG. 54, a state where a parasitic capacitance $C_{out}$ is generated between the output terminal OUT and the low-voltage line $L_L$.

In the case where the gate-source voltage $V_{gs2}$ of the transistor $Tr_2$ exceeds the threshold voltage $V_{th2}$ thereof by transistor $Tr_7$, a current flows from the transistor $Tr_2$ to increase the output voltage $V_{out}$. In the case where the size of the transistor $Tr_2$ is large, the current drive performance of the transistor $Tr_2$ is high; therefore, when the gate-source voltage $V_{gs2}$ of the transistor $Tr_2$ reaches a voltage $V_{th2}+V_a$, the source voltage $V_{s2}$ of the transistor $Tr_2$ starts to increase. The voltage $V_a$ has a small value, because the size of the transistor $Tr_2$ is large. At this time, a change amount (a gradient in a graph illustrated in FIG. 55) per unit time of the source voltage $V_{s2}$ of the transistor $Tr_2$ relative to a change amount per unit time of the gate voltage $V_{g2}$ of the transistor $Tr_2$ is large, the gate-source voltage $V_{gs2}$ of the transistor $Tr_2$ is reduced with time. Moreover, when the gate voltage $V_{g2}$ of the transistor $Tr_2$ approaches a voltage $V_{dd}-V_{th7}$, the transistor $Tr_2$ allows the gate voltage $V_{g2}$ and the source voltage $V_{s2}$ thereof to be increased by the current through the transistor $Tr_2$. At this time, the gate-source voltage $V_{gs2}$ of the transistor $Tr_2$ is gradually reduced more by the bootstrap gain g.

Therefore, in the case where a voltage $V_a$ has a small value, and the bootstrap gain g is small, ultimately, the gate-source voltage $V_{gs2}$ of the transistor $Tr_2$ reaches the threshold voltage $V_{th2}$ of the transistor $Tr_2$ before the source voltage $V_{s2}$ of the transistor $Tr_2$ reaches the voltage $V_{dd}$. Therefore, the source voltage $V_{s2}$ of the transistor $Tr_2$ is not allowed to increase any more. As a result, the transistor $Tr_2$ is not allowed to output the voltage $V_{dd}$.

Figure 56:
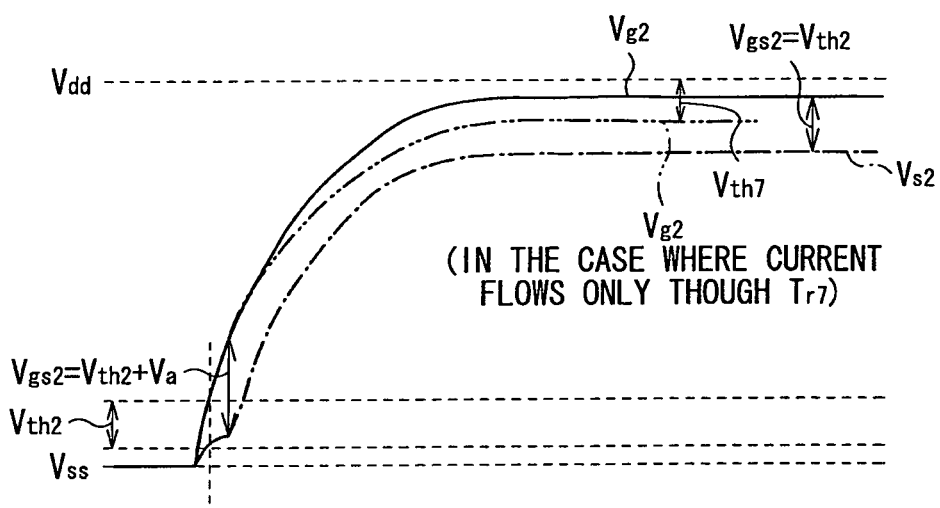
FIG. 56 is a waveform chart for describing another example of the operation of the inverter circuit in FIG. 52.

To solve this issue, it is considered to increase the capacity of the capacity element $C_3$ so as to increase the bootstrap gain g. However, in such a case, an input gain is increased. When the input gain is increased, as illustrated in FIG. 56, in the case where the gate-source voltage $V_{gs2}$ of the transistor $Tr_2$ is equal to or lower than the threshold voltage $V_{th2}$ of the transistor $Tr_2$, a source potential $V_{s2}$ is largely increased in response to a change in the gate voltage $V_{g2}$ of the transistor $Tr_2$. Therefore, the source potential $V_{s2}$ of the transistor $Tr_2$ starts to increase earlier. As a result, the source voltage $V_{s2}$ of the transistor $Tr_2$ starts to increase at a point where a change in the gate voltage $V_{g2}$ of the transistor $Tr_2$ is not so large, and the transistor $Tr_2$ performs threshold correction. In other words, the change amount of the source voltage $V_{s2}$ is larger than the change amount of the gate voltage $V_{g2}$ of the transistor $Tr_2$, and the gate-source voltage $V_{gs2}$ of the transistor $Tr_2$ is increasingly reduced to reach the threshold voltage $V_{th2}$ ultimately. Therefore, also in this case, the transistor $Tr_2$ is not allowed to output the voltage $V_{dd}$.

Inverter circuit 2

On the other hand, in the inverter circuit 2 according to the sixth embodiment, the capacity of the capacity element $C_3$ is increased, and the subsidiary capacitance $C_{sub}$ is further provided between the output terminal OUT and the low-voltage line $L_L$.

In the case where the subsidiary capacitance $C_{sub}$ is provided, as represented by Mathematical Expression 3, the bootstrap gain g is not affected by the subsidiary capacitance $C_{sub}$. On the other hand, as represented by Mathematical Expression 4, as the subsidiary capacitance $C_{sub}$ is put in a denominator, the input gain β is reduced by the subsidiary capacitance $C_{sub}$.

Mathematical Expression 3
Mathematical Expression 4

Figure 57:
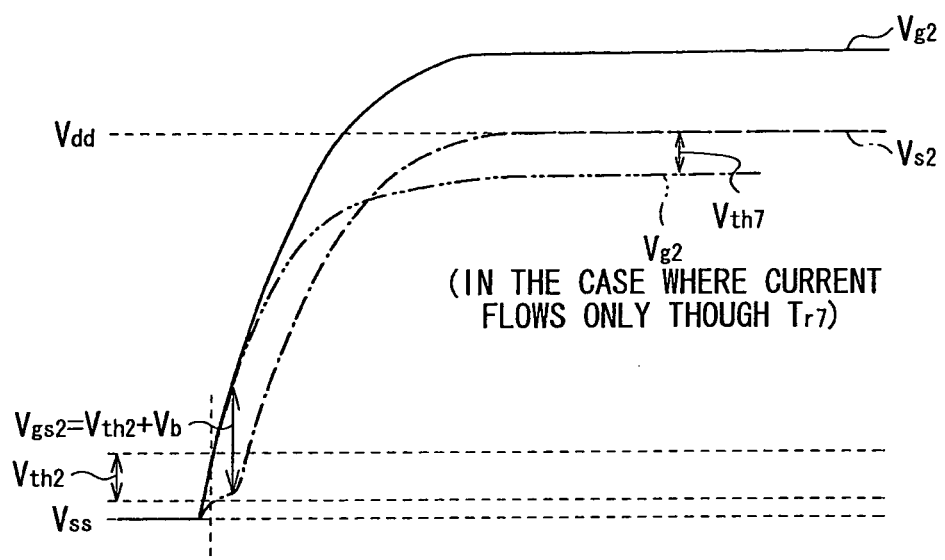
FIG. 57 is a waveform chart for describing still another example of the operation of the inverter circuit in FIG. 52.

Next, the case where the size of the transistor $Tr_2$ is increased in the inverter circuit 2 is considered. When the subsidiary capacitance $C_{sub}$ is provided between the output terminal OUT and the low-voltage line $L_L$, as illustrated in FIG. 57, a point where an increase in the source voltage $V_{s2}$ of the transistor $Tr_2$ starts is delayed. At this time, the gate-source voltage Vgs2 when the increase starts has a value $V_{th2}+V_b$.

In this case, $V_b > V_a$ is established, because compared to the case where the subsidiary capacitance $C_{sub}$ is present and the case where the subsidiary capacitance $C_{sub}$ is not present, a change amount of the source voltage $V_{s2}$ of the transistor $Tr_2$ is smaller in the case where the subsidiary capacitance $C_{sub}$ is present, even if a current with the same magnitude flows. It is because in the case where the subsidiary capacitance $C_{sub}$ is not present, to obtain the same change amount of the source voltage $V_{s2}$ as that in the case where the subsidiary capacitance $C_{sub}$ is present, it is necessary to increase the gate-source voltage $V_{gs2}$ of the transistor $Tr_2$.

Thus, in the inverter circuit 2, the point where the increase in the source voltage $V_{s2}$ starts is delayed to increase the value of a voltage $V_b$. Therefore, even if the gate-source voltage $V_{gs2}$ of the transistor $Tr_2$ is reduced by the current from the transistor $Tr_2$ or the bootstrap gain g, ultimately, the gate-source voltage $V_{gs2}$ of the transistor $Tr_2$ is allowed to keep a larger value than the threshold voltage $V_{th2}$ thereof. As a result, the transistor $Tr_2$ is allowed to output the voltage $V_{dd}$.

Modifications of Fifth and Sixth Embodiments

Figure 58:
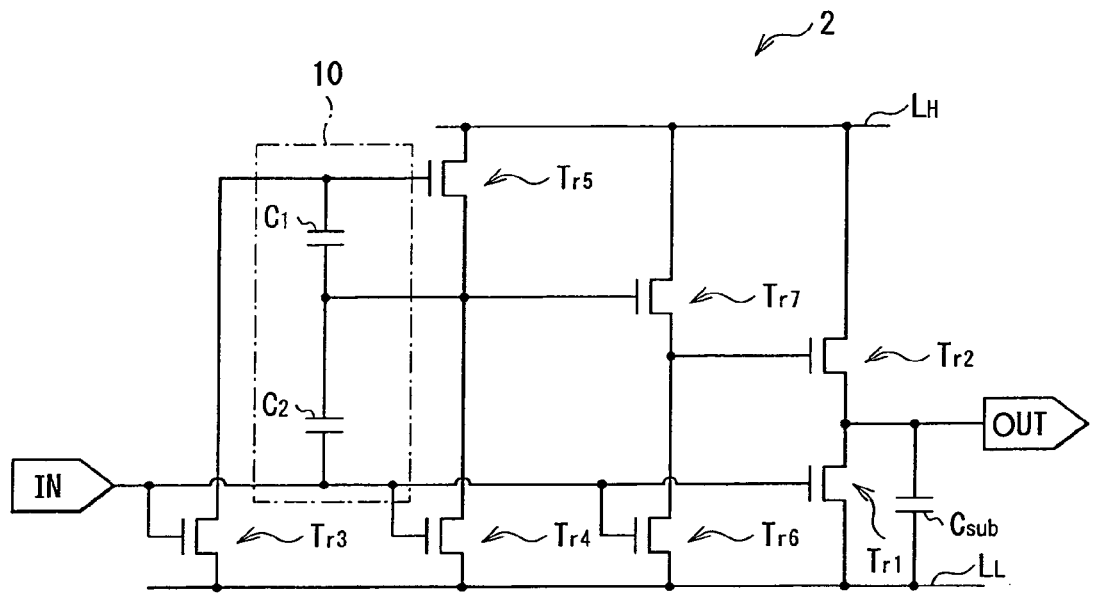
FIG. 58 is a circuit diagram illustrating a modification of the inverter circuit in FIG. 52.

In the sixth embodiment, for example, as illustrated in FIG. 58, the capacity element $C_3$ may be removed. In this case, a parasitic capacitance $C_{gs2}$ is present between the gate and the source of the transistor $Tr_2$, and a bootstrap gain by the parasitic capacitance $C_{gs2}$ is present. Therefore, the gate-source voltage $V_{gs2}$ of the transistor $Tr_2$ is allowed to be increased by providing the subsidiary capacitance $C_{sub}$. As a result, when the input voltage $V_{in}$ is switched (increased) from low ($V_{ss}$) to high ($V_{dd}$), the voltage $V_{dd}$ is allowed to be taken out as the output voltage $V_{out}$.

Figure 59:
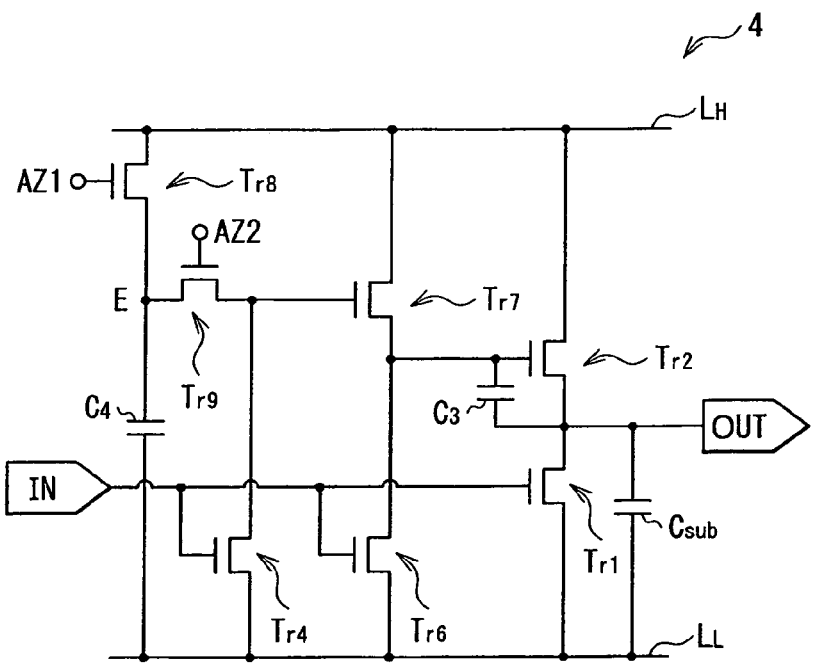
FIG. 59 is a circuit diagram illustrating another modification of the inverter circuit in FIG. 52.

Moreover, in the sixth embodiment, as illustrated in an inverter circuit 4 in FIG. 59, the transistors $Tr_3$ and $Tr_5$ and the capacity elements $C_1$ and $C_2$ are removed, and instead of them, transistors $Tr_8$ and $Tr_9$ and a capacity element $C_4$ may be provided. The inverter circuit 4 inputs a charge held by the capacity element $C_4$ to the gate of the transistor $Tr_7$ to increase the gate voltage $V_{g2}$ of the transistor $Tr_2$, and then outputs the voltage $V_{dd}$ as the output voltage $V_{out}$.

The transistors $Tr_8$ and $Tr_9$ are configured of thin film transistors (TFTs) having channels of the same conduction type, for example, n-channel MOS type TFTs. The transistor $Tr_8$ makes or breaks electrical connection between the high-voltage line $L_H$ and one terminal (a terminal E) not connected to the low-voltage line $L_L$ of the capacity element $C_4$ in response to, for example, a potential difference $V_{gs8}$ between a voltage applied to an input terminal AZ1 and a voltage of the terminal E (or a potential difference corresponding thereto). A gate of the transistor $Tr_8$ is electrically connected to the input terminal AZ1, and one terminal of a source and a drain of the transistor $Tr_8$ is electrically connected to the high-voltage line $L_H$, and the other terminal not connected to the high-voltage line $L_H$ of the transistor $Tr_8$ is electrically connected to the terminal E of the capacity element $C_4$. The transistor $Tr_9$ makes or breaks electrical connection between the source (the terminal E) of the transistor $Tr_8$ and the gate of the transistor $Tr_7$ in response to, for example, a potential difference $V_{gs9}$ between a voltage applied to an input terminal AZ2 and a voltage $V_{s8}$ of the source of the transistor $Tr_8$ (the voltage of the terminal E) (or a potential difference corresponding thereto). A gate of the transistor $Tr_9$ is electrically connected to the input terminal AZ2. One terminal of a source and a drain of the transistor $Tr_9$ is electrically connected to the source (the terminal E) of the transistor $Tr_8$, and the other terminal not connected to the terminal E of the transistor $Tr_9$ is electrically connected to the gate of the transistor $Tr_7$.

Figure 60:
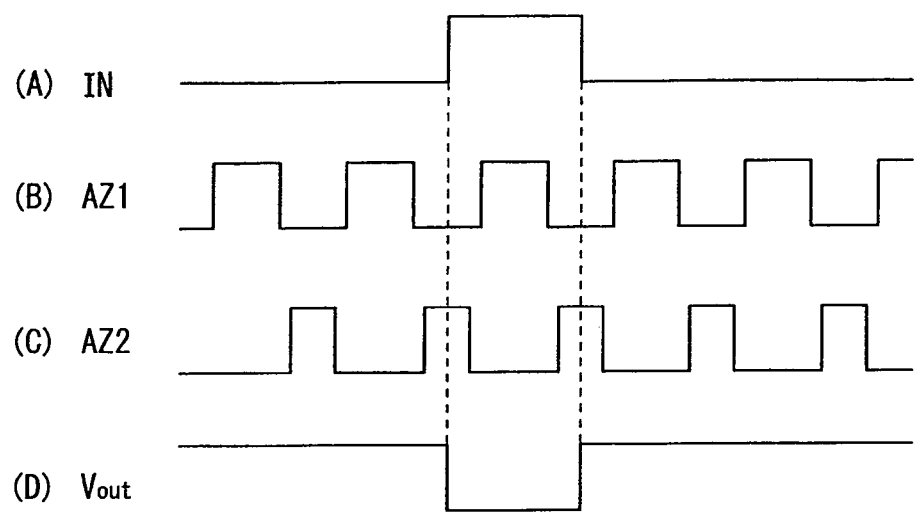
FIG. 60 is a waveform chart for describing an example of an operation of the inverter circuit in FIG. 59.

For example, a pulse signal as illustrated in a part (B) in FIG. 60 is applied to the input terminal AZ1. For example, as illustrated in a part (C) in FIG. 60, a pulse signal with a phase opposite to that of the pulse signal applied to the input terminal AZ1 is applied to the input terminal AZ2. Therefore, the voltage $V_{dd}$ is allowed to be taken out as the output voltage $V_{out}$.

Figure 61:
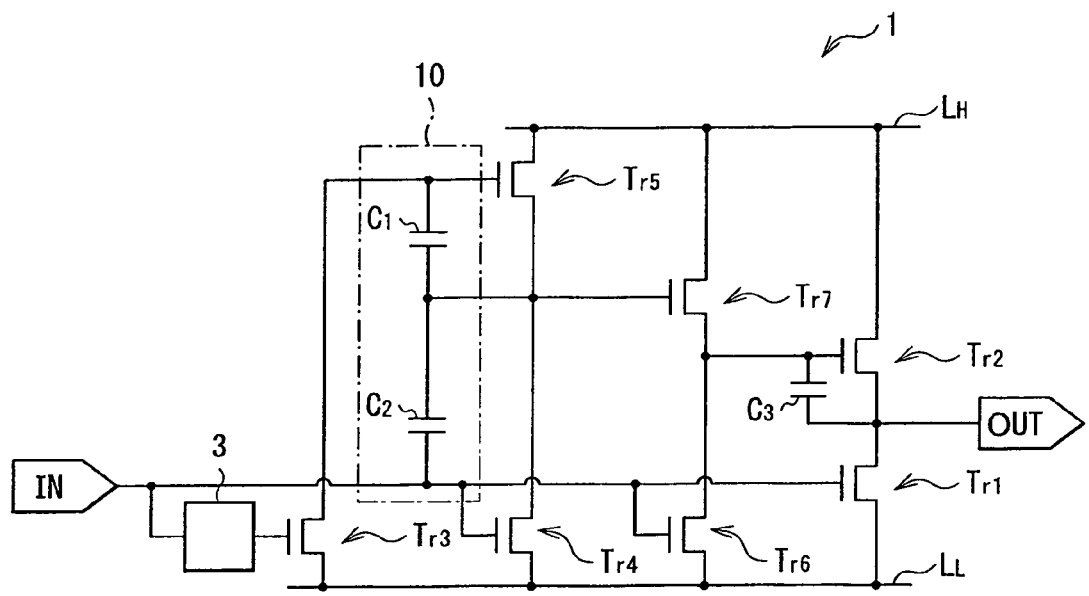
FIG. 61 is a circuit diagram illustrating an example of the inverter circuit in FIG. 43 including a delay element.
Figure 62:
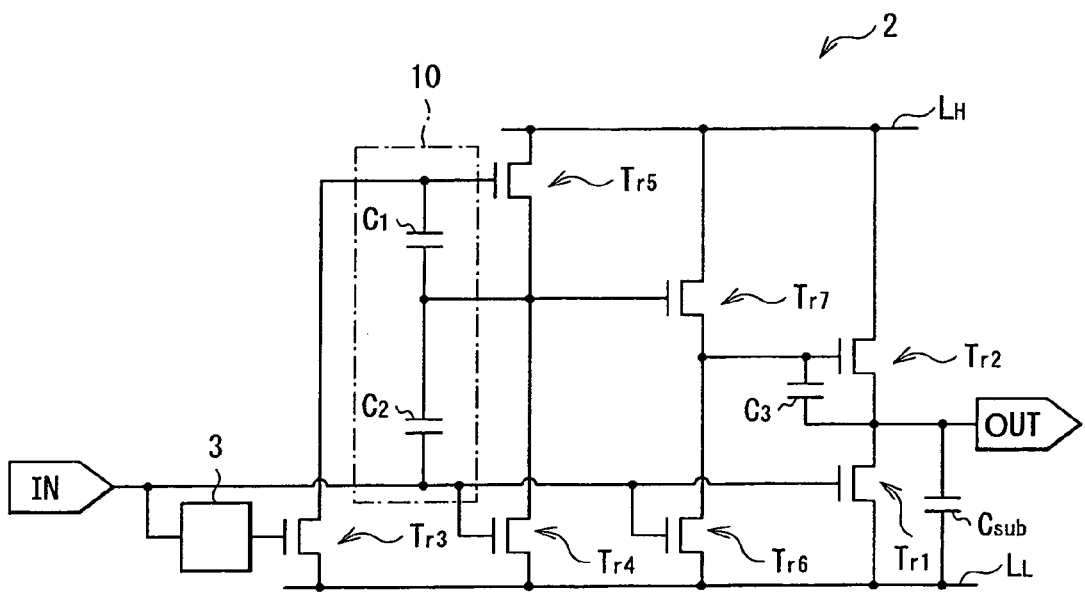
FIG. 62 is a circuit diagram illustrating an example of the inverter circuit in FIG. 52 including a delay element.
Figure 63:
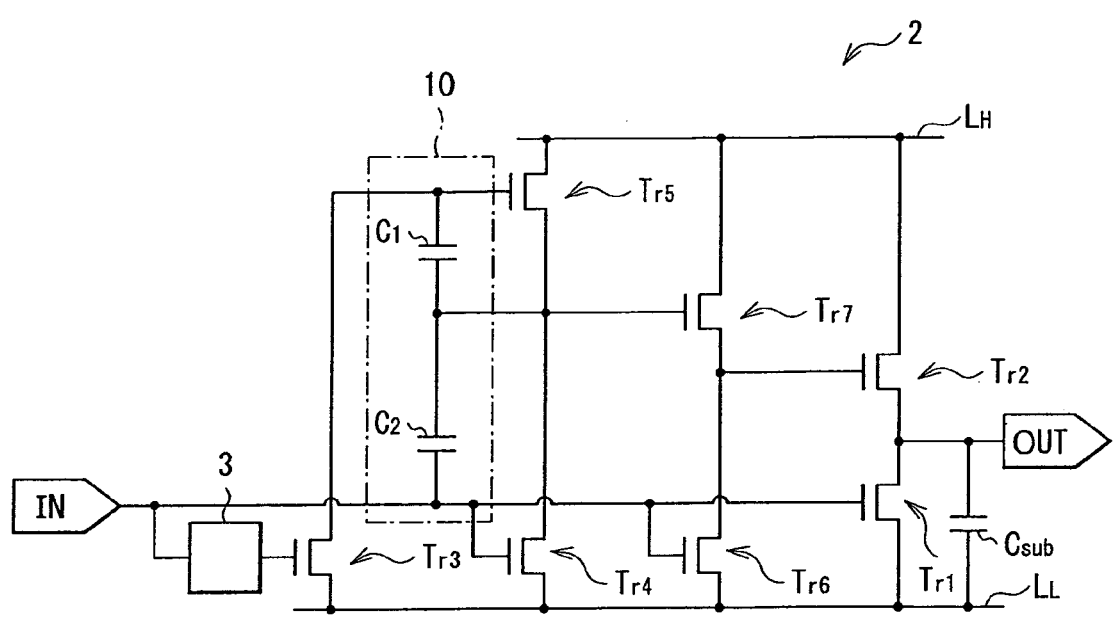
FIG. 63 is a circuit diagram illustrating an example of the inverter circuit in FIG. 58 including a delay element.

Moreover, in the fifth and sixth embodiments, for example, as illustrated in FIGS. 61, 62 and 63, a delay element 3 may be arranged between the input terminal IN and the gate of the transistor $Tr_3$.

The delay element 3 inputs, to the gate of the transistor $Tr_3$, a voltage with a waveform obtained by delaying a voltage waveform of a signal voltage applied to the input terminal IN. For example, the delay element 3 inputs, to the gate of the transistor $Tr_3$, a voltage with a slower falling edge than that of the voltage waveform of the signal voltage applied to the input terminal IN. Note that the delay element 3 may allow not only the falling edge but also the rising edge of the voltage waveform to be slower than that of the voltage waveform of the signal voltage applied to the input terminal IN. However, in this case, the delay element 3 delays the voltage waveform of the signal voltage applied to the input terminal IN so that its falling edge is slower than its rising edge.

Figure 64A:
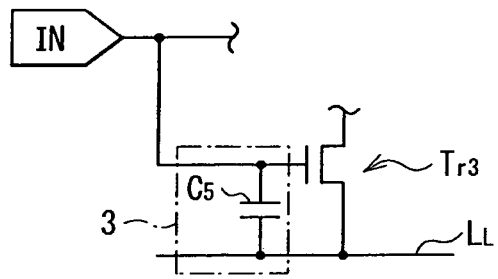
FIGS. 64A to 64D are circuit diagrams illustrating variations of the delay element in FIGS. 61 to 63.

The delay element 3 has any of circuit configurations illustrated in FIGS. 64A to 64D. In FIG. 64A, the delay element 3 includes a capacity element $C_5$. An end of the capacity element $C_5$ is electrically connected to the gate of the transistor $Tr_3$, and the other end of the capacity element $C_5$ is electrically connected to the low-voltage line $L_L$.

Figure 64B:
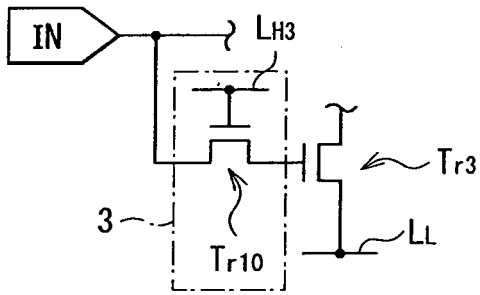

In FIG. 64B, the delay element 3 includes a transistor $Tr_{10}$. The transistor $Tr_{10}$ is configured of a transistor having channels of same conduction type as that of the transistor $Tr_1$ or the like, for example, an n-channel MOS type TFT. A source of the transistor $Tr_{10}$ is electrically connected to the gate of the transistor $Tr_3$, and a drain of the transistor $Tr_{10}$ is electrically connected to the input terminal IN. A gate of the transistor $Tr_{10}$ is electrically connected to a high-voltage line $L_{H3}$. The high-voltage line $L_{H3}$ is electrically connected to a power supply (not illustrated) outputting a pulse signal allowing the transistor $Tr_{10}$ to perform an ON/OFF operation.

Figure 64C:
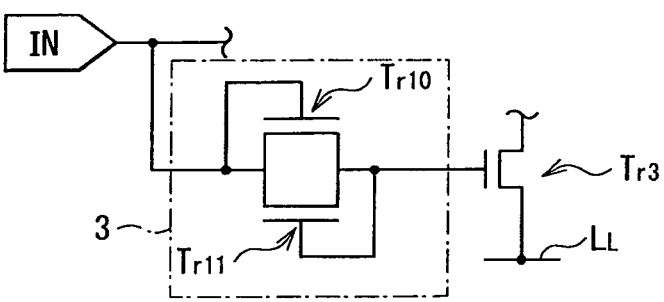

In FIG. 64C, the delay element 3 includes the above-described transistor $Tr_{10}$ and a transistor $Tr_{11}$. The transistor $Tr_{11}$ is configured of a transistor having channels of same conduction type as that of the transistor $Tr_1$ or the like, for example, an n-channel MOS type TFT. A gate and a source of the transistor $Tr_{11}$ are electrically connected to the gate of the transistor $Tr_3$, and a drain of the transistor $Tr_{11}$ is electrically connected to the input terminal IN.

Figure 64D:
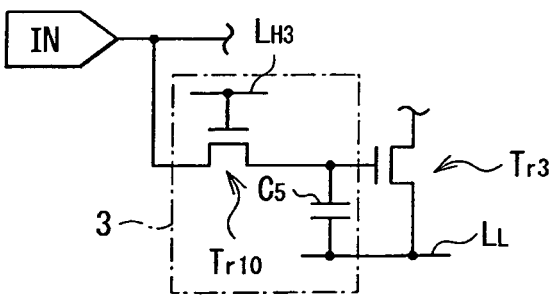

In FIG. 64D, the delay element 3 includes the above-described transistor $Tr_{10}$ and the above-described capacity element $C_5$.

Operation and Effects

Figure 65:
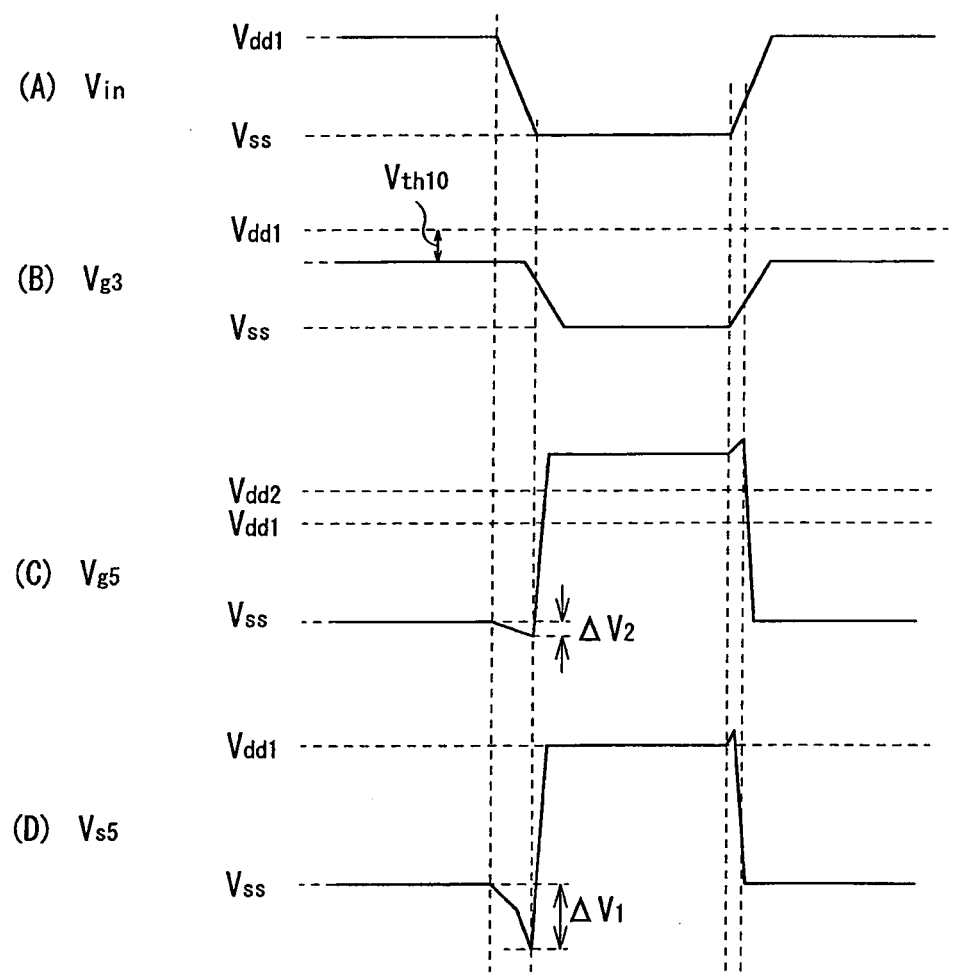
FIG. 65 is a waveform chart illustrating an example of an operation of the inverter circuits in FIGS. 61 to 63.

FIG. 65 illustrates an example of the operation of the inverter circuit according to any of the modifications. Note that FIG. 65 illustrates waveforms in the case where a circuit configuration illustrated in FIG. 64D is used as the delay element 3. The basic operations of the inverter circuits according to the modifications are the same as that illustrated in FIGS. 45 to 50. A different operation from that illustrated in FIGS. 45 to 50 is performed when the input voltage $V_{in}$ is switched (reduced) from high ($V_{dd}$) to low ($V_{ss}$) and when the input voltage $V_{in}$ is switched (increased) from low ($V_{ss}$) to high ($V_{dd}$).

When the input voltage $V_{in}$ is switched (reduced) from high ($V_{dd}$) to low ($V_{ss}$), the gate voltages of the transistors $Tr_3$ and $Tr_4$ are changed from the voltage $V_{dd}$ to the voltage $V_{ss}$. In the inverter circuits 1 and 2 according to the fifth and sixth embodiments, the voltage change causes a voltage change by $\Delta V_1$ in the source of the transistor $Tr_5$ through the capacity element $C_2$, and further, causes a voltage change by $\Delta V_2$ in the gate of the transistor $Tr_5$ through the capacity elements $C_1$ and $C_2$. In this case, a coupling amount of $\Delta V_2$ is applied to the gate of the transistor $Tr_5$, because the gate voltage $V_{g3}$ of the transistor $Tr_3$ is reduced from the voltage $V_{dd}$ to the voltage $V_{ss}$, and as a result, the on-resistance of the transistor $Tr_3$ is gradually increased to slow a voltage transient for charging the gate of the transistor $Tr_5$ to the voltage $V_{ss}$. In other words, the coupling amount of $\Delta V_2$ is applied to the gate of the transistor $Tr_5$, because the transistor $Tr_3$ is switched from on to off at a timing of applying coupling.

Figure 66:
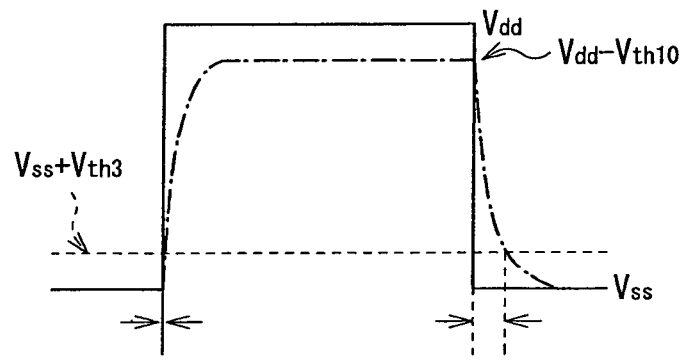
FIG. 66 is a waveform chart illustrating an example of input/output waveforms of the delay element in FIGS. 61 to 63.

On the other hand, in the modifications, a signal voltage as illustrated in FIG. 66 obtained by delaying the signal voltage applied to the input terminal IN by the delay element 3 is applied to the gate of the transistor $Tr_3$. Therefore, an off point (a point of switching from on to off) of the transistor $Tr_3$ is delayed, compared to the case where the input voltage $V_{in}$ is applied as is to the gate of the transistor $Tr_3$. In other words, the transistor $Tr_3$ is still on at the timing of applying coupling through the capacity element $C_2$ (refer to FIG. 67). Therefore, ultimately, the coupling amount ($\Delta V_2$) applied to the gate of the transistor $Tr_5$ is allowed to be reduced to be smaller than that in related art, and a gate-source voltage $V_{gs5}$ of the transistor $Tr_5$ is allowed to be increased. As a result, the speed of the inverter circuit is allowed to be increased.

Figure 67:
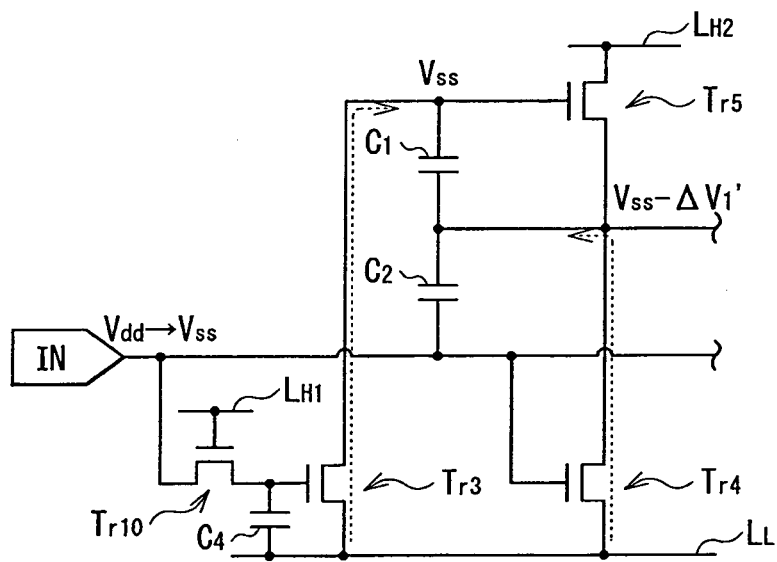
FIG. 67 is a circuit diagram for describing an example of an operation of the inverter circuits in FIGS. 61 to 63.

In the modifications, even in the case where the input voltage $V_{in}$ is switched (increased) from low ($V_{ss}$) to high ($V_{dd}$), a signal voltage as illustrated in FIG. 66 obtained by delaying the signal voltage applied to the input terminal IN by the delay element 3 is applied to the gate of the transistor $Tr_3$. Therefore, the off point of the transistor $Tr_3$ is delayed, and the transistor $Tr_3$ is turned on after the transistor $Tr_1$ is turned on, and there is a possibility that a current (a through current) flows from the high-voltage line $L_H$ to the low-voltage line $L_L$ in a state where the output voltage $V_{out}$ is switched. However, when an operation point at which the transistor $Tr_3$ is turned on and the waveform of the signal voltage applied to the gate of the transistor $Tr_3$ are considered, even though the signal voltage applied to the gate of the transistor $Tr_3$ is delayed, the time of turning the transistor $Tr_3$ on is hardly changed at the rising edge as illustrated in FIG. 67, and on the other hand, the time of turning the transistor $Tr_3$ off is largely changed at the falling edge. Therefore, a period where the above-described through current flows is extremely short, and the power consumption of the inverter circuits according to the modifications is not much different from that of the inverter circuits 1 and 2.

In the fifth and sixth embodiments, coupling caused by a change in the input voltage $V_{in}$ is applied to the source and the gate of the transistor $Tr_5$ so that the gate-source voltage $V_{gs5}$ of the transistor $Tr_5$ has a value equal to or higher than the threshold voltage $V_{th5}$ of the transistor $Tr_5$ with use of a difference in voltage transient between the source and the gate of the transistor $Tr_5$. At this time, the output terminal OUT outputs the voltage of the high-voltage line $L_H$ as the output voltage $V_{out}$, but the voltage transient of the output terminal OUT is highly dependent on the gate-source voltage $V_{gs2}$ of the transistor $Tr_2$. In other words, in the case where the gate-source voltage $V_{gs2}$ of the transistor $Tr_2$ is rapidly increased, the output voltage $V_{out}$ rapidly rises, and in the case where the gate-source voltage $V_{gs2}$ of the transistor $Tr_2$ is gradually increased, the output voltage $V_{out}$ gradually rises.

Therefore, to increase the speed of the inverter circuit, it is necessary for the gate-source voltage $V_{gs2}$ of the transistor $Tr_2$ to rapidly rise, as a method of doing so, for example, it is considered to increase the capacity of the capacity element $C_2$. However, in the case where the capacity of the capacity element $C_2$ is increased, an area occupied by the inverter circuit is increased. As a result, for example, in the case where the inverter circuit including the capacity element $C_2$ with a larger capacity is used for a scanner or the like in an organic EL display, an area occupied by the inverter circuit in a peripheral part (a frame) of a display panel may be increased to interfere with a reduction in the area of the frame. Moreover, an increase in the capacity of the capacity element $C_2$ causes a larger voltage change than $\Delta V_1$ in the source (the output terminal OUT) of the transistor $Tr_2$, thereby causing a larger voltage change than $\Delta V_2$ in the gate of the transistor $Tr_2$. As a result, even though the capacity of the capacity element $C_2$ is increased, the gate-source voltage $V_{gs2}$ of the transistor $Tr_2$ has a value not much different from $\Delta V_1 - \Delta V_2$; therefore, an increase in the capacity of the capacity element $C_2$ does not much contribute to an increase in the speed of the inverter circuit 1.

On the other hand, in the modifications, the signal voltage as illustrated in FIG. 66 obtained by delaying the signal voltage applied to the input terminal IN by the delay element 3 is applied to the gate of the transistor $Tr_1$. Therefore, the speed of the inverter circuit is allowed to be increased without increasing the capacity of the capacity element $C_2$.

Moreover, in the fifth and sixth embodiments and the modifications thereof, the transistors $Tr_1$ to $Tr_{11}$ are configured of the n-channel MOS type TFTs, but they may be configured of, for example, p-channel MOS type TFTs. However, in this case, the high-voltage line $L_H$ is replaced with the low-voltage line $L_L$, and the high-voltage line $L_H$ is replaced with the low-voltage line $L_L$. Moreover, a transient response when the transistors $Tr_1$ to $Tr_{11}$ is switched (increased) from low to high and a transient response when the transistors $Tr_1$ to $Tr_{11}$ is switched (reduced) from high to low are opposite to each other.

APPLICATION EXAMPLE

Figure 68:
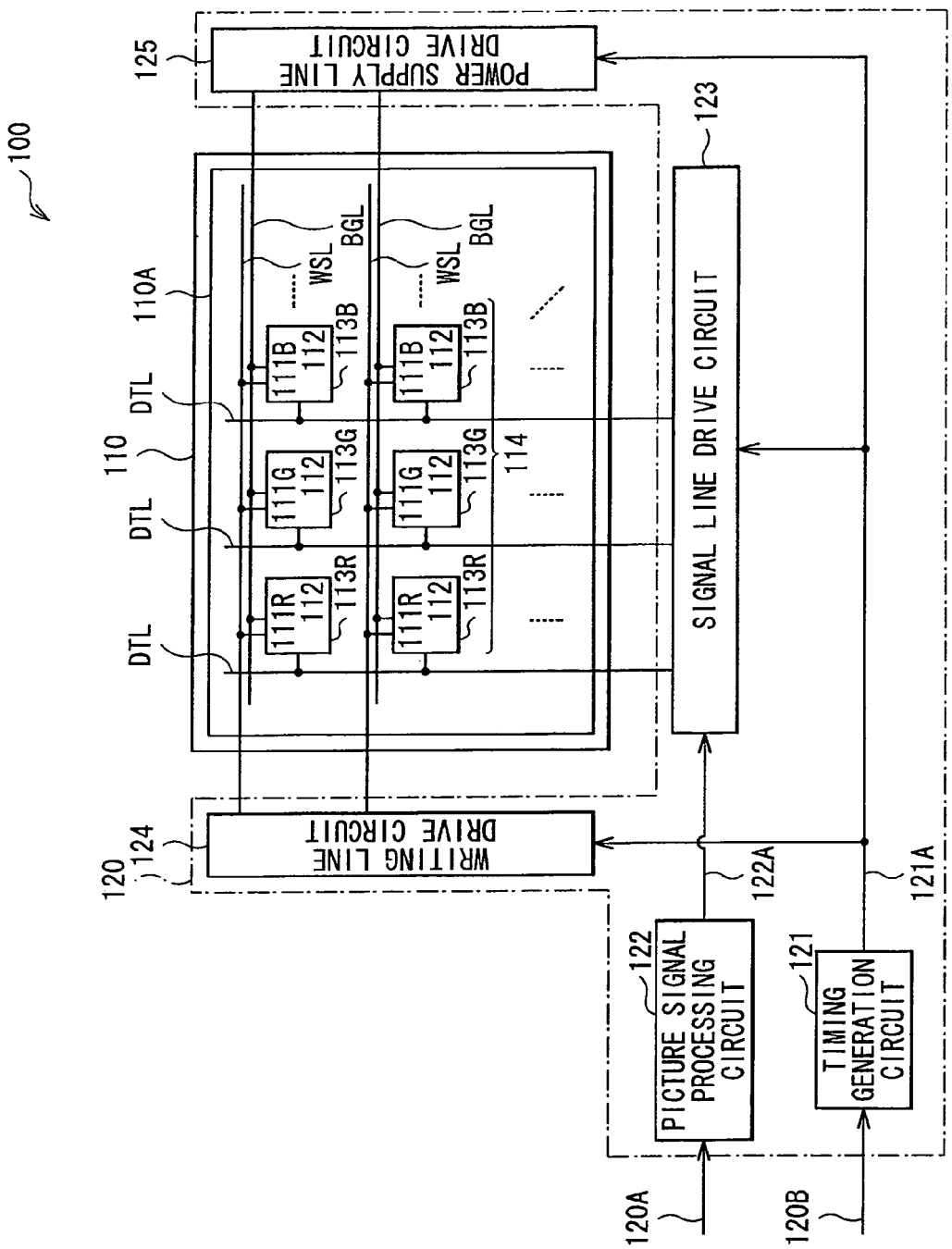
FIG. 68 is a schematic view of a display as an application example of the inverter circuit according to any of the above-described embodiments and modifications thereof.

FIG. 68 illustrates an example of a whole configuration of a display 100 as an application example of the inverter circuits 1, 2 and 4 according to the above-described embodiments and the modifications thereof. The display 100 includes, for example, a display panel 110 (a display section) and a drive circuit 120 (a drive section).

Display Panel 110

The display panel 110 includes a display region 110A in which three kinds of organic EL elements 111R, 111G and 111B emitting light of different colors are two-dimensionally arranged. The display region 110A is a region where a picture is displayed with use of light emitted from the organic EL elements 111R, 111G and 111B. The organic EL element 111R is an organic EL element emitting red light, the organic EL element 111G is an organic EL element emitting green light, and the organic EL element 111B is an organic EL element emitting blue light. Note that the organic EL elements 111R, 111G and 111B are collectively called organic EL elements 111 as necessary.

Display Region 110A

Figure 69:
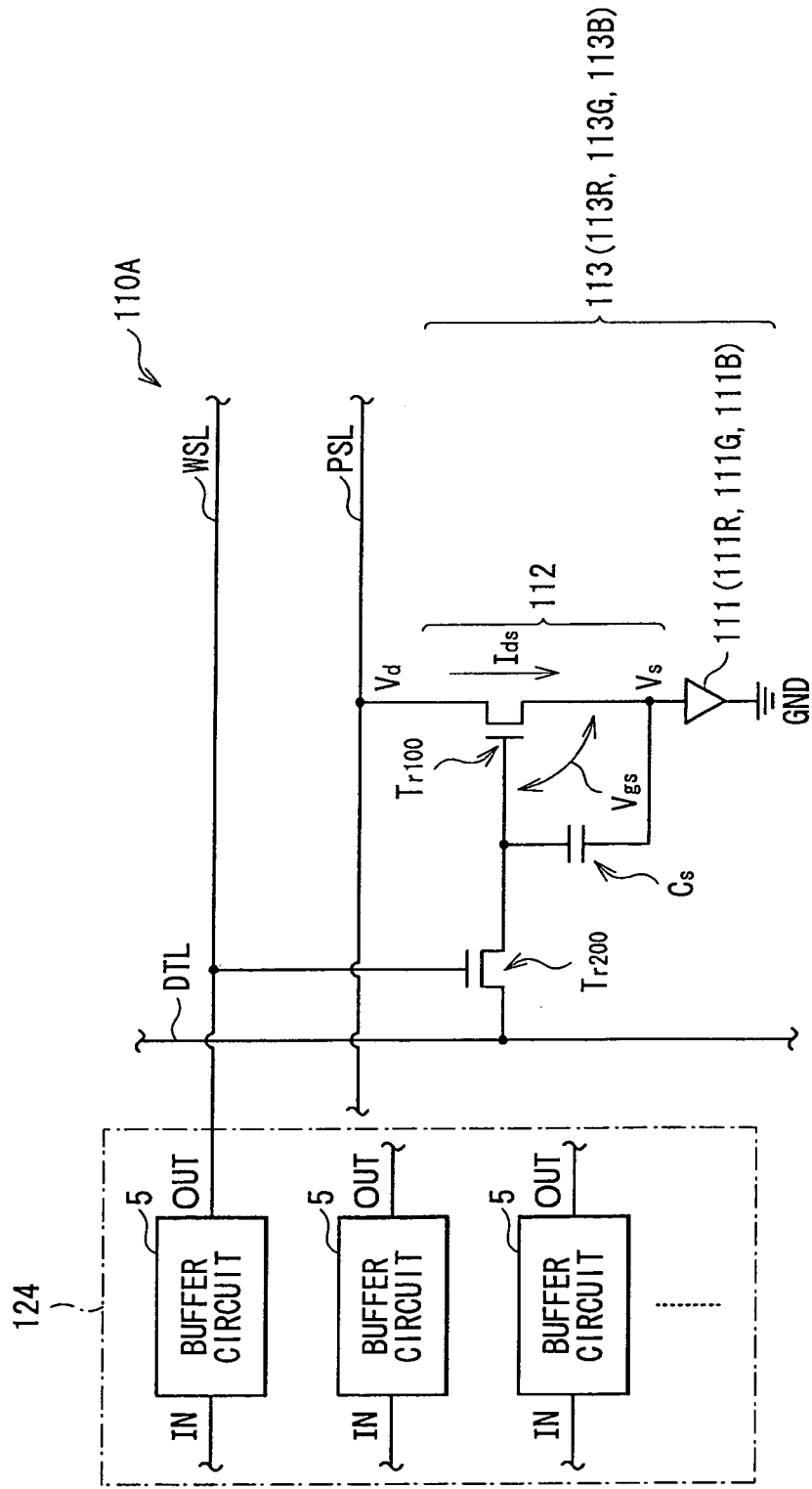
FIG. 69 is a circuit diagram illustrating an example of a writing line drive circuit and a pixel circuit in FIG. 68.

FIG. 69 illustrates an example of a circuit configuration in the display region 10A with an example of a writing line drive circuit 124 which will be described later. In the display region 110A, a plurality of pixel circuits 112 are two-dimensionally arranged so as to be paired with the organic EL elements 111, respectively. In the application example, a pair of the organic EL element 111 and the pixel circuit 112 configures one pixel 113. More specifically, as illustrated in FIG. 68, a pair of the organic EL element 111R and the pixel circuit 112 configures one red pixel 113R, a pair of the organic EL element 111G and the pixel circuit 112 configures one green pixel 113G, and a pair of the organic EL element 111B and the pixel circuit 112 configures one blue pixel 113B. Moreover, three adjacent pixels 113R, 113G and 113B configure one display pixel 114.

Each pixel circuit 112 includes, for example, a driving transistor $Tr_{100}$ controlling a current flowing through the organic EL element 111, a writing transistor $Tr_{200}$ writing a voltage of a signal line DTL to the driving transistor $Tr_{100}$, and a retention capacitor Cs. In other words, each pixel circuit 112 has a 2Tr1C circuit configuration. The driving transistor $Tr_{100}$ and the writing transistor $Tr_{200}$ each are configured of, for example, an n-channel MOS type thin film transistor (TFT). The driving transistor $Tr_{100}$ or the writing transistor $Tr_{200}$ may be configured of, for example, a p-channel MOS type TFT.

In the display region 110A, a plurality of writing lines WSL (scanning lines) are arranged in rows, and a plurality of signal lines DTL are arranged in columns. In the display region 110A, a plurality of power supply lines PSL (members to which a power supply voltage is supplied) are arranged in rows along the writing lines WSL. One organic EL element 111 is arranged around an intersection of each of the signal lines DTL and each of the writing lines WSL. Each of the signal lines DTL is connected to an output end (not illustrated) of a signal line drive circuit 123 which will be described later and one of a drain electrode and a source electrode (both not illustrated) of the writing transistor $Tr_{200}$. Each of the writing lines WSL is connected to an output end (not illustrated) of a writing line drive circuit 124 which will be described later and a gate electrode (not illustrated) of the writing transistor $Tr_{200}$. Each of the power supply lines PSL is connected to an output end (not illustrated) of a power supply line drive circuit 125 which will be described later and one of a drain electrode and a source electrode (both not illustrated) of the driving transistor $Tr_{100}$. The other which is not connected to the signal line DTL of the drain electrode and the source electrode (both not illustrated) of the writing transistor $Tr_{100}$ is connected to a gate electrode (not illustrated) of the driving transistor $Tr_{100}$ and an end of the retention capacitor $C_s$. The other which is not connected to the power supply line PSL of the drain electrode and the source electrode (both not illustrated) of the driving transistor $Tr_{100}$ and the other end of retention capacitor $C_s$ are connected to an anode electrode (not illustrated) of the organic EL element 111. A cathode electrode (not illustrated) of the organic EL element 111 is connected to, for example, a ground line GND.

Drive Circuit 120

Next, each circuit in the drive circuit 120 will be described referring to FIGS. 68 and 69. The drive circuit 120 includes a timing generation circuit 121, a picture signal processing circuit 122, the signal line drive circuit 123, the writing line drive circuit 124 and the power supply line drive circuit 125.

The timing generation circuit 121 controls the picture signal processing circuit 122, the signal line drive circuit 123, the writing line drive circuit 124 and the power supply line drive circuit 125 to operate in conjunction with one another. The timing generation circuit 21 outputs a control signal 121A to each of the above-described circuits in response to (in synchronization with), for example, a synchronization signal 120B entered externally.

The picture signal processing circuit 122 performs predetermined correction on the picture signal 120A entered externally, and outputs a corrected picture signal 122A to the signal line drive circuit 123. Examples of the predetermined correction include gamma correction and overdrive correction.

The signal line drive circuit 123 applies the picture signal 122A (a signal voltage $V_{sig}$) entered from the picture signal processing circuit 122 to each of the signal lines DTL in response to (in synchronization with) the input of the control signal 121A so as to write the picture signal 122A to selected pixels 113. Note that writing means applying a predetermined voltage to a gate of the driving transistor $Tr_{100}$.

The signal line drive circuit 123 is configured by including, for example, a shift register (not illustrated), and includes buffer circuits (not illustrated) corresponding to columns of pixels 113, respectively. The signal line drive circuit 123 is allowed to output two kinds of voltages ($V_{ofs}$ and $V_{sig}$) to each of the signal lines DTL in response to (in synchronization with) the input of the control signal 121A. More specifically, the signal line drive circuit 123 sequentially supplies two kinds of voltages ($V_{ofs}$ and $V_{sig}$) to pixels 113 selected by the wiring line drive circuit 124 through the signal lines DTL connected to the pixels 113.

In this case, an offset voltage $V_{ofs}$ has a constant voltage value irrespective of the value of a signal voltage $V_{sig}$. Moreover, the signal voltage $V_{sig}$ has a voltage value corresponding to the picture signal 122A. The minimum voltage of the signal voltage $V_{sig}$ is lower than the offset voltage $V_{ofs}$, and the maximum voltage of the signal voltage $V_{sig}$ is higher than offset voltage $V_{ofs}$.

The writing line drive circuit 124 is configured by including, for example, a shift register (not illustrated), and includes buffer circuits 5 corresponding to rows of pixels 113, respectively. The buffer circuits 5 each are configured of a plurality of the above-described inverter circuits 1, 2 or 4, and outputs a pulse signal with substantially the same phase as that of a pulse signal applied to an input end thereof to an output end thereof. The writing line drive circuit 124 is allowed to output two kinds of voltages ($V_{dd}$ and $V_{ss}$) to each of the wiring lines WSL in response to (in synchronization with) the input of the control signal 121A. More specifically, the writing line drive circuit 124 supplies two kinds of voltages ($V_{dd}$ and $V_{ss}$) to pixels 113 to be driven through the writing lines WSL connected to the pixels 113 so as to control the writing transistor $Tr_{200}$.

In this case, the voltage $V_{dd}$ has a value equal to or higher than an on-voltage of the writing transistor $Tr_{200}$. The voltage $V_{dd}$ is a voltage value generated from the writing line drive circuit 124 during light extinction which will be described later or during threshold correction. The voltage $V_{ss}$ has a lower value than the on-voltage of the writing transistor $Tr_{200}$ and the voltage $V_{dd}$.

The power supply line drive circuit 125 is configured by including, for example, a shift register (not illustrated), and includes buffer circuits (not illustrated) corresponding to the rows of the pixels 113, respectively. The power supply line drive circuit 125 is allowed to output two kinds of voltages ($V_{ccH}$ and $V_{ccL}$) in response to (in synchronization with) the input of the control signal 121A. More specifically, the power supply line drive circuit 125 supplies two kinds of voltages ($V_{ccH}$ and $V_{ccL}$) to pixels 113 to be driven through the power supply lines PSL connected to the pixels 113 to control light emission and extinction of the organic EL elements 111.

In this case, the voltage $V_{ccL}$ has a lower voltage value than a voltage ($V_{el}+V_{ca}$) which is the sum of a threshold voltage $V_{el}$ of the organic EL element 111 and a voltage $V_{ca}$ of a cathode of the organic EL element 111. Moreover, the voltage $V_{ccH}$ has a voltage value equal to or higher than the voltage ($V_{el}+V_{ca}$).

Next, an example of the operation (operation from light extinction to light emission) of the display 100 will be described below. In the application example, to maintain light emission luminance of the organic EL elements 111 constant even if the threshold voltage $V_{th}$ or the mobility μ of the driving transistor $Tr_{100}$ temporally changes, a correction operation on a change in the threshold voltage $V_{th}$ or the mobility μ is incorporated.

Figure 70:
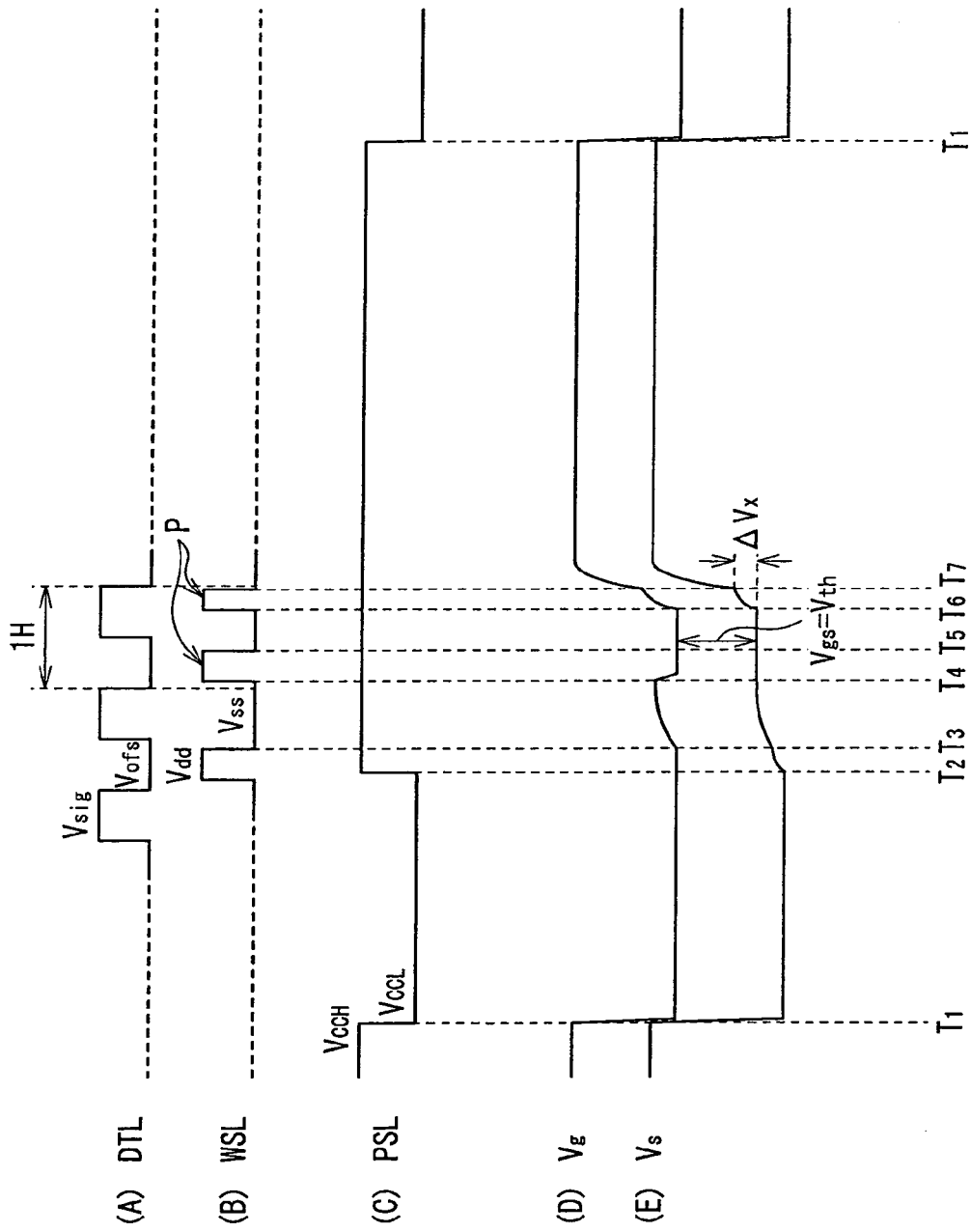
FIG. 70 is a waveform chart illustrating an example of an operation of the display in FIG. 68.
Figure 71:
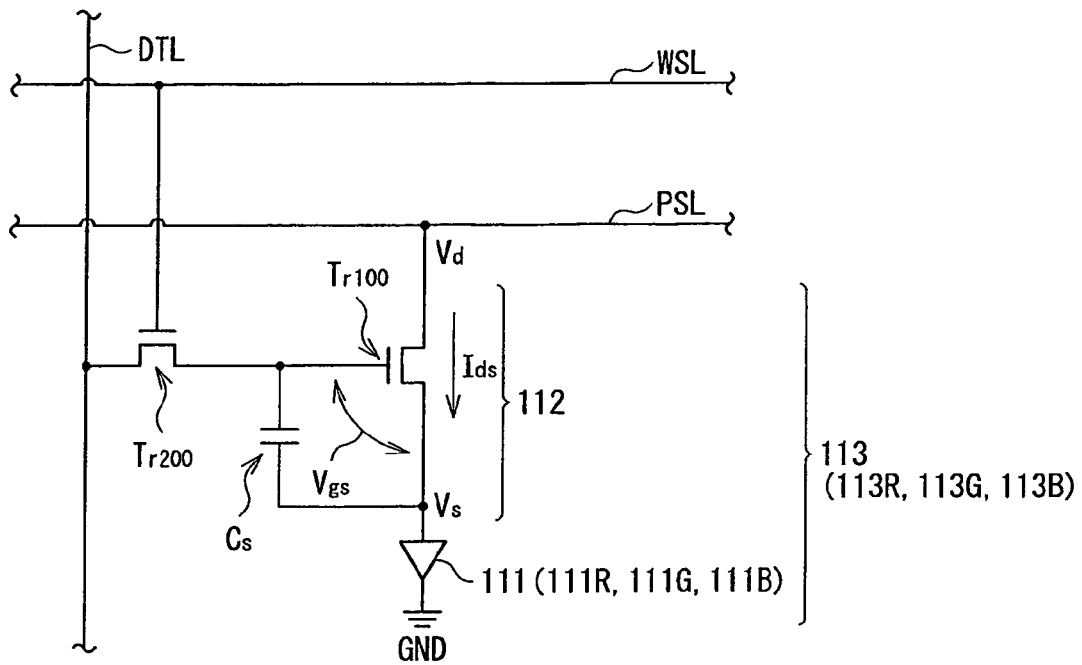
FIG. 71 is a circuit diagram illustrating an example of a pixel circuit of a display in related art.

FIG. 70 illustrates an example of voltage waveforms applied to the pixel circuit 112 and an example of changes in the gate voltage $V_g$ and the source voltage $V_s$ of the driving transistor $Tr_{100}$. A part (A) in FIG. 70 illustrates a state where the signal voltage $V_{sig}$ and the offset voltage $V_{ofs}$ are applied to the signal line DTL. A part (B) in FIG. 70 illustrates a state where the voltage $V_{dd}$ turning the writing transistor $Tr_{200}$ on and the voltage $V_{ss}$ turning the writing transistor $Tr_{200}$ off are applied to the writing line WSL. A part (C) in FIG. 70 illustrates a state where the voltage $V_{ccH}$ and the voltage $V_{ccL}$ are applied to the power supply line PSL. Moreover, parts (D) and (E) in FIG. 70 illustrate states where the gate voltage $V_g$ and the source voltage $V_s$ of the driving transistor $Tr_{100}$ are momentarily changed with the application of voltages to the power supply line PSL, the signal line DTL and the writing line WSL.

$V_{th}$ Correction Preparation Period

First, preparation for $V_{th}$ correction is made. More specifically, when the voltage of the writing line WSL is at the voltage $V_{off}$ and the voltage of the power supply line DSL is at the voltage $V_{ccH}$ (that is, when the organic EL element 111 emits light), the power source line drive circuit 125 reduces the voltage of the power source line DSL from the voltage $V_{ccH}$ to the voltage $V_{ccL}$ ($T_1$). Then, the source voltage $V_s$ is changed to the voltage $V_{ccL}$ to turn the organic EL element 111 off. After that, when the voltage of the signal line DTL is at the voltage $V_{ofs}$, the writing line drive circuit 124 increases the voltage of the writing line WSL from the voltage $V_{off}$ to the voltage $V_{on}$ to change the voltage of the gate of the driving transistor $Tr_{100}$ to the voltage $V_{ofs}$.

First $V_{th}$ Correction Period

Next, the $V_{th}$ correction is performed. More specifically, while the writing transistor $Tr_{200}$ is on and the voltage of the signal line DTL is at the voltage $V_{ofs}$, the power source line drive circuit 125 increases the voltage of the power source line DSL from the voltage $V_{ccL}$ to the voltage $V_{ccH}$ ($T_2$). Then, a current $I_{ds}$ flows between the drain and the source of the driving transistor $Tr_{100}$, and the source voltage $V_s$ is increased. After that, before the signal line drive circuit 123 switches the voltage of the signal line DTL from the voltage $V_{ofs}$ to the voltage $V_{sig}$, the writing line drive circuit 124 reduces the voltage of the writing line WSL from the voltage $V_{on}$ to the voltage $V_{off}$ ($T_3$). As a result, the gate of the driving transistor $Tr_{100}$ is turned to a floating state, and the $V_{th}$ correction stops.

First $V_{th}$ Correction Stop Period

During a period where the $V_{th}$ correction stops, sampling of the voltage of the signal line DTL is performed in a row (a pixel) different from a row (a pixel) on which the $V_{th}$ correction has already been performed. In addition, at this time, the source voltage $V_s$ is lower than a voltage $V_{ofs}-V_{th}$ in the row (the pixel) on which the $V_{th}$ correction has already been performed; therefore, during a $V_{th}$ correction stop period, the current $I_{ds}$ flows between the drain and the source of the driving transistor $Tr_{100}$ in the row (the pixel) on which the $V_{th}$ correction has already been performed, and the source voltage $V_s$ is increased, and the gate voltage $V_g$ is also increased by coupling through the retention capacitor $C_s$.

Second $V_{th}$ Correction Period

Next, the $V_{th}$ correction is performed again. More specifically, when the voltage of the signal line DTL is at the voltage $V_{ofs}$, thereby allowing the $V_{th}$ correction, the writing line drive circuit 124 increases the voltage of the writing line WSL from the voltage $V_{off}$ to the voltage $V_{on}$, and the gate of the driving transistor $Tr_{100}$ is changed to the voltage $V_{ofs}$ ($T_4$). At this time, in the case where the source voltage $V_s$ is lower than a voltage $V_{ofs}-V_{th}$ (in the case where the $V_{th}$ correction is not yet completed), the current $I_{ds}$ flows between the drain and the source of the driving transistor $Tr_{100}$ until cutting the driving transistor $Tr_{100}$ off (until the gate-source voltage $V_{gs}$ is changed to the voltage $V_{th}$). After that, before the signal line drive circuit 123 switches the voltage of the signal line DTL from the voltage $V_{ofs}$ to the voltage $V_{sig}$, the writing line drive circuit 24 reduces the voltage of the writing line WSL from the voltage $V_{on}$ to the voltage $V_{off}$ ($T_5$). Therefore, the gate of the driving transistor $Tr_{100}$ turns into a floating state, so the gate-source voltage $V_{gs}$ is allowed to be maintained constant irrespective of the magnitude of the voltage of the signal line DTL.

Note that in the $V_{th}$ correction period, in the case where the retention capacitor $C_s$ is charged to the voltage $V_{th}$ and the gate-source voltage $V_{gs}$ is changed to the voltage $V_{th}$, the drive circuit 120 completes the $V_{th}$ correction. However, in the case where the gate-source voltage $V_{gs}$ does not reach the voltage $V_{th}$, the drive circuit 120 repeatedly executes and stops the $V_{th}$ correction until the gate-source voltage $V_{gs}$ reaches the voltage $V_{th}$.

Writing·μ Correction Period

After the $V_{th}$ correction stop period is completed, writing and μ correction are performed. More specifically, while the voltage of the signal line DTL is at the voltage $V_{sig}$, the writing line drive circuit 124 increases the voltage of the writing line WSL from the voltage $V_{off}$ to the voltage $V_{on}$ ($T_6$), and the gate of the driving transistor $Tr_{100}$ is connected to the signal line DTL. Therefore, the gate voltage $V_g$ of the driving transistor $Tr_{100}$ is changed to the voltage $V_{sig}$ of the signal line DTL. At this time, an anode voltage of the organic EL element 111 at this stage is still smaller than the threshold voltage $V_{el}$ of the organic EL element 111, so the organic EL element 111 is cut off. Therefore, the current $I_{ds}$ flows into an element capacitance (not illustrated) of the organic EL element 111, and the element capacitance is charged, so the source voltage $V_s$ is increased only by $\Delta V_y$, and then the gate-source voltage $V_{gs}$ reaches a voltage $V_{sig}+V_{th}-\Delta V_y$. Thus, μ correction is performed simultaneously with writing. In this case, the larger mobility μ of the driving transistor $Tr_{100}$ is, the more the voltage $\Delta V_y$ is increased, so when the gate-source voltage $V_{gs}$ is reduced only by $\Delta V_y$ before light emission, variations in mobility μ from one pixel circuit 113 to another are preventable.

Light Emission Period

Finally, the writing line drive circuit 124 reduces the voltage of the writing line WSL from the voltage $V_{on}$ to the voltage $V_{off}$ (T7). Then, the gate of the driving transistor $Tr_{100}$ is turned into a floating state, and the current $I_{ds}$ flows between the drain and the source of the driving transistor $Tr_{100}$ to increase the source voltage $V_s$. As a result, a voltage equal to or higher than the threshold voltage $V_{el}$ is applied to the organic EL element 111, and the organic EL element 111 emits light with desired luminance.

In the display 100 in the application example, as described above, in each pixel 113, on/off control of the pixel circuit 112 is performed, and a drive current is thereby injected into the organic EL element 111 of each pixel 113 to cause emission of light by the recombination of holes and electrons, and then the light is extracted to outside. As a result, an image is displayed on the display region 110A of the display panel 110.

In the application example, for example, the buffer circuits 5 in the writing line drive circuit 124 each are configured of a plurality of the above-described inverter circuits 1, 2 or 4. Therefore, a through current hardly flows through the buffer circuits 5; therefore, the power consumption of the buffer circuits 5 is allowed to be reduced. Moreover, variations in the output voltages of the buffer circuits 5 is small; therefore, variations in threshold correction or mobility correction of the driving transistor $Tr_{100}$ from one pixel circuit 112 to another are allowed to be reduced, and variations in luminance from one pixel 113 to another are allowed to be reduced.

Although the present disclosure is described referring to the embodiments, the modifications and the application example, the disclosure is not limited thereto, and may be variously modified.

For example, in the above-described embodiments and the modifications thereof, only one common voltage line on a high voltage side and only one common voltage line on a low voltage side are arranged; however, for example, a voltage line connected to one or more of transistors on the high voltage side and a voltage line connected to other transistors on the high voltage side may be separately arranged. Likewise, a voltage line connected to one or more of a plurality of transistors on the low voltage side and a voltage line connected to the other transistors on the low voltage side may be arranged separately.

Moreover, for example, in the above-described application example, any of the inverter circuits 1, 2 and 4 according to the above-described embodiments is used in an output stage of the writing line drive circuit 124; however, instead of the output stage of the writing line drive circuit 124, the inverter circuit 1, 2 or 4 may be used in an output stage of the power supply line drive circuit 125, or may be used in both of the output stage of the writing line drive circuit 124 and the output stage of the power supply line drive circuit 125.

The present application contains subject matter related to that disclosed in Japanese Priority Patent Application JP 2010-079295 filed in the Japan Patent Office on Mar. 30, 2010, Japanese Priority Patent Application JP 2010-083268 filed in the Japan Patent Office on Mar. 31, 2010, and Japanese Priority Patent Application JP 2010-079461 filed in the Japan Patent Office on Mar. 30, 2010, the entire content of which is hereby incorporated by references.

It should be understood by those skilled in the art that various modifications, combinations, sub-combinations and alterations may occur depending on design requirements and other factors insofar as they are within the scope of the appended claims or the equivalents thereof.

What is claimed is:

1. An inverter circuit comprising:
    an electrical connection point directly electrically connected to a terminal of a first capacity element and to a terminal of a second capacity element, another terminal of the second capacity element being directly electrically connected to a gate of a first transistor;
    a first voltage line directly electrically connected to a drain/source of the first transistor and to a drain/source of a third transistor, a source/drain of the third transistor being directly electrically connected to another terminal of the first capacity element.

2. The inverter circuit according to claim 1, wherein said first and third transistors are of the same conduction type.

3. The inverter circuit according to claim 1, further comprising:
    an input terminal directly electrically connected to a gate of the third transistor and to a terminal of a third capacity element, another terminal of the third capacity element being directly electrically connected to the first voltage line.

4. The inverter circuit according to claim 1, further comprising:
    an input terminal directly electrically connected to a drain/source of a fourth transistor, a source/drain of the fourth transistor being directly electrically connected to a gate of the third transistor.

5. The inverter circuit according to claim 4, wherein a gate of the fourth transistor is directly electrically connected to a third voltage line.

6. The inverter circuit according to claim 4, further comprising:
    a terminal of a third capacity element directly electrically connected to said source/drain of the fourth transistor, said first voltage line being directly electrically connected to another terminal of the third capacity element.

7. The inverter circuit according to claim 1, further comprising:
    a gate of the third transistor directly electrically connected to a source/drain of a fourth transistor and to a source/drain of a fifth transistor, said source/drain of the fifth transistor being directly electrically connected to a gate of a fifth transistor.

8. The inverter circuit according to claim 7, wherein an input terminal is directly electrically connected to a drain/source of the fourth transistor and to a drain/source of the fifth transistor, said drain/source of the fourth transistor being directly electrically connected to a gate of a fourth transistor.

9. The inverter circuit according to claim 1, wherein an input terminal is directly electrically connected to said gate of the first transistor.

10. The inverter circuit according to claim 9, wherein a gate of the third transistor is directly electrically connected to said input terminal.

11. The inverter circuit according to claim 9, wherein a gate of the third transistor is directly electrically connected to another input terminal.

12. The inverter circuit according to claim 9, further comprising:
a source/drain of a sixth transistor directly electrically connected to said source/drain of the third transistor, said input terminal being directly electrically connected to a gate of the sixth transistor,
wherein a drain/source of the sixth transistor is directly electrically connected to said first voltage line.

13. The inverter circuit according to claim 9, wherein said input terminal is directly electrically connected to an input of a delay element, an output of the delay element being directly electrically connected to a gate of the third transistor.

14. The inverter circuit according to claim 13, further comprising:
a source/drain of a sixth transistor directly electrically connected to said source/drain of the third transistor, said input terminal being directly electrically connected to a gate of the sixth transistor,
wherein a drain/source of the sixth transistor is directly electrically connected to said first voltage line.

15. The inverter circuit according to claim 1, wherein said electrical connection point is directly electrically connected to a source/drain of the first transistor and to a drain/source of a second transistor, a gate of the second transistor being directly electrically connected to said source/drain of the third transistor.

16. The inverter circuit according to claim 15, wherein a source/drain of the second transistor is directly electrically connected to a second voltage line.

17. The inverter circuit according to claim 16, wherein a voltage of the second voltage line is higher than a voltage of the first voltage line.

18. The inverter circuit according to claim 1, wherein said source/drain of the first transistor is directly electrically connected to a drain/source of a second transistor, said electrical connection point being directly electrically connected to a source/drain of a fourth transistor and to a drain/source of a fifth transistor.

19. The inverter circuit according to claim 18, wherein a source/drain of the second transistor is directly electrically connected to a third voltage line.

20. The inverter circuit according to claim 18, wherein a gate of the second transistor is directly electrically connected to said electrical connection point.

21. The inverter circuit according to claim 18, wherein a drain/source of the fourth transistor is directly electrically connected to said first voltage line, a gate of the fourth transistor being directly electrically connected to said gate of the first transistor.

22. The inverter circuit according to claim 18, wherein a source/drain of the fifth transistor is directly electrically connected to a second voltage line, a gate of the fifth transistor being directly electrically connected to said source/drain of the third transistor.

23. The inverter circuit according to claim 22, wherein a gate of the second transistor is directly electrically connected to a source/drain of a sixth transistor and to a drain/source of a seventh transistor.

24. The inverter circuit according to claim 23, wherein a source/drain of the seventh transistor is directly electrically connected to said electrical connection point, a gate of the seventh transistor being directly electrically connected to said source/drain of the third transistor.

25. The inverter circuit according to claim 23, wherein a drain/source of the sixth transistor is directly electrically connected to said first voltage line, a gate of the sixth transistor being directly electrically connected to said gate of the first transistor.

26. The inverter circuit according to claim 23, wherein said second voltage is line directly electrically connected to a source/drain of the second transistor and to a source/drain of the seventh transistor, a gate of the seventh transistor being directly electrically connected to said electrical connection point.

* * * * *